(12) United States Patent
Kori et al.

(10) Patent No.: US 12,443,104 B2
(45) Date of Patent: Oct. 14, 2025

(54) COMPOSITION FOR FORMING ORGANIC FILM, PATTERNING PROCESS, AND COMPOUND AND POLYMER FOR FORMING ORGANIC FILM

(71) Applicant: SHIN-ETSU CHEMICAL CO., LTD., Tokyo (JP)

(72) Inventors: Daisuke Kori, Joetsu (JP); Yasuyuki Yamamoto, Joetsu (JP); Naoki Kobayashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 582 days.

(21) Appl. No.: 17/945,570

(22) Filed: Sep. 15, 2022

(65) Prior Publication Data
US 2023/0244147 A1    Aug. 3, 2023

(30) Foreign Application Priority Data
Sep. 28, 2021 (JP) ................................ 2021-158467

(51) Int. Cl.
*G03F 7/09* (2006.01)
*C07D 209/34* (2006.01)
(Continued)

(52) U.S. Cl.
CPC .......... *G03F 7/094* (2013.01); *C07D 209/34* (2013.01); *C07D 487/10* (2013.01);
(Continued)

(58) Field of Classification Search
CPC ... C07D 209/34; C07D 487/10; C08G 61/124
See application file for complete search history.

(56) References Cited

U.S. PATENT DOCUMENTS

2002/0106909 A1    8/2002   Kato et al.
2005/0255712 A1    11/2005  Kato et al.
(Continued)

FOREIGN PATENT DOCUMENTS

EP    3 869 268 A1    8/2021
JP    2002-334869 A   11/2002
(Continued)

OTHER PUBLICATIONS

Afsah et al, Synthesis of Some New Mixed Azines, Schiff and Mannich Bases of Pharmaceutical interest related to Isatin, Z. Naturforsch, 70(6)b, 393-402 (2015) (Year: 2015).*
(Continued)

*Primary Examiner* — Amanda C. Walke
(74) *Attorney, Agent, or Firm* — Oliff PLC

(57) ABSTRACT

The present invention is a composition for forming an organic film, containing: a material for forming an organic film shown by the following general formula; and an organic solvent, where $R_1$ represents a hydrogen atom, an allyl group, or a propargyl group, $R_2$ represents a nitro group, a halogen atom, a hydroxy group, an alkyloxy group having 1 to 4 carbon atoms, an alkynyloxy group having 2 to 4 carbon atoms, an alkenyloxy group having 2 to 4 carbon atoms, a linear, branched, or cyclic alkyl group having 1 to 6 carbon atoms, a trifluoromethyl group, or a trifluoromethyloxy group, m=0 or 1, n=1 or 2, l=0 or 1, k represents an integer of 0 to 2, W represents a divalent organic group having 1 to 40 carbon atoms, and each V independently represents a hydrogen atom or a linking moiety. This provides a composition for forming an organic film which allows the formation of an organic film having not only excellent heat resistance and properties of filling and planarizing a pattern formed on a substrate, but also favorable film-formability and adhesiveness to a substrate.

(Continued)

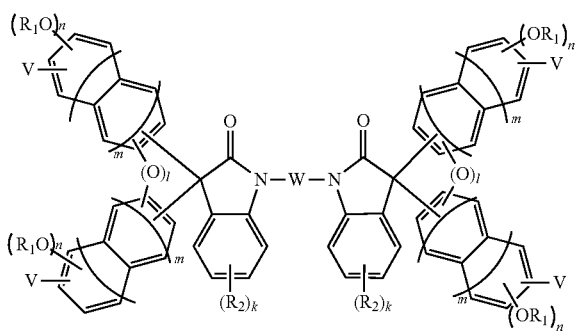

25 Claims, 4 Drawing Sheets

(51) Int. Cl.
C07D 487/10 (2006.01)
C08G 61/12 (2006.01)
H05K 3/06 (2006.01)

(52) U.S. Cl.
CPC ........... *C08G 61/124* (2013.01); *H05K 3/064* (2013.01); *C08G 2261/11* (2013.01); *C08G 2261/1414* (2013.01); *C08G 2261/1422* (2013.01); *C08G 2261/1424* (2013.01); *C08G 2261/148* (2013.01); *C08G 2261/18* (2013.01); *C08G 2261/228* (2013.01); *C08G 2261/314* (2013.01); *C08G 2261/3241* (2013.01)

(56) References Cited

U.S. PATENT DOCUMENTS

| | | |
|---|---|---|
| 2006/0019195 A1 | 1/2006 | Hatakeyama et al. |
| 2006/0204891 A1 | 9/2006 | Hatakeyama |
| 2009/0274978 A1 | 11/2009 | Ohashi et al. |
| 2010/0099044 A1 | 4/2010 | Hatakeyama et al. |
| 2013/0302990 A1 | 11/2013 | Watanabe et al. |
| 2021/0116814 A1 | 4/2021 | Tokunaga et al. |

FOREIGN PATENT DOCUMENTS

| | | |
|---|---|---|
| JP | 2004-205685 A | 7/2004 |
| JP | 2005-128509 A | 5/2005 |
| JP | 2005-250434 A | 9/2005 |
| JP | 2006-227391 A | 8/2006 |
| JP | 2006-285095 A | 10/2006 |
| JP | 2006-293298 A | 10/2006 |
| JP | 2007-199653 A | 8/2007 |
| JP | 2008-158002 A | 7/2008 |
| JP | 2009-269953 A | 11/2009 |
| JP | 2010-122656 A | 6/2010 |
| JP | 2013-253227 A | 12/2013 |
| WO | 2004/066377 A1 | 8/2004 |
| WO | 2019/225615 A1 | 11/2019 |

OTHER PUBLICATIONS

Petyunin, P.A., "Investigations in the Field of Heterocyclic Chemistry XLVII, Synthesis and Properties of 1-Dialkylaminoalkyl-3,3-Diaryloxindoles," Khimiko-Farmatsevticheskii, Dec. 31, 1968, pp. 251-256, XP093021938.

Feb. 27, 2023 extended Search Report issued in European Patent Application No. 22197086.6.

\* cited by examiner

[FIG. 1]
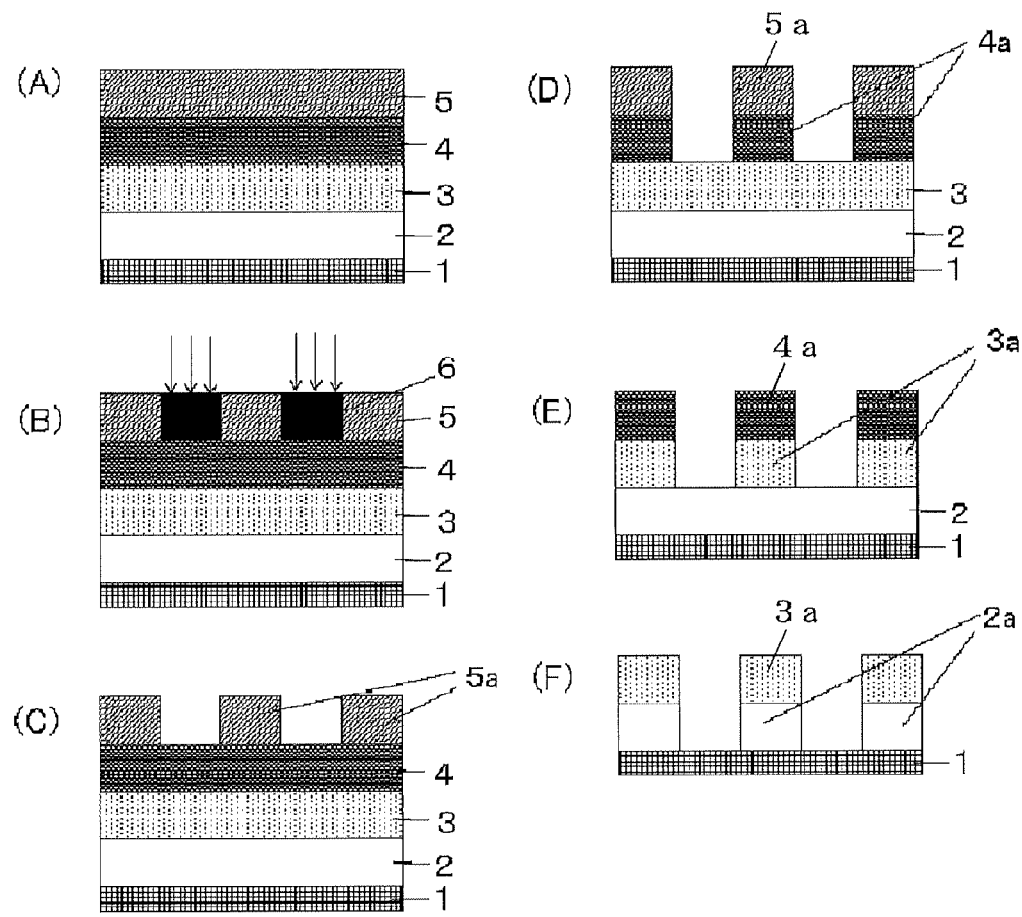

[FIG. 2]
(G)
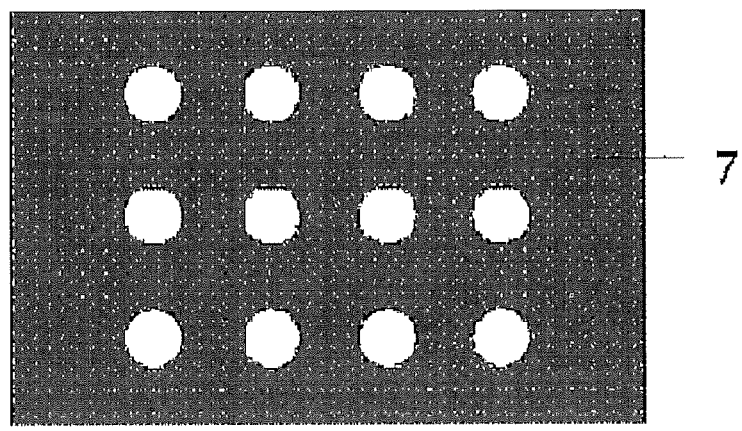
(H)
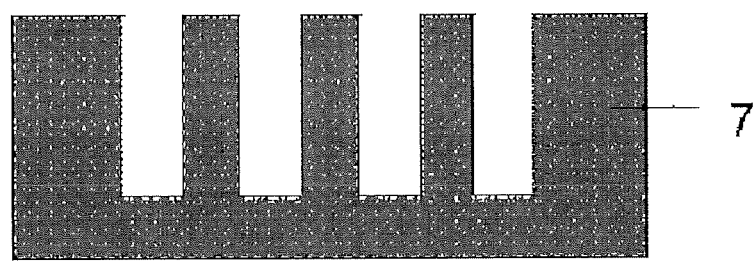
(I)
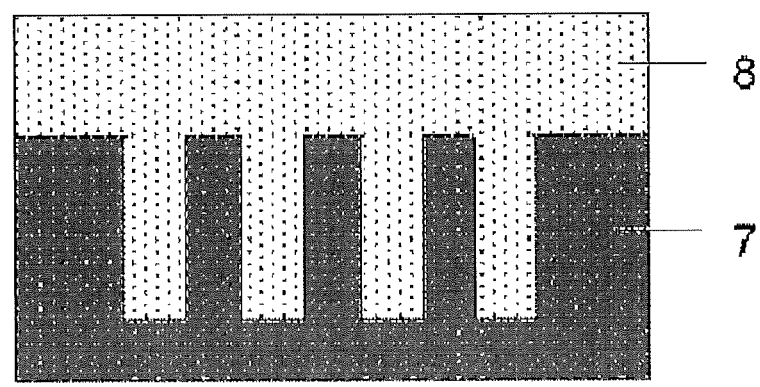

[FIG. 3]
(J)
(K)
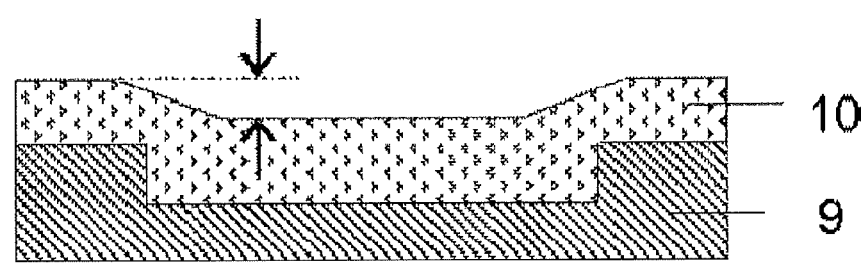

[FIG. 4]
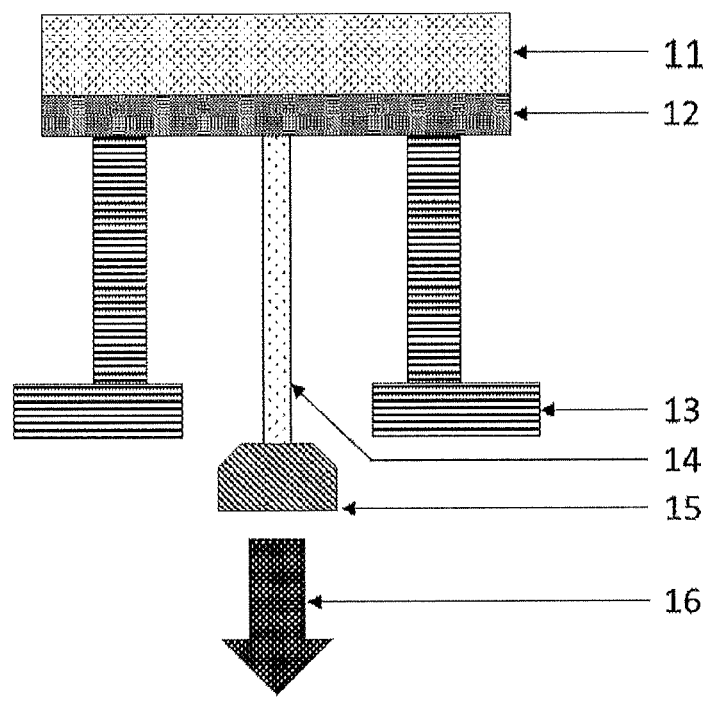

COMPOSITION FOR FORMING ORGANIC FILM, PATTERNING PROCESS, AND COMPOUND AND POLYMER FOR FORMING ORGANIC FILM

TECHNICAL FIELD

The present invention relates to: a composition for forming an organic film used in fine patterning by a multilayer resist method in a semiconductor device manufacturing process; a patterning process using the composition; and a compound and polymer contained in a composition for forming an organic film.

BACKGROUND ART

As LSI advances toward high integration and high processing speed, miniaturization of pattern size is progressing rapidly. Along with the miniaturization, lithography technology has achieved a fine patterning by shortening the wavelength of a light source and selecting an appropriate resist composition accordingly. The composition mainly used is a positive photoresist composition for monolayer. The monolayer positive photoresist composition not only allows a resist resin to have a skeleton having etching resistance against dry etching with chlorine- or fluorine-based gas plasma, but also provides a switching mechanism that makes an exposed part soluble, thereby dissolving the exposed part to form a pattern and processing a substrate to be processed by dry etching while using the remaining resist pattern as an etching mask.

However, there arises a problem that when the pattern becomes finer, that is, the pattern width is reduced without changing the thickness of the photoresist film to be used, resolution performance of the photoresist film is lowered. In addition, pattern development of the photoresist film with a developer excessively increases a so-called aspect ratio of the pattern, resulting in pattern collapse. Therefore, the photoresist film has been thinned along with the miniaturization of the pattern.

On the other hand, a substrate to be processed has been generally processed by dry etching while using a pattern-formed photoresist film as an etching mask. In practice, however, there is no dry etching method capable of providing an absolute etching selectivity between the photoresist film and the substrate to be processed. There has been a problem that the resist film is thus damaged and collapses during processing of the substrate, and the resist pattern cannot be precisely transferred to the substrate to be processed. Accordingly, higher dry etching resistance has been required in a resist composition along with the miniaturization of the pattern. However, on the other hand, resins used for photoresist compositions have been required to have low absorbance at the wavelength to be used for the exposure in order to achieve a higher resolution. Accordingly, as the exposure light shifts from i-beam to KrF and to ArF to have a shorter wavelength, the resin also shifts to novolak resins, polyhydroxystyrene, and resins having an aliphatic polycyclic skeleton. This shift actually accelerates an etching rate under the dry etching conditions during substrate processing, and recent photoresist compositions having high resolution tend to have low etching resistance.

As a result, a substrate to be processed has to be dry-etched with a thinner photoresist film having lower etching resistance. It is important to provide a material for this process and the process itself.

A multilayer resist method is one solution for these problems. This method is as follows: a middle layer film having a different etching selectivity from a photoresist film (i.e., a resist upper layer film) is placed between the resist upper layer film and a substrate to be processed; a pattern is formed in the resist upper layer film; then, the pattern is transferred to the middle layer film by dry etching while using the resist upper layer film pattern as a dry etching mask; and the pattern is further transferred to the substrate to be processed by dry etching while using the middle layer film as a dry etching mask.

One of the multilayer resist methods is a 3-layer resist method, which can be performed with a typical resist composition used in the monolayer resist method. For example, this 3-layer resist method includes the following steps: an organic film containing a novolak resin or the like is formed as a resist underlayer film on a substrate to be processed; a silicon-containing film is formed thereon as a resist middle layer film; and a usual organic photoresist film is formed thereon as a resist upper layer film. Since the organic resist upper layer film exhibits a favorable etching selectivity ratio relative to the silicon-containing resist middle layer film when dry etching is performed with fluorine-based gas plasma, the resist upper layer film pattern can be transferred to the silicon-containing resist middle layer film by dry etching with fluorine-based gas plasma. According to this process, even when using a resist composition which is difficult to form a pattern in so that the pattern has a sufficient film thickness for directly processing the substrate to be processed or a resist composition which does not have sufficient dry etching resistance for processing the substrate, a pattern can be transferred to a silicon-containing film (resist middle layer film). In addition, by subsequently transferring the pattern by dry etching using an oxygen- or hydrogen-based gas plasma, it is possible to obtain a pattern of an organic film (resist underlayer film) containing a novolak resin or the like having a sufficient dry etching resistance for processing the substrate. As such a resist underlayer film, many are already known, such as those disclosed in Patent Document 1, for example.

Meanwhile, in recent years, consideration of the production of semiconductor devices having a new structure such as a multigate structure has become active. In response, demands are rising for a resist underlayer film having better planarizing property and filling property more than ever before. For example, when an underlying substrate to be processed has a fine pattern structure such as a hole, a trench, or a fin, it is necessary to have filling (gap-filling) property for filling in the pattern with a film without any voids by using a resist underlayer film. In addition, when the underlying substrate to be processed has a step(s), or when a pattern-dense region and a pattern-free region exist on the same wafer, it is necessary to planarize the film surface with the resist underlayer film. By planarizing the surface of the underlayer film, fluctuation in the film thickness of a resist middle layer film or a resist upper layer film formed thereon is controlled, whereby a focus margin in lithography or a margin in the subsequent processing step of the substrate to be processed can be suppressed from decreasing.

Moreover, the organic film material excellent in filling and planarizing properties is not limited to the underlayer film for a multilayer resist, and is also widely usable as a planarizing material for manufacturing a semiconductor device, e.g., for planarizing a substrate prior to patterning by nanoimprinting. Furthermore, for global planarizing in the semiconductor device manufacturing process, a CMP process is now generally used. However, the CMP process is costly, so that this material is also expected to be used for the global planarizing method, instead of CMP.

For forming a flat film for planarizing an uneven semiconductor substrate, a resist underlayer film material containing a polymer obtained by a reaction between an aromatic compound and a compound having a carbon-oxygen double bond such as a carbonyl group is proposed (Patent Document 2). However, planarizing performance etc. of the material in wide trench portions in the substrate are insufficient to meet the demands in cutting-edge devices, and a resist underlayer film material excellent in flatness on a wider range of substrate structures has come to be required.

In addition, the structures of substrates to be processed are becoming complex as described above. Furthermore, for the surface of a substrate to be processed, the following materials are also being examined: novel materials having high electron mobility using strained silicon, gallium arsenic, and so forth; ultrathin polysilicon controlled in angstrom units; and the like. Thus, films are expected to be formed on surfaces of substrates to be processed having various shapes and qualities. Therefore, in order to ensure a process margin, not only excellent filling and planarizing properties, but also being able to form a film without dependence on the shape and quality of the substrate to be processed is an important feature.

CITATION LIST

Patent Literature

Patent Document 1: JP 2004-205685 A
Patent Document 2: WO 2019/225615 A1

SUMMARY OF INVENTION

Technical Problem

The present invention has been made in view of the above circumstances. An object of the present invention is to provide: a compound and a polymer which allow the formation of an organic film having not only excellent heat resistance and properties of filling and planarizing a pattern formed on a substrate, but also favorable film-formability and adhesiveness to a substrate; and a composition for forming an organic film containing the compound and/or polymer. Another object of the present invention is to provide a patterning process using the composition.

Solution to Problem

To achieve the object, the present invention provides a composition for forming an organic film, comprising: a material for forming an organic film shown by the following general formula; and an organic solvent,

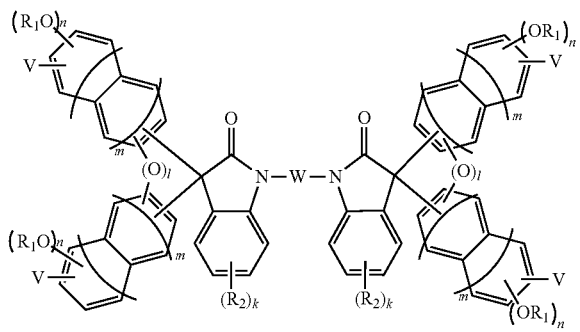

wherein $R_1$ represents a hydrogen atom, an allyl group, or a propargyl group, $R_2$ represents a nitro group, a halogen atom, a hydroxy group, an alkyloxy group having 1 to 4 carbon atoms, an alkynyloxy group having 2 to 4 carbon atoms, an alkenyloxy group having 2 to 4 carbon atoms, a linear, branched, or cyclic alkyl group having 1 to 6 carbon atoms, a trifluoromethyl group, or a trifluoromethyloxy group, "m" represents 0 or 1, "n" represents an integer of 1 or 2, "l" represents 0 or 1, aromatic rings forming a cyclic ether structure with one another when l=1, "k" represents an integer of 0 to 2, W represents a divalent organic group having 1 to 40 carbon atoms, and each V independently represents a hydrogen atom or a linking moiety.

Such a composition for forming an organic film is capable of forming an organic film that is not only excellent in heat resistance and filling and planarizing properties of a pattern formed in a substrate, but also has favorable film-formability and adhesiveness to a substrate.

In this case, the material for forming an organic film can be a compound shown by the following general formula (1),

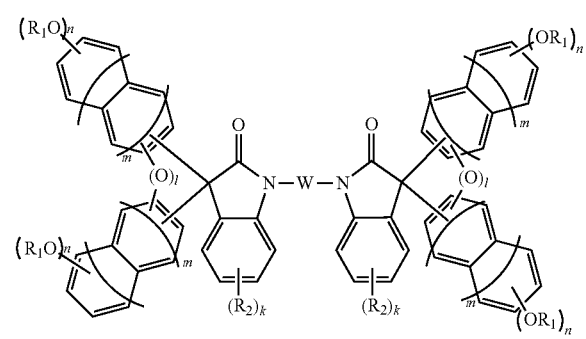

(1)

wherein $R_1$, $R_2$, "m", "n", "l", "k", and W are as defined above.

The inventive compound shown by the general formula (1) is excellent in heat resistance and solubility, and therefore, can form an organic film material as a sole compound. In addition, since the compound has better thermal flowability than polymers, when the organic film is used as a resist underlayer film, the organic film is also excellent in filling and planarizing properties to a patterned substrate. In addition, since the compound has a cyclic amide structure in the molecule, adhesiveness and film-formability to a substrate and so forth can also be improved without losing heat resistance. Furthermore, various physical properties such as optical characteristics and etching resistance when using the organic film as a resist underlayer film can also be adjusted in accordance with the required performance by appropriately selecting the linker moiety shown by W.

Furthermore, the compound shown by the general formula (1) is preferably a compound shown by the following general formula (2),

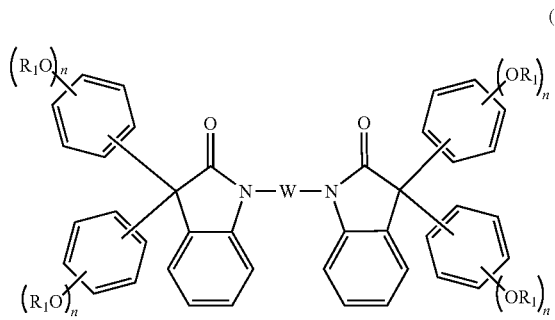

(2)

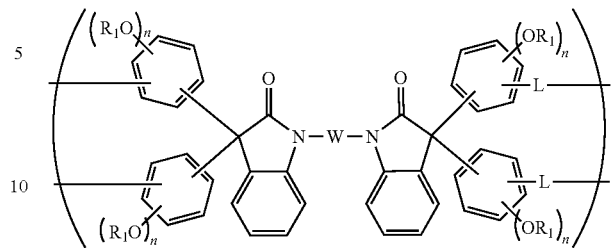

(4)

wherein $R_1$, W, and "n" are as defined above.

Thermal flowability can be enhanced, and filling and planarizing performances can be further enhanced by introducing such a structure.

In addition, the compound preferably satisfies $1.00 \leq Mw/Mn \leq 1.10$, where Mw is a weight-average molecular weight and Mn is a number-average molecular weight measured by gel permeation chromatography in terms of polystyrene.

By controlling the Mw/Mn of the compound used in the composition for forming an organic film within such a range, an organic film excellent in filling property and flatness can be formed.

Furthermore, in the present invention, the material for forming an organic film can be a polymer having a repeating unit shown by the following general formula (3), wherein $R_1$, W, L, and "n" are as defined above.

By using a polymer having such a repeating unit, handling performance such as solubility to an organic solvent can also be improved.

Furthermore, the L is preferably a divalent organic group shown by the following general formula (5),

(5)

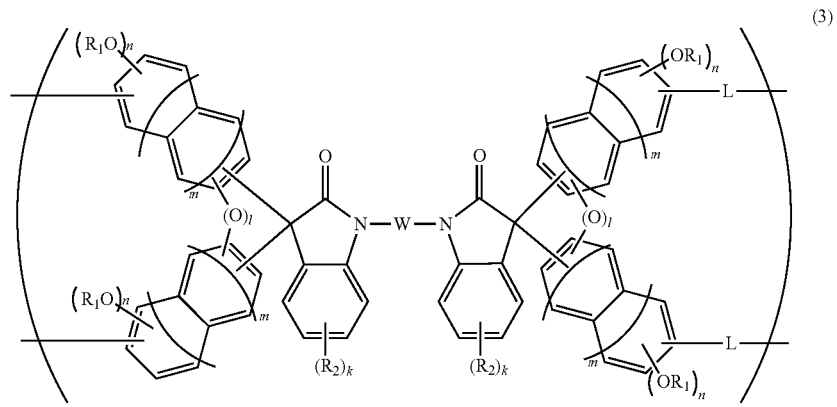

(3)

wherein $R_1$, $R_2$, W, "n", "m", "l", and "k" are as defined above, and L represents a divalent organic group having 1 to 40 carbon atoms.

When a polymer having such a repeating unit is used, it is possible to achieve a composition for forming an organic film that has no degradation of etching resistance, can form a dense organic film by increasing curability, and furthermore, is excellent in film formability with no dependence on the quality or shape of the substrate.

In this case, the polymer preferably has a repeating unit shown by the following general formula (4), wherein $R_3$ represents a hydrogen atom or an organic group containing an aromatic ring having 1 to 20 carbon atoms, and a broken line represents an attachment point.

Properties such as curability and etching resistance can be improved by including such a linking group in the repeating unit.

Furthermore, the polymer preferably has a weight-average molecular weight of 1000 to 5000.

When the composition for forming an organic film contains a polymer having a weight-average molecular weight within such a range, outgas during baking can be suppressed without losing solubility to an organic solvent.

Furthermore, in the present invention, the material for forming an organic film can contain one or more compounds selected from a compound shown by the following general formula (1) and one or more polymers selected from a polymer having a repeating unit shown by the following general formula (3),

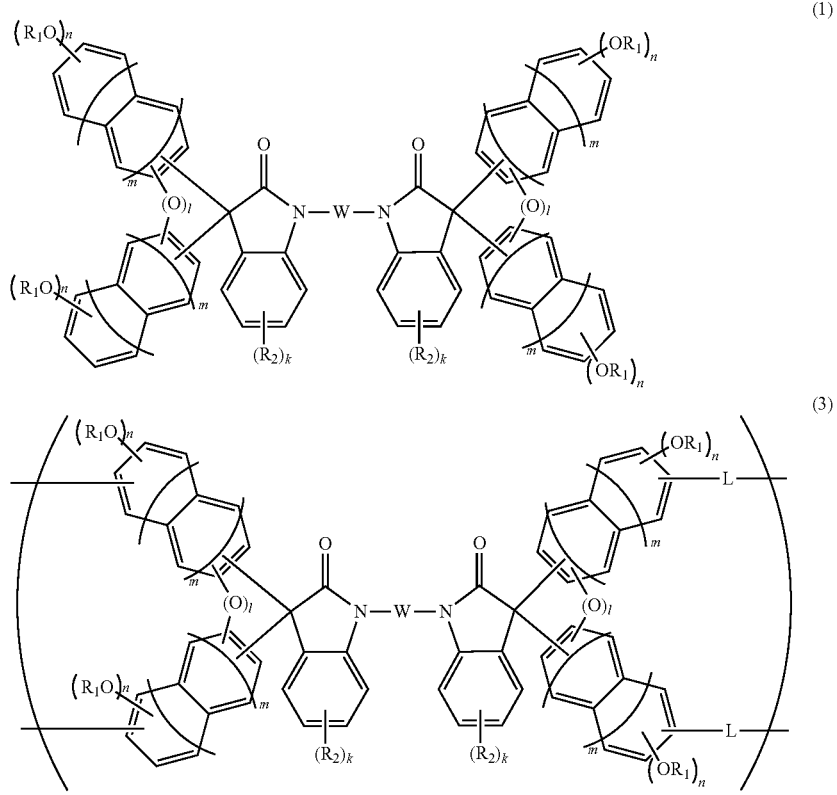

wherein $R_1$, $R_2$, W, "n", "m", "l", and "k" are as defined above, and L represents a divalent organic group having 1 to 40 carbon atoms.

Using such a mixture, it is possible to adjust, within an appropriate range, various physical properties required when using an organic film, for example, filling and planarizing properties and outgas caused by sublimation products.

In addition, the organic solvent is preferably a mixture of one or more kinds of organic solvent having a boiling point of lower than 180° C. and one or more kinds of organic solvent having a boiling point of 180° C. or higher.

When the organic solvent is the above mixture, the organic film is provided with thermal flowability by adding the high-boiling-point solvent to the compound and/or polymer, so that the composition for forming an organic film provided with both high filling and planarizing properties.

The composition for forming an organic film preferably further comprises at least one of a surfactant and a plasticizer.

The composition for forming an organic film containing such additives has more excellent coating property and filling and planarizing properties.

In addition, the present invention provides a patterning process comprising:
  forming an organic film by using the above-described composition for forming an organic film on a body to be processed;
  forming a silicon-containing resist middle layer film by using a silicon-containing resist middle layer film material on the organic film;
  forming a resist upper layer film by using a photoresist composition on the silicon-containing resist middle layer film;
  forming a circuit pattern in the resist upper layer film;
  transferring the pattern to the silicon-containing resist middle layer film by etching while using the resist upper layer film having the formed pattern as a mask;
  transferring the pattern to the organic film by etching while using the silicon-containing resist middle layer film having the transferred pattern as a mask; and
  further forming the pattern in the body to be processed by etching while using the organic film having the transferred pattern as a mask.

A fine pattern can be formed in the body to be processed with high precision by the patterning process according to the 3-layer resist process.

In addition, the present invention provides a patterning process comprising:
  forming an organic film by using the above-described composition for forming an organic film on a body to be processed;
  forming a silicon-containing resist middle layer film by using a silicon-containing resist middle layer film material on the organic film;
  forming an organic antireflective coating on the silicon-containing resist middle layer film;
  forming a resist upper layer film by using a photoresist composition on the organic antireflective coating, so that a 4-layered film structure is constructed;
  forming a circuit pattern in the resist upper layer film;
  transferring the pattern to the organic antireflective coating and the silicon-containing resist middle layer film by etching while using the resist upper layer film having the formed pattern as a mask;

transferring the pattern to the organic film by etching while using the silicon-containing resist middle layer film having the transferred pattern as a mask; and further forming the pattern in the body to be processed by etching the body to be processed while using the organic film having the transferred pattern as a mask.

A fine pattern can be formed in the body to be processed with even higher precision by the patterning process according to the 4-layer resist process.

In addition, the present invention provides a patterning process comprising:

forming an organic film by using the above-described composition for forming an organic film on a body to be processed;

forming an inorganic hard mask selected from a silicon oxide film, a silicon nitride film, and a silicon oxynitride film on the organic film;

forming a resist upper layer film by using a photoresist composition on the inorganic hard mask;

forming a circuit pattern in the resist upper layer film;

etching the inorganic hard mask while using the resist upper layer film having the formed pattern as a mask;

etching the organic film while using the inorganic hard mask having the formed pattern as a mask; and further forming the pattern in the body to be processed by etching the body to be processed while using the organic film having the formed pattern as a mask.

A fine pattern can be formed on the body to be processed with high precision by the patterning process according to the 3-layer resist process.

In addition, the present invention provides a patterning process comprising:

forming an organic film by using the above-described composition for forming an organic film on a body to be processed;

forming an inorganic hard mask selected from a silicon oxide film, a silicon nitride film, and a silicon oxynitride film on the organic film;

forming an organic antireflective coating on the inorganic hard mask;

forming a resist upper layer film by using a photoresist composition on the organic antireflective coating, so that a 4-layered film structure is constructed;

forming a circuit pattern in the resist upper layer film;

etching the organic antireflective coating and the inorganic hard mask while using the resist upper layer film having the formed pattern as a mask;

etching the organic film while using the inorganic hard mask having the formed pattern as a mask; and further forming the pattern in the body to be processed by etching the body to be processed while using the organic film having the formed pattern as a mask.

A fine pattern can be formed on the body to be processed with higher precision by the patterning process according to this 4-layer resist process.

In this case, the inorganic hard mask is preferably formed by a CVD method or an ALD method.

When the inorganic hard mask is formed by a CVD method or an ALD method, a fine pattern can be formed in the body to be processed with higher precision.

Furthermore, the pattern in the resist upper layer film is preferably formed by a lithography using light with a wavelength of 10 nm or more to 300 nm or less, a direct drawing with electron beam, nanoimprinting, or a combination thereof.

When the circuit pattern is formed in the resist upper layer film by such methods, a fine pattern can be formed in the body to be processed with higher precision.

Exposure and development are preferably performed to form the circuit pattern in the resist upper layer film in the patterning process, and the development is preferably alkali development or development with an organic solvent.

When alkali development or development with an organic solvent is employed as the development method, a fine pattern can be formed in the body to be processed with higher precision.

Furthermore, as the body to be processed, a semiconductor device substrate, a metal film, a metal carbide film, a metal oxide film, a metal nitride film, a metal oxycarbide film, or a metal oxynitride film is preferably used.

In the present invention, those given above can be used, for example, as the body to be processed.

In this case, the metal is preferably silicon, titanium, tungsten, hafnium, zirconium, chromium, germanium, cobalt, copper, silver, gold, aluminum, indium, gallium, arsenic, palladium, iron, tantalum, iridium, manganese, molybdenum, ruthenium, or an alloy thereof.

These metals can be used as the metal. When a pattern is formed using the material for forming an organic film of the present invention as described, the pattern of the upper layer photoresist can be transferred to and formed in the body to be processed with higher precision.

The present invention also provides a compound shown by the following general formula (1),

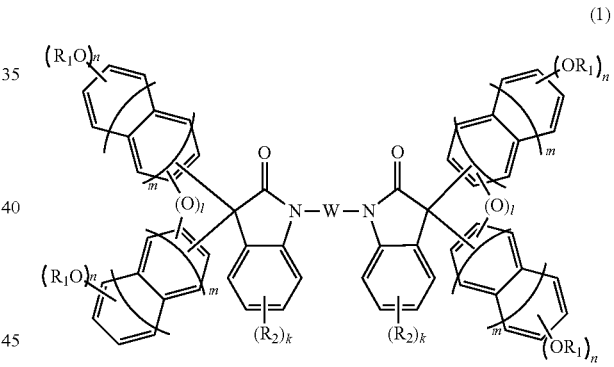

wherein $R_1$ represents a hydrogen atom, an allyl group, or a propargyl group, $R_2$ represents a nitro group, a halogen atom, a hydroxy group, an alkyloxy group having 1 to 4 carbon atoms, an alkynyloxy group having 2 to 4 carbon atoms, an alkenyloxy group having 2 to 4 carbon atoms, a linear, branched, or cyclic alkyl group having 1 to 6 carbon atoms, a trifluoromethyl group, or a trifluoromethyloxy group, "m" represents 0 or 1, "n" represents an integer of 1 or 2, "l" represents 0 or 1, aromatic rings forming a cyclic ether structure with one another when l=1, "k" represents an integer of 0 to 2, and W represents a divalent organic group having 1 to 40 carbon atoms.

The compound shown by the general formula (1) can give a compound used in a composition for forming an organic film with which it is possible to form an organic film excellent in heat resistance, filling and planarizing properties, and film-formability.

In this case, the compound is preferably shown by the following general formula (2), (2)

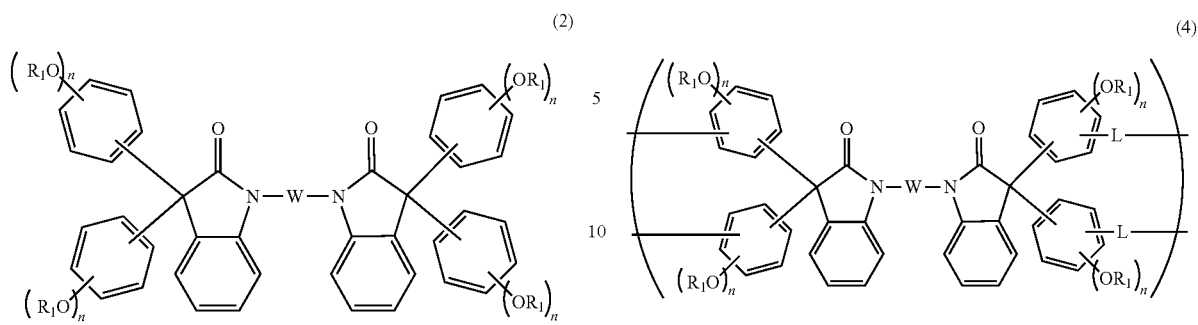

wherein $R_1$, W, and "n" are as defined above.

Such a compound can further enhance the filling and planarizing properties of the compound used in the composition for forming an organic film.

In addition, the present invention provides a polymer having a repeating unit shown by the following general formula (3), (3)

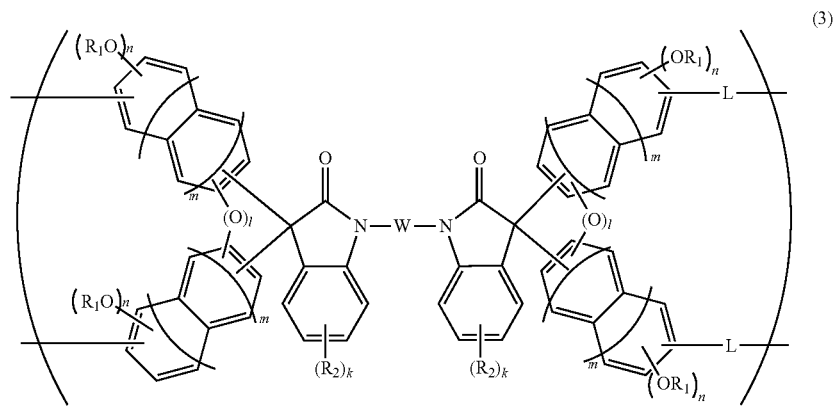

wherein $R_1$ represents a hydrogen atom, an allyl group, or a propargyl group, $R_2$ represents a nitro group, a halogen atom, a hydroxy group, an alkyloxy group having 1 to 4 carbon atoms, an alkynyloxy group having 2 to 4 carbon atoms, an alkenyloxy group having 2 to 4 carbon atoms, a linear, branched, or cyclic alkyl group having 1 to 6 carbon atoms, a trifluoromethyl group, or a trifluoromethyloxy group, "m" represents 0 or 1, "n" represents an integer of 1 or 2, "l" represents 0 or 1, aromatic rings forming a cyclic ether structure with one another when l=1, "k" represents an integer of 0 to 2, W represents a divalent organic group having 1 to 40 carbon atoms, and L represents a divalent organic group having 1 to 40 carbon atoms.

The polymer shown by the general formula (3) can give a polymer contained in a composition for forming an organic film capable of forming an organic film excellent in curability.

In this case, the polymer preferably has a repeating unit shown by the following general formula (4), (4)

wherein $R_1$, W, L, and "n" are as defined above.

The polymer having the repeating unit as described above has excellent solvent solubility, and can be a polymer contained in a composition for forming an organic film.

Furthermore, the L is preferably a divalent organic group shown by the following general formula (5), (5)

wherein $R_3$ represents a hydrogen atom or an organic group containing an aromatic ring having 1 to 20 carbon atoms, and a broken line represents an attachment point.

By introducing such a linking group L, various physical properties of the polymer such as curability and etching resistance can be improved.

Advantageous Effects of Invention

As described above, the inventive compound or polymer is useful for forming an organic film excellent in heat resistance and excellent in filling and planarizing performances and film-formability. In addition, a composition for forming an organic film containing the compound and/or polymer has various properties such as heat resistance and filling and planarizing properties, and is a material useful for forming an organic film that can be formed with no dependence on the substrate to be processed. Therefore, the composition is extremely useful as a composition for forming an organic film in a multilayer resist process such as a 2-layer resist process, a 3-layer resist process using a silicon-containing resist middle layer film, or a 4-layer resist process using a silicon-containing resist middle layer film and an organic antireflective coating, or as a planarizing material for manufacturing a semiconductor device, for example. Furthermore, according to the inventive patterning process, a fine pattern can be formed in a body to be processed with high precision in a multilayer resist process.

BRIEF DESCRIPTION OF DRAWINGS

FIG. 1 is an explanatory diagram of an example of an inventive patterning process according to a 3-layer resist process.
FIG. 2 is an explanatory diagram of a method for evaluating the filling property in Examples and Comparative Examples.
FIG. 3 is an explanatory diagram of a method for evaluating the planarizing property in Examples and Comparative Examples.
FIG. 4 is an explanatory diagram showing a method for measuring the adhesiveness in Examples and Comparative Examples.

DESCRIPTION OF EMBODIMENTS

As described above, the following have been desired: a composition for forming an organic film in a fine patterning process by a multilayer resist method in a semiconductor device manufacturing process, where the composition makes it possible to form an organic film excellent in film-formability and flatness even on a body to be processed (substrate to be processed) having portions that are particularly difficult to planarize such as a wide trench structure; a patterning process in which the composition is used; and a compound and polymer suitable for such a composition for forming an organic film.

The present inventors have found out that the inventive compound or polymer whose main skeleton is formed with a specific hetero ring structure is useful for forming an organic film excellent in filling and planarizing properties, and completed the present invention.

That is, the present invention is a composition for forming an organic film, comprising: a material for forming an organic film shown by the following general formula; and an organic solvent,

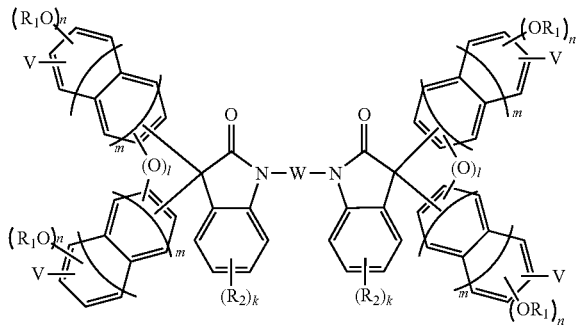

wherein $R_1$ represents a hydrogen atom, an allyl group, or a propargyl group, $R_2$ represents a nitro group, a halogen atom, a hydroxy group, an alkyloxy group having 1 to 4 carbon atoms, an alkynyloxy group having 2 to 4 carbon atoms, an alkenyloxy group having 2 to 4 carbon atoms, a linear, branched, or cyclic alkyl group having 1 to 6 carbon atoms, a trifluoromethyl group, or a trifluoromethyloxy group, "m" represents 0 or 1, "n" represents an integer of 1 or 2, "l" represents 0 or 1, aromatic rings forming a cyclic ether structure with one another when l=1, "k" represents an integer of 0 to 2, W represents a divalent organic group having 1 to 40 carbon atoms, and each V independently represents a hydrogen atom or a linking moiety.

Hereinafter, embodiments of the present invention will be described, but the present invention is not limited thereto.
[Composition for Forming Organic Film]
The inventive composition for forming an organic film contains: a material for forming an organic film shown by a specific general formula described below; and an organic solvent.

The composition for forming an organic film can be any composition as long as the material for forming an organic film shown by the general formula and an organic solvent are contained, and may contain additives such as a surfactant or a plasticizer as necessary. In the following, the components contained in the inventive composition will be described.
[Material for Forming Organic Film]
The inventive composition for forming an organic film contains a material for forming an organic film shown by the following general formula.

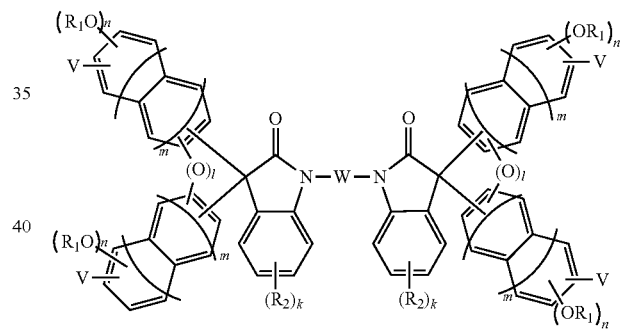

In the general formula, $R_1$ represents a hydrogen atom, an allyl group, or a propargyl group, $R_2$ represents a nitro group, a halogen atom, a hydroxy group, an alkyloxy group having 1 to 4 carbon atoms, an alkynyloxy group having 2 to 4 carbon atoms, an alkenyloxy group having 2 to 4 carbon atoms, a linear, branched, or cyclic alkyl group having 1 to 6 carbon atoms, a trifluoromethyl group, or a trifluoromethyloxy group, "m" represents 0 or 1, "n" represents an integer of 1 or 2, "l" represents 0 or 1, aromatic rings forming a cyclic ether structure with one another when l=1, "k" represents an integer of 0 to 2, W represents a divalent organic group having 1 to 40 carbon atoms, and each V independently represents a hydrogen atom or a linking moiety.

The $R_1$ in the general formula represents a hydrogen atom, an allyl group, or a propargyl group. In view of thermosetting property, a hydrogen atom or a propargyl group is preferable, and from the viewpoint of providing thermal flowability, a propargyl group is particularly preferable.

$R_2$ represents a nitro group, a halogen atom such as a fluorine atom or a chlorine atom, a hydroxy group, an alkyloxy group having 1 to 4 carbon atoms, such as a methoxy group or an ethoxy group, an alkynyloxy group having 2 to 4 carbon atoms, such as a propargyloxy group, an alkenyloxy group having 2 to 4 carbon atoms, such as an allyloxy group, a linear, branched, or cyclic alkyl group having 1 to 6 carbon atoms, such as a methyl group, an isobutyl group, or a cyclohexyl group, a trifluoromethyl group, or a trifluoromethyloxy group.

"m" represents 0 or 1, "n" represents an integer of 1 or 2, and "l" represents 0 or 1. When l=1, it means that aromatic rings form a cyclic ether structure with one another. Furthermore, "n" and "l" satisfy the relationship 1≤n+l≤3. "k" represents an integer of 0 to 2. "m" is preferably 0, "l" is preferably 0, and "k" is preferably 0.

The W in the general formula represents a divalent organic group having 1 to 40 carbon atoms, preferably a divalent organic group having 2 to 30 carbon atoms. Specific examples include the structures shown below. In particular, an alkylene group is preferable from the viewpoints of availability of raw materials and providing thermal flowability.

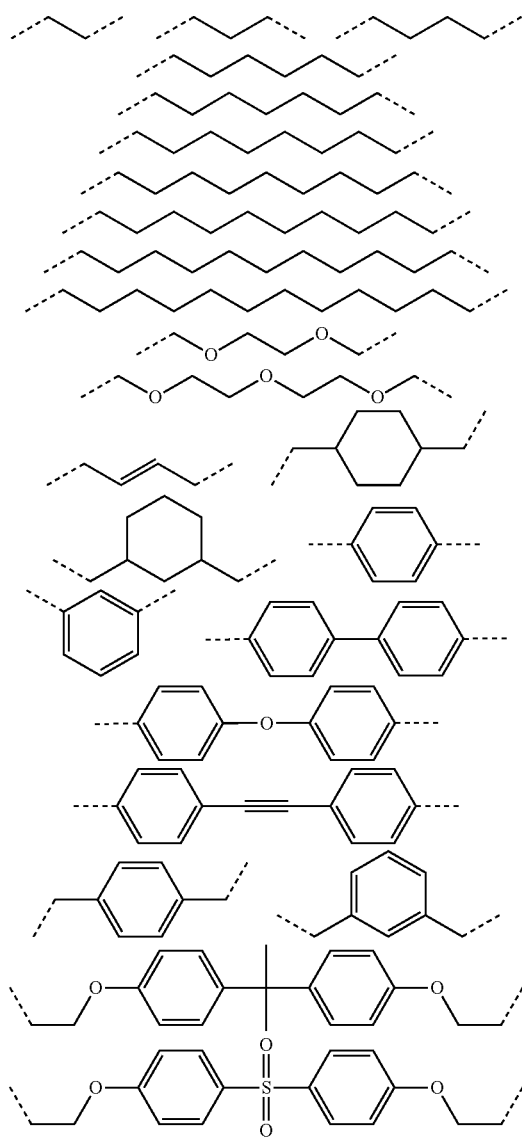

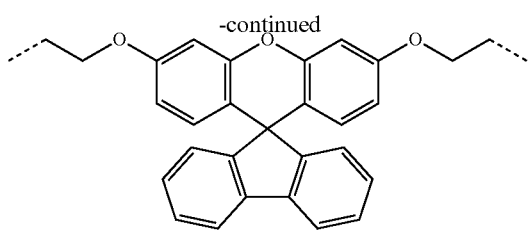

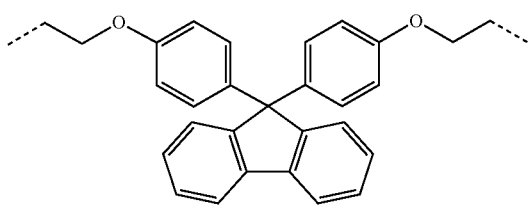

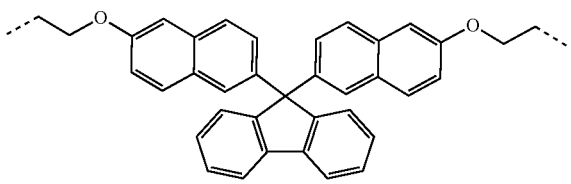

A broken line represents an attachment point.

Each V independently represents a hydrogen atom or a linking moiety. When all Vs are hydrogen atoms (there are no linking moieties), the material for forming an organic film shown by the general formula is a monomolecular compound, and corresponds to the compound shown by the general formula (1) described below. When V is a linking moiety, the material for forming an organic film is a polymer. The linking moiety is a moiety that links the structures shown by the general formula with each other, and can be, for example, a single bond, or those given as linking groups L described below. That is, the polymer encompasses the polymer having the repeating unit shown by the general formula (3) described below.

The material for forming an organic film can be the compound shown by the following general formula (1) or the compound shown by the general formula (2) (hereinafter, these compounds are also referred to as "compounds used in a composition for forming an organic film"), and can also be the polymer having the repeating unit shown by the following general formula (3) or the polymer having the repeating unit shown by the general formula (4) (hereinafter, these polymers are also referred to as "polymers used in a composition for forming an organic film"). In addition, the material for forming an organic film can also contain one or more compounds selected from the compound shown by the general formula (1) and one or more polymers selected from the polymer having the repeating unit shown by the general formula (3).

<Compound Used in Composition for Forming Organic Film>

The inventive composition for forming an organic film can contain the compound (compound used in a composition for forming an organic film) shown by the following general formula (1) as a material for forming an organic film.

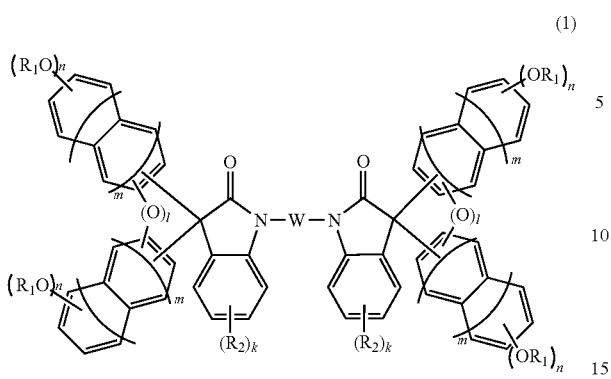

(1)

In the general formula (1), $R_1$, $R_2$, "m", "n", "l", "k", and W are as described above.

The W in the general formula (1) represents a divalent organic group having 1 to 40 carbon atoms, preferably a divalent organic group having 2 to 30 carbon atoms, and specific examples include the structures described above. In particular, an alkylene group is preferable from the viewpoints of availability of raw materials and providing thermal flowability.

The $R_1$ in the general formula (1) represents a hydrogen atom, an allyl group, or a propargyl group. From the viewpoint of thermosetting property, a hydrogen atom and a propargyl group are preferable, and from the viewpoint of providing thermal flowability, a propargyl group is particularly preferable.

$R_2$ represents a nitro group, a halogen atom such as a fluorine atom or a chlorine atom, a hydroxy group, an alkyloxy group having 1 to 4 carbon atoms, such as a methoxy group or an ethoxy group, an alkynyloxy group having 2 to 4 carbon atoms, such as a propargyloxy group, an alkenyloxy group having 2 to 4 carbon atoms, such as an allyloxy group, a linear, branched, or cyclic alkyl group having 1 to 6 carbon atoms, such as a methyl group, an isobutyl group, or a cyclohexyl group, a trifluoromethyl group, or a trifluoromethyloxy group.

"m" represents 0 or 1, "n" represents an integer of 1 or 2, and "l" represents 0 or 1. When l=1, it means that aromatic rings form a cyclic ether structure with one another. Furthermore, "n" and "l" satisfy the relationship 1≤n+l≤3. "k" represents an integer of 0 to 2. "m" is preferably 0, "l" is preferably 0, and "k" is preferably 0.

Specific examples of the general formula (1) include the following, where $R_1$, $R_2$, W, and "k" are as defined above.

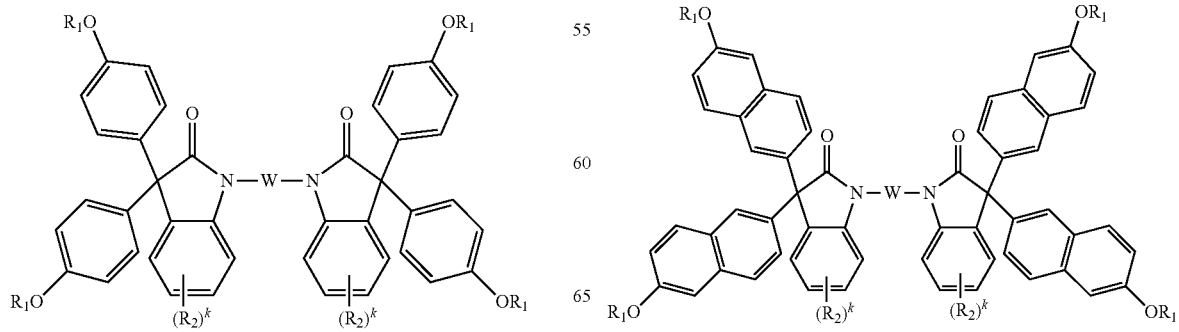

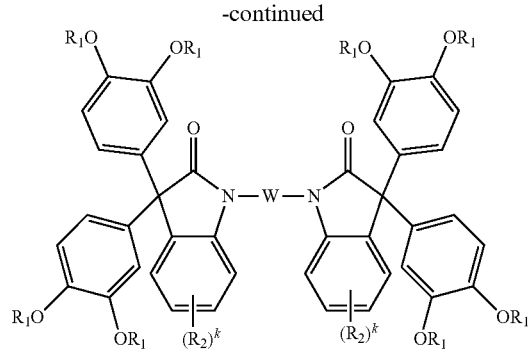

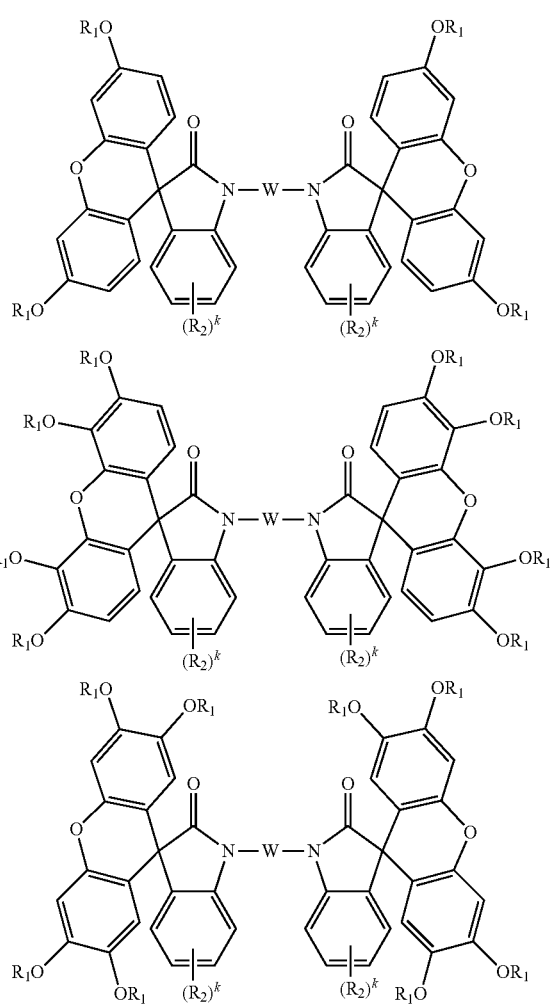

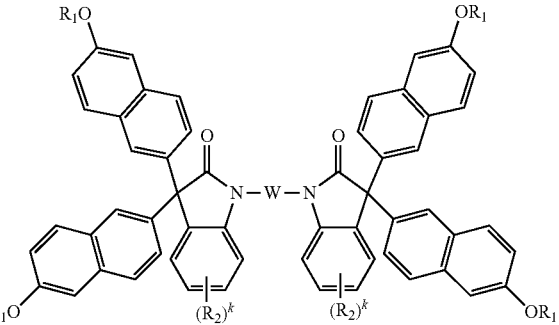

-continued

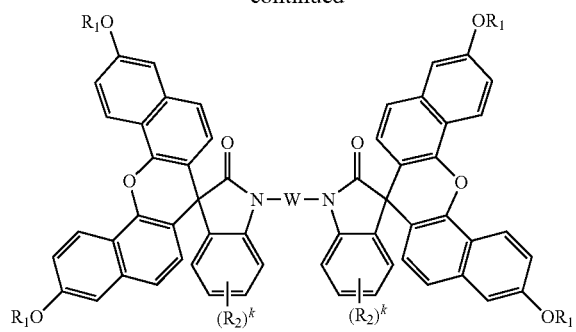

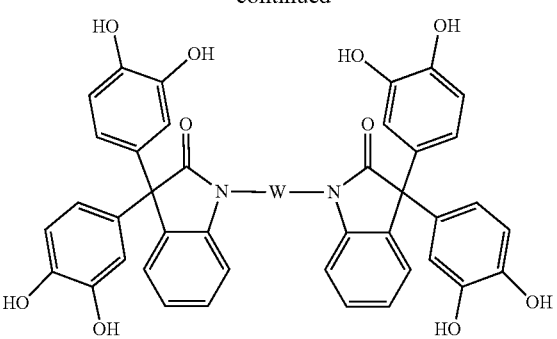

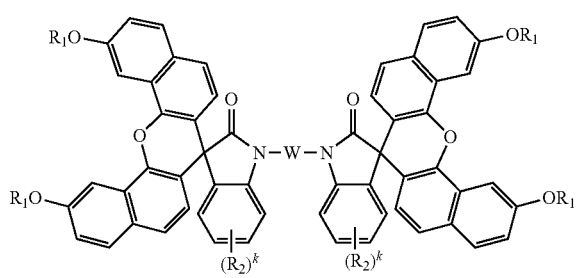

Furthermore, the compound is preferably a compound shown by the following general formula (2).

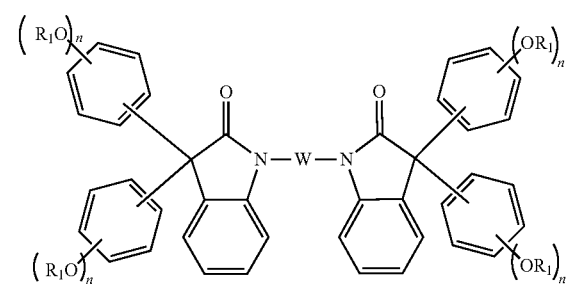
(2)

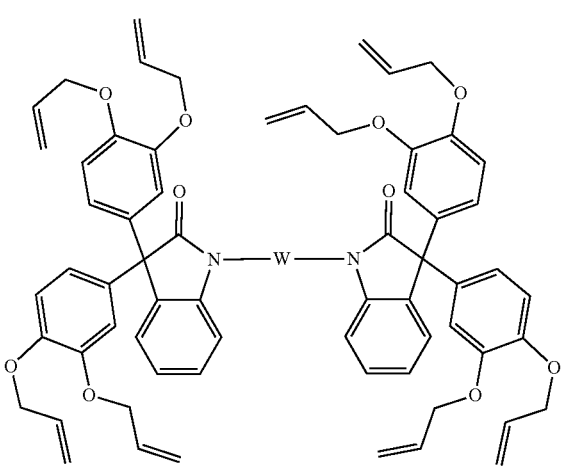

Specific examples of the general formula (2) include the following. In particular, a compound having a propargyl group as a substituent is particularly preferable in view of thermal flowability and curability. The W in the following general formula is as defined above.

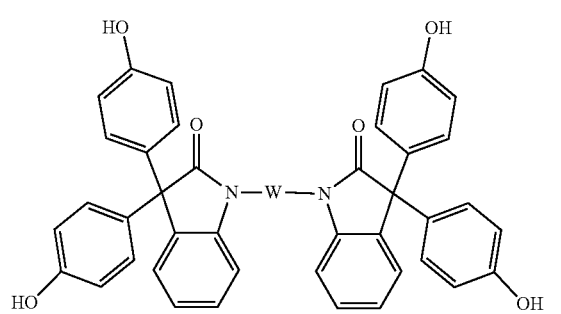

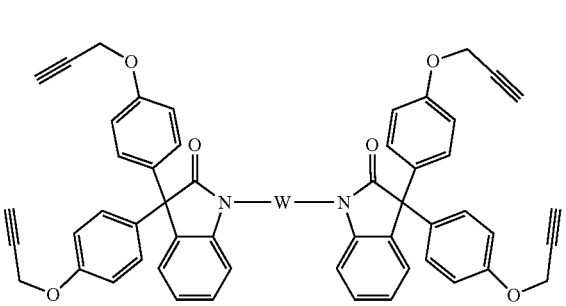

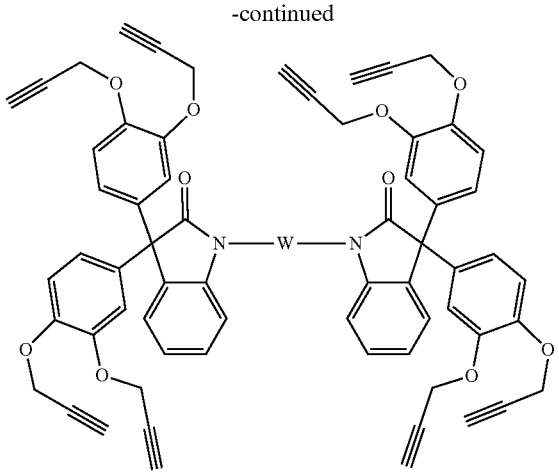

In addition, the compound shown by the general formula (1) preferably satisfies 1.00≤Mw/Mn≤1.10, where Mw is a weight-average molecular weight and Mn is a number-average molecular weight measured by gel permeation chromatography in terms of polystyrene. From the definition, Mw/Mn is 1.00 when the compound is a monomolecular compound. However, for reasons of separability in gel permeation chromatography, the measured value exceeds 1.00 in some cases. Generally, it is extremely difficult to bring Mw/Mn close to 1.00 in a polymer having a repeating unit unless a special polymerization method is used, there is a distribution of Mw, and Mw/Mn becomes a value greater than 1. In the present invention, 1.00≤Mw/Mn≤1.10 has been defined as an index indicating monomerism in order to distinguish between a monomolecular compound and a polymer.

By controlling the Mw/Mn of the compound used in the composition for forming an organic film within such a range, an organic film excellent in filling property and flatness can be formed.

The inventive compound has a structure containing many aromatic rings, and therefore has excellent heat resistance and etching resistance. Furthermore, the compound can contain a combination of a substituent for providing flowability and curability, a heterocyclic structure for providing film-formability and adhesiveness, and a linking structure for further enhancing flowability. Accordingly, the compound is useful for forming an organic film.

[Method for Manufacturing Compound]

Examples of methods for manufacturing the inventive compound shown by the general formula (1) include: a step of obtaining a bis(indole-2,3-dione) as an intermediate by a reaction such as a substitution reaction with a base catalyst where reactants are a compound shown by X—W—X, having two leaving groups X, and an indole-2,3-dione (STEP 1); and a subsequent step of obtaining the compound by a dehydration condensation reaction with an acid catalyst where reactants include a benzene or naphthalene having a substituent $OR_1$ (STEP 2). One or more kinds of reactants may be used in the reactions for STEP 1 and STEP 2, and these can be appropriately selected and combined in accordance with the required properties.

(STEP 1)

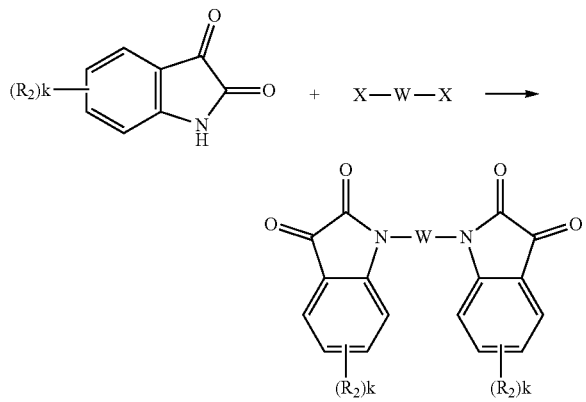

(STEP 2)

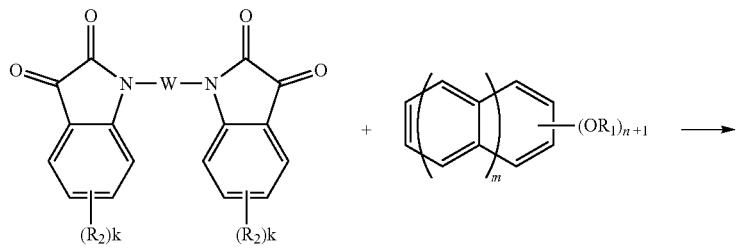

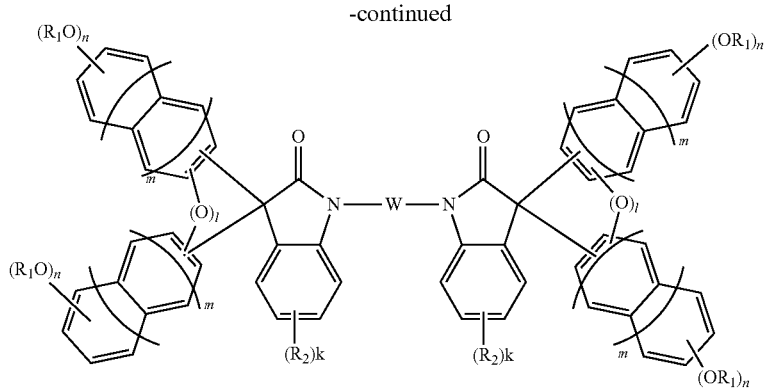

R₁, R₂, W, "n", "m", "l", and "k" are as defined above, and X represents a halide, tosylate, or mesylate.

Examples of the base catalyst in the reaction for obtaining the intermediate bis(indole-2,3-dione) shown in STEP 1 include inorganic base compounds such as sodium hydrogen carbonate, sodium carbonate, potassium carbonate, calcium carbonate, cesium carbonate, sodium hydroxide, potassium hydroxide, sodium hydride, and potassium phosphate; organic amine compounds such as triethyl amine, pyridine, and N-methylmorpholine; and the like. One of these may be used, or two or more thereof may be used in combination. The amount of these catalysts to be used is, for example, within the range of 0.1 to 20 mol, preferably 0.2 to 10 mol based on a mole of the reactant, indole-2,3-dione.

The solvent used in this event is not particularly limited, as long as the solvent is inert in the above reaction. Examples of the solvent include ether-based solvents such as diethyl ether, tetrahydrofuran, and dioxane; aromatic solvents such as benzene, toluene, and xylene; acetonitrile, dimethylsulfoxide, N,N-dimethylformamide, N-methylpyrrolidone, water, and the like. One of these or mixture of two or more thereof can be used. These solvents can be used within a range of 0 to 2,000 parts by mass relative to 100 parts by mass of the reactant. The reaction temperature is preferably −50° C. to approximately the boiling point of the solvent, and room temperature to 150° C. is even more preferable. Reaction time is appropriately selected from 0.1 to 100 hours.

The reaction method includes: a method in which the indole-2,3-dione and the compound shown by X—W—X are charged into a solvent at once; a method in which each or a mixture of the indole-2,3-dione and the compound shown by X—W—X is prepared into a form of dispersion or solution and charged dropwise into a solvent; a method in which one of the indole-2,3-dione and the compound shown by X—W—X is dispersed or dissolved in a solvent, and then the other dispersed or dissolved in a solvent is charged dropwise therein; and the like. Furthermore, when multiple kinds of the indole-2,3-dione and the compound shown by X—W—X are charged, they can be mixed for reaction beforehand, or they can be made to react individually in succession. Examples of the method with a catalyst include: a method in which the catalyst is charged at once with the indole-2,3-dione or the compound shown by X—W—X; a method in which the catalyst prepared in a form of dispersion or solution beforehand is then added dropwise into a reactant; and the like. The obtained intermediate bis(indole-2,3-dione) may successively proceed to the dehydration condensation reaction of STEP 2 in the form of the reaction solution. However, the obtained intermediate may be diluted with an organic solvent, then subjected to liquid-liquid separation and washing or crystallizing with a poor solvent in order to remove unreacted raw materials, the catalyst, and so on present in the system, and thus bis(indole-2,3-dione) can be precipitated as a crystal and collected as a powder.

As the acid catalyst used in the dehydration condensation reaction shown in STEP 2, the following can be used: inorganic acids, such as hydrochloric acid, hydrobromic acid, sulfuric acid, nitric acid, phosphoric acid, and heteropoly acid; organic acids, such as oxalic acid, trifluoroacetic acid, methanesulfonic acid, benzenesulfonic acid, p-toluenesulfonic acid, and trifluoromethanesulfonic acid; and Lewis acids, such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium(IV) ethoxide, titanium(IV) isopropoxide, and titanium(IV) oxide. The amount of the catalyst to be used is in the range of 0.1 to 20 mol, preferably 0.2 to 10 mol per mole of the intermediate bis(indole-2,3-dione).

The solvent used is not particularly limited, and examples thereof include: alcohols such as methanol, ethanol, isopropyl alcohol, butanol, ethylene glycol, propylene glycol, diethylene glycol, glycerol, ethylene glycol monomethyl ether, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; aprotic polar solvents such as dimethylsulfoxide, N,N-dimethylformamide, and hexamethylphosphoric triamide; and the like. One of these can be used, or two or more thereof can be used in mixture. These solvents can be used in a range of 0 to 2000 parts by mass based on 100 parts by mass of the reactant. The reaction temperature is preferably −50° C. to approximately the boiling point of the solvent, and room temperature to 150° C. is even more preferable. Reaction time is appropriately selected from 0.1 to 100 hours.

Reaction methods include: a method of charging the bis(indole-2,3-dione) and the benzene or naphthalene at once with the acid catalyst, being a catalyst; a method of dispersing or dissolving the bis(indole-2,3-dione) and the benzene or naphthalene, then adding the catalyst at once or separately or diluting the catalyst with a solvent and adding dropwise; and a method of dispersing or dissolving the catalyst, then adding each of the bis(indole-2,3-dione) and the benzene or naphthalene at once or separately or diluting the bis(indole-2,3-dione) and the benzene or naphthalene with a solvent and adding dropwise. In this event, as depending on the reactivity of the benzene or naphthalene, 2 mol or more of the benzene or naphthalene is preferably used relative to 1 mol of the bis(indole-2,3-dione). After completion of the reaction, the reaction product can be diluted with an organic solvent, and then liquid-liquid separation and washing can be performed to collect the target compound in order to remove the catalyst used in the reaction.

The organic solvent used in this event is not particularly limited, as long as the organic solvent is capable of dissolving the target compounds and is separated into two layers when mixed with water. Examples of the organic solvent include hydrocarbons, such as hexane, heptane, benzene, toluene, and xylene; esters, such as ethyl acetate, n-butyl acetate, and propylene glycol methyl ether acetate; ketones, such as methyl ethyl ketone, methyl amyl ketone, cyclohexanone, and methyl isobutyl ketone; ethers, such as diethyl ether, diisopropyl ether, methyl-t-butyl ether, and ethylcyclopentylmethyl ether; chlorinated solvents, such as methylene chloride, chloroform, dichloroethane, and trichloroethylene; mixtures thereof; etc. As washing water used in this event, generally, what is called deionized water or ultrapure water may be used. The washing may be performed one or more times, preferably approximately one to five times because washing ten times or more does not always produce the full washing effects thereof.

In the liquid-liquid separation and washing, the washing may be performed with a basic aqueous solution to remove the acidic components in the system. The base specifically includes hydroxides of alkaline metals, carbonates of alkaline metals, hydroxides of alkali earth metals, carbonates of alkali earth metals, ammonia, organic ammonium, etc.

Further, in the liquid-liquid separation and washing, the washing may be performed with an acidic aqueous solution to remove the metal impurities or basic components in the system. The acid specifically includes inorganic acids, such as hydrochloric acid, hydrobromic acid, sulfuric acid, nitric acid, phosphoric acid, and heteropoly acid; organic acids, such as oxalic acid, fumaric acid, maleic acid, trifluoroacetic acid, methanesulfonic acid, benzenesulfonic acid, p-toluenesulfonic acid, and trifluoromethanesulfonic acid; etc.

The liquid-liquid separation and washing may be performed with either one of the basic aqueous solution and the acidic aqueous solution, or can be performed with a combination of the two. The liquid-liquid separation and washing is preferably performed with the basic aqueous solution and the acidic aqueous solution in this order from the viewpoint of removing the metal impurities.

After the liquid-liquid separation and washing with, the basic aqueous solution and the acidic aqueous solution, washing with neutral water may be successively performed. The washing may be performed one or more times, preferably approximately one to five times. As the neutral water, deionized water, ultrapure water, or the like as mentioned above may be used. The washing may be performed one or more times, but if the washing is not performed sufficiently, the basic components and acidic components cannot be removed in some cases. The washing is preferably performed approximately one to five times because washing ten times or more does not always produce the full washing effects thereof.

Further, the reaction product after the liquid-liquid separation can also be collected as a powder by concentrating and desiccating with removing the solvent or crystallizing the reaction product under reduced pressure or normal pressure. Alternatively, the reaction product can also be retained in the state of solution with an appropriate concentration to improve the workability in preparing the composition for forming an organic film. The concentration in this event is preferably 0.1 to 50 mass %, more preferably 0.5 to 30 mass %. With such a concentration, the viscosity is hardly increased, making it possible to prevent degradation of the workability; in addition, since the amount of the solvent is not excessive, it is economical.

The solvent in this event is not particularly limited, as long as the solvent is capable of dissolving the compound. Specific examples of the solvent include ketones, such as cyclohexanone and methyl-2-amyl ketone; alcohols, such as 3-methoxybutanol, 3-methyl-3-methoxybutanol, 1-methoxy-2-propanol, and 1-ethoxy-2-propanol; ethers, such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters, such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. One of these or a mixture of two or more thereof can be used.

<Polymer Used in Composition for Forming Organic Film>

The inventive composition for forming an organic film can contain a polymer (polymer contained in a composition for forming an organic film) having a repeating unit shown by the following general formula (3), and a polymer having a repeating unit shown by the general formula (4) is preferable.

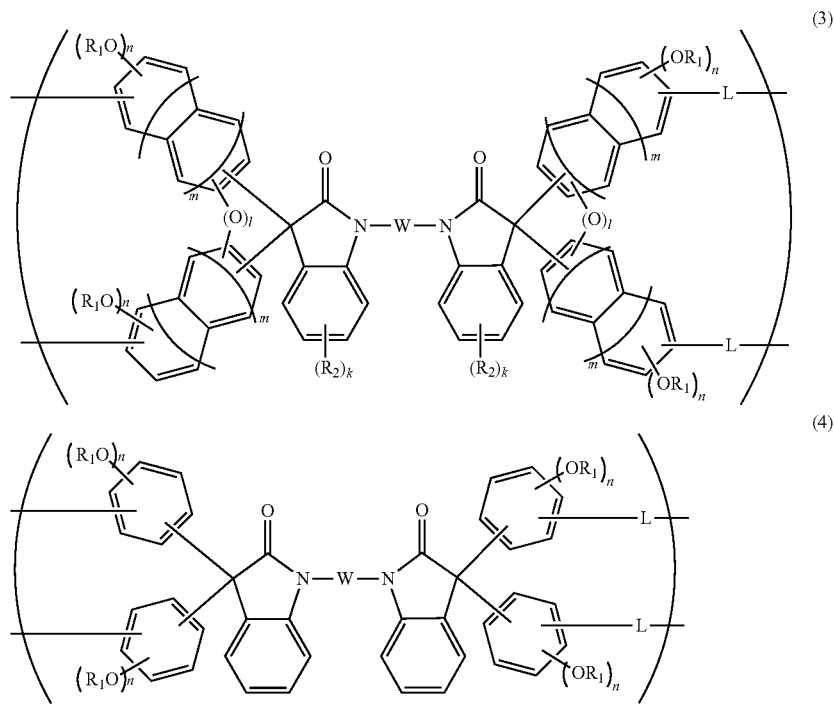

(3)

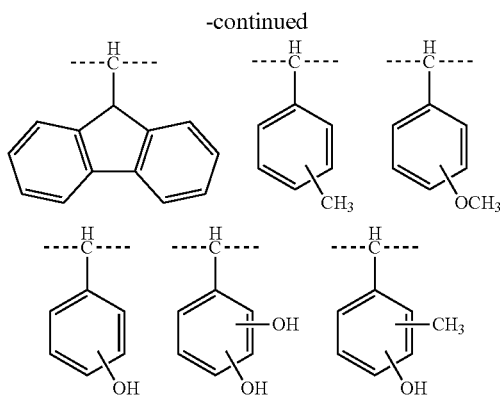

(4)

In the general formula (3), $R_1$, $R_2$, W, "n", "m", "l", and "k" are as defined above, and L represents a divalent organic group having 1 to 40 carbon atoms.

These polymers are obtained from the compound shown by the general formula (1), and since the above-described compound is used, these have excellent heat resistance, flatness, and thermosetting property. Furthermore, since these are polymers having a repeating unit rather than a monomer (monomolecular compound), the amount of outgas components is small. In addition, since the polymer has a molecular weight distribution, crystallinity is eased, so that improvement of film-formability can also be expected.

The linking group L constituting the repeating units of the general formulae (3) and (4) is a divalent organic group having 1 to 40 carbon atoms, and specific examples include the following or the like.

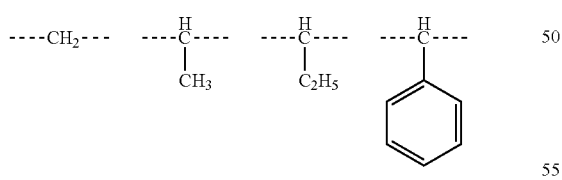

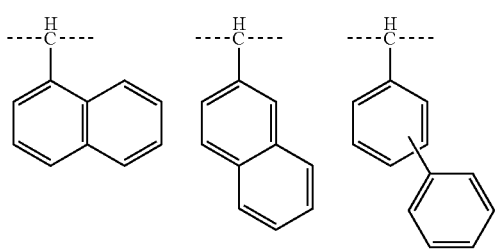

-continued

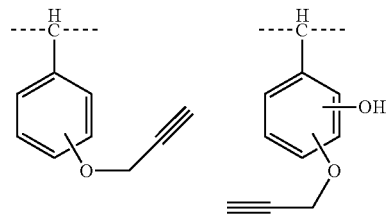

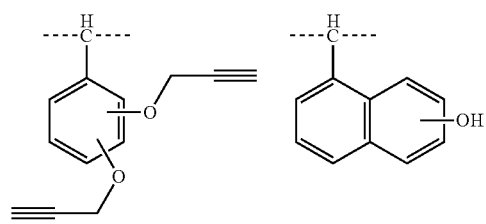

-continued
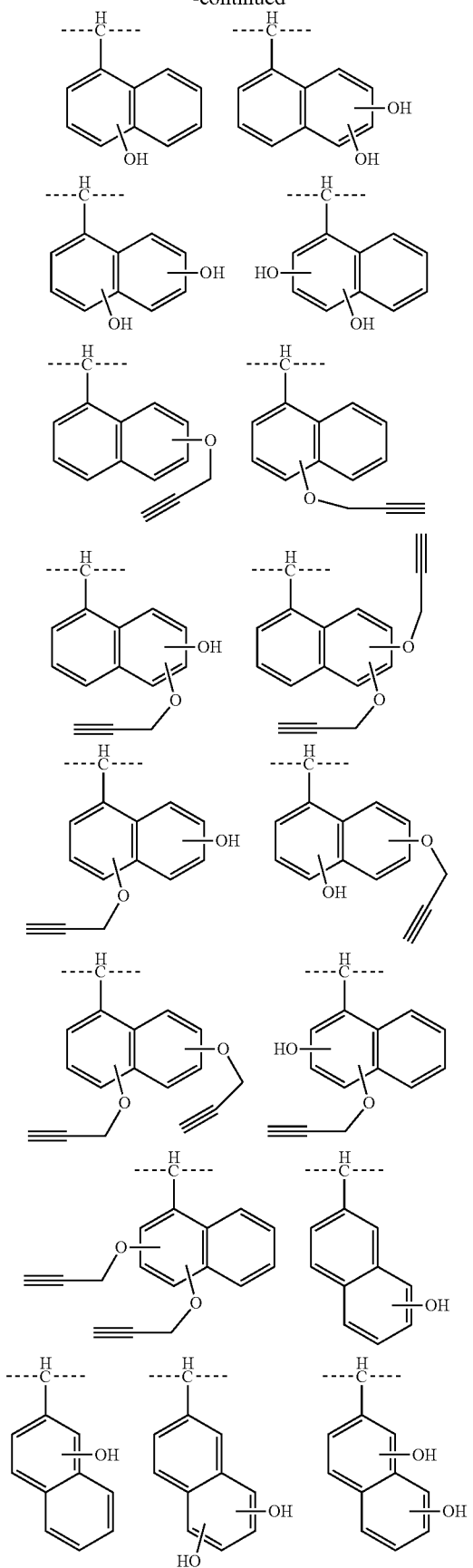
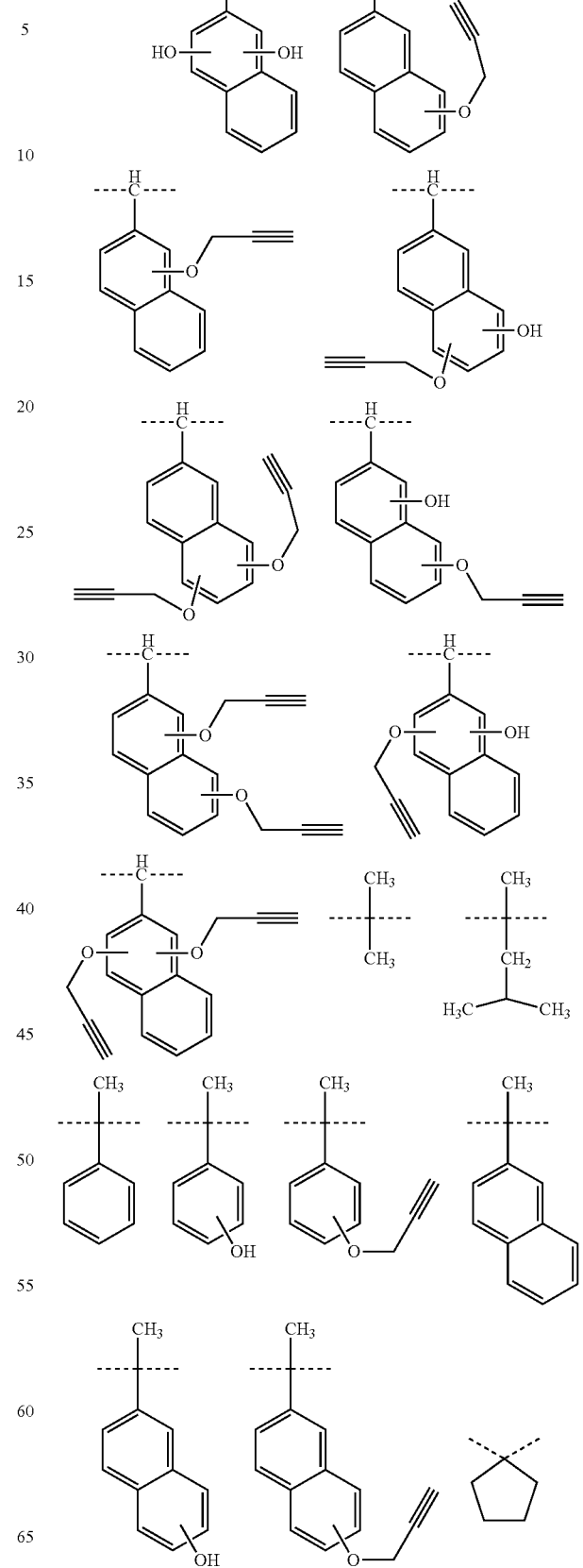

-continued

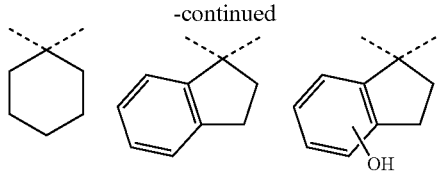
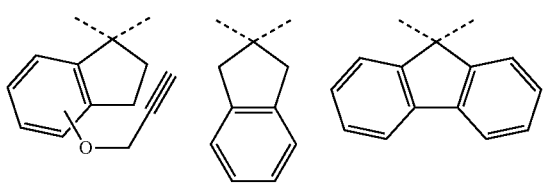
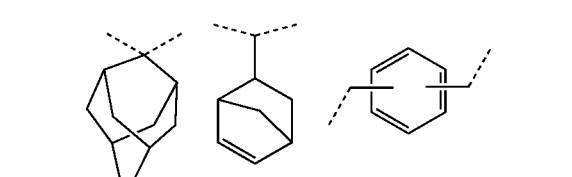

-continued

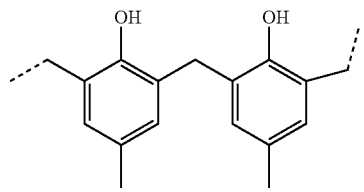
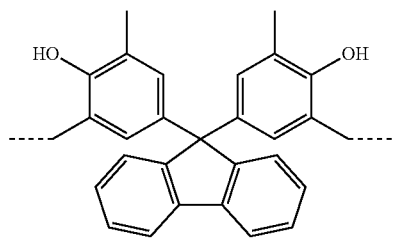

A broken line represents an attachment point.

Furthermore, the L is preferably the following general formula (5).

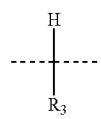

(5)

In the general formula (5), $R_3$ represents a hydrogen atom or an organic group containing an aromatic ring having 1 to 20 carbon atoms, and a broken line represents an attachment point.

Specific examples of the general formula (5) include the following. In particular, in view of the availability of raw materials, a methylene group is preferable. That is, $R_3$ is preferably a hydrogen atom.

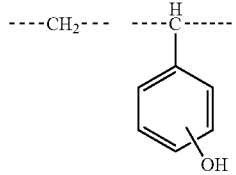
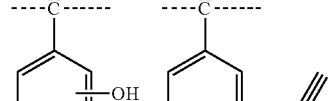
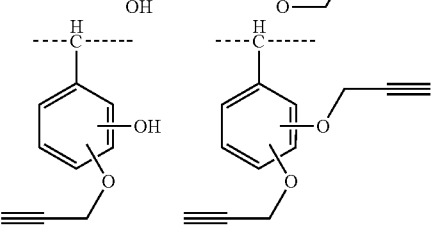

-continued

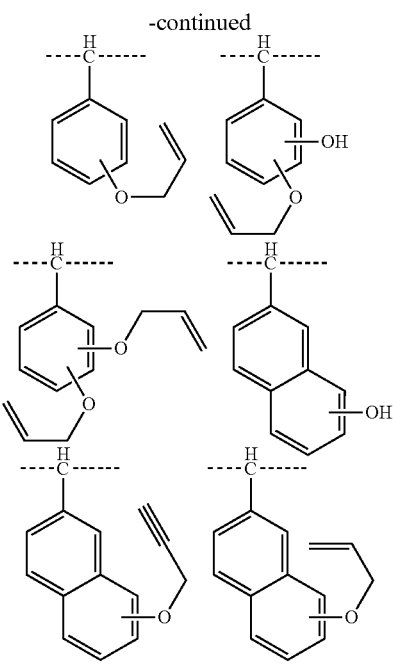

A broken line represents an attachment point.

Furthermore, the Mw (weight-average molecular weight) of the above-described polymer is preferably 1000 to 5000, and the Mw is further preferably 1000 to 4000. Note that the molecular weight can be determined as a weight-average molecular weight (Mw) measured by gel permeation chromatography (GPC) using tetrahydrofuran as an eluent in terms of polystyrene.

When the molecular weight is within such a range, solubility in organic solvents can be ensured, and sublimation products that are generated when baking can be suppressed. In addition, the thermal flowability of the polymer contained in a composition for forming an organic film becomes favorable. Therefore, when blended in a material, the polymer can not only favorably fill a fine structure formed on a substrate, but also form an organic film having the entire substrate planarized.

[Method for Manufacturing Polymer]

As a means for obtaining the polymer contained in the inventive composition for forming an organic film, the polymer can be obtained by a polycondensation reaction between the compound shown by the general formula (1) and an aldehyde or a ketone or a benzyl alcohol. The $R_1$, $R_2$, W, "n", "m", "l", and "k" in the following formulae are as defined above. When one or both of $R_4$ and $R_5$ are hydrogen atoms, polycondensation with an aldehyde is indicated, otherwise, polycondensation with a ketone is indicated. AR represents an aromatic compound such as benzene and naphthalene, and the substituent represented by —$CH_2$—OH is a substituent of the aromatic ring.

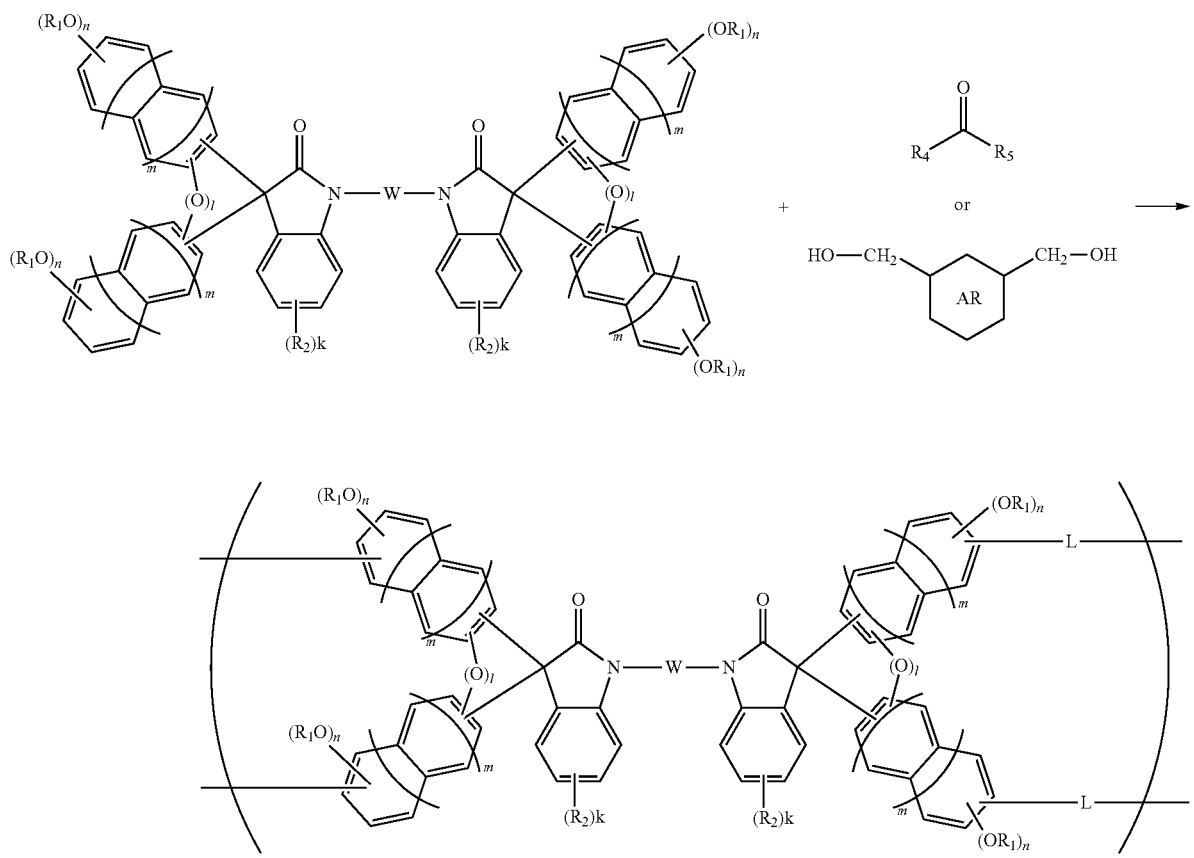

The above-described polycondensation reaction can generally be achieved in an organic solvent in the presence of an acid catalyst at room temperature or under cooling or heating as necessary. As the acid catalyst used, the following can be used: inorganic acids, such as hydrochloric acid, hydrobromic acid, sulfuric acid, nitric acid, phosphoric acid, and heteropoly acid; organic acids, such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium(IV) ethoxide, titanium(IV) isopropoxide, and titanium(IV) oxide.

Examples of the solvent used include: alcohols such as methanol, ethanol, isopropyl alcohol, butanol, ethylene glycol, propylene glycol, diethylene glycol, glycerol, ethylene glycol monomethyl ether, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; aprotic polar solvents such as dimethylsulfoxide, N,N-dimethylformamide, and hexamethylphosphoric triamide; and the like. One of these can be used, or two or more thereof can be used in mixture.

Regarding methods for performing the reaction and methods for collecting the polymer, the methods described in the method for manufacturing the compound shown by the general formula (1) can be performed.

[Different Method for Manufacturing Compound and Polymer]

When the $R_1$ in the compound shown by the general formula (1) or the polymer shown by the general formula (3) contained in the inventive composition for forming an organic film is not a hydrogen atom, examples of a different manufacturing method include a method of going through a step (STEP 1) of obtaining an intermediate by a dehydration condensation reaction in the presence of an acid catalyst, as shown below, where a bis(indole-2,3-dione) and a benzene or naphthalene having a hydroxy group, so-called phenol or naphthol, are used as raw materials. A monomolecular compound can be obtained by using a raw material shown by $R_1$—X having a leaving group X for converting a hydroxy group into $OR_1$, and performing a substitution reaction in the presence of a base catalyst (STEP 2-1). A polymer can be obtained by performing a polycondensation reaction (STEP 2-2) by using the compound obtained in (STEP 1), and then, performing a substitution reaction in the presence of a base catalyst (STEP 3) where a raw material shown by $R_1$—X having a leaving group X for converting a hydroxy group into $OR_1$ is used. In this case, one kind of the $R_1$—X can be used, or two or more kinds thereof can be used, and by further controlling the reaction rate, the ratio of hydroxy groups to $OR_1$ groups can also be controlled. By partly introducing a polar structure such as a hydroxy group, film-formability and adhesion of the film to a substrate can also be controlled.

(STEP 1)

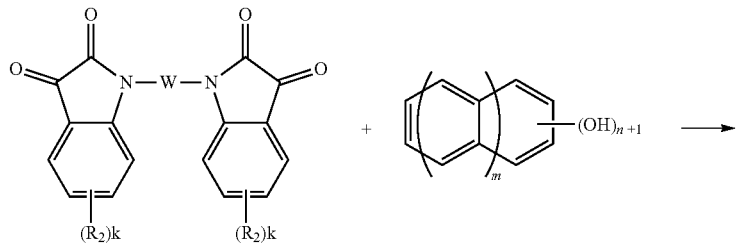

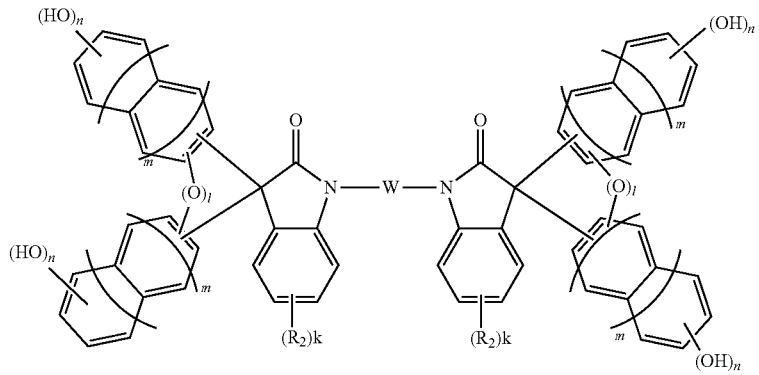

-continued
(STEP 2-1)
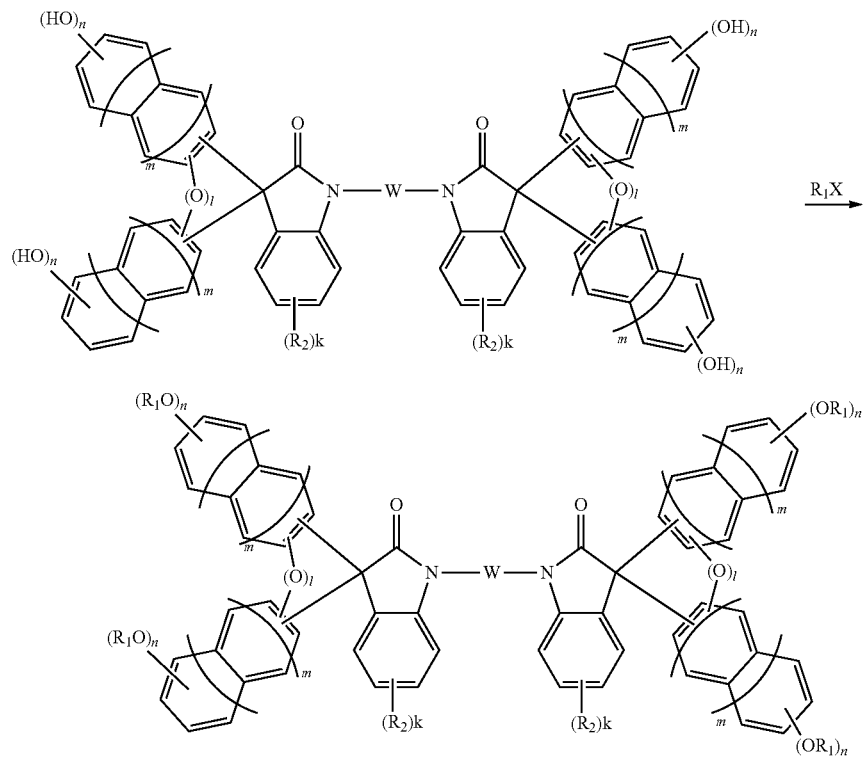
(STEP 2-2)
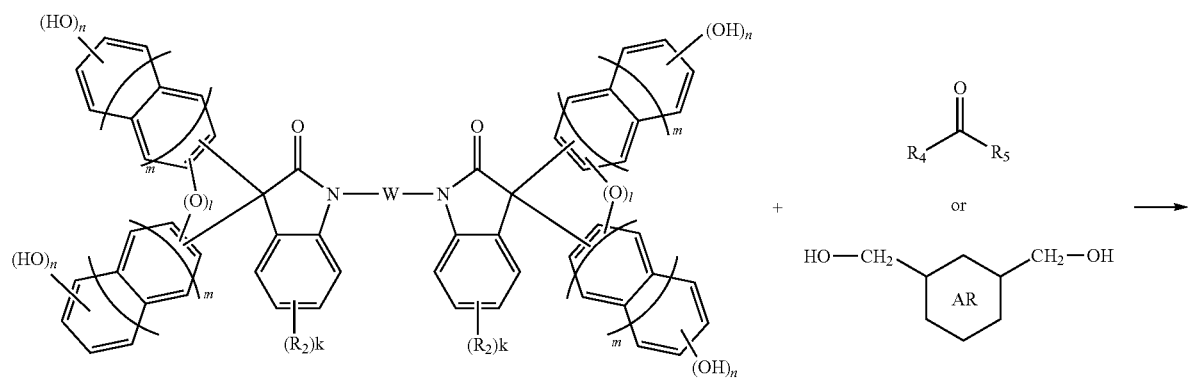
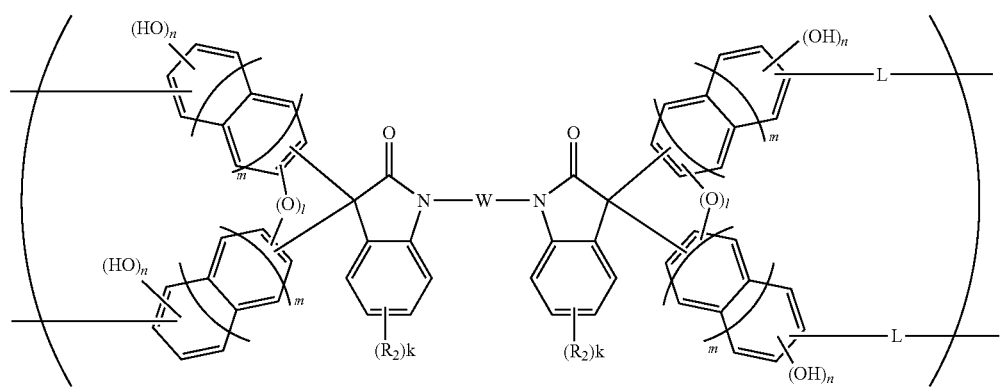

-continued
(STEP 3)

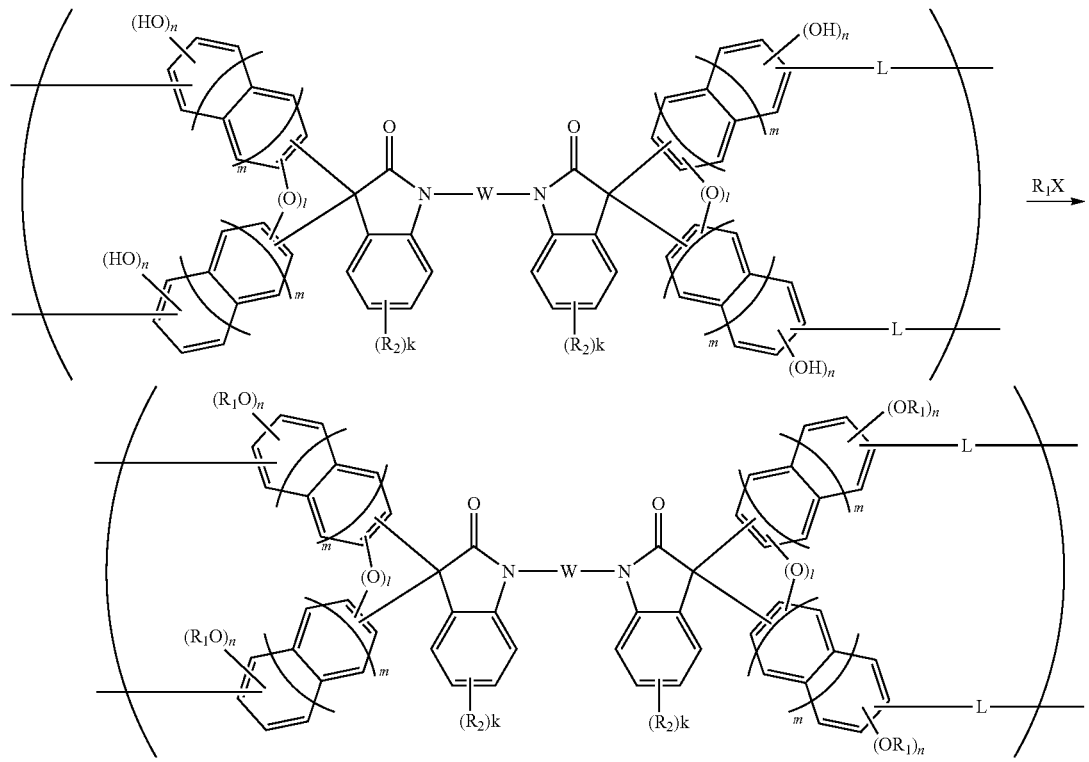

$R_1$, $R_2$, W, X, "l", and "k" are as defined above.

The dehydration condensation reaction of (STEP 1) and the polycondensation reaction of (STEP 2-2) can be performed respectively by the methods described in the methods for manufacturing the compound shown by the formula (1) and the polymer shown by the formula (3). The reaction method and the method for collecting the compound or polymer can be performed by the methods described in the methods for manufacturing the compound shown by the general formula (1).

Examples of the base catalyst used in the substitution reaction in (STEP 2-1) and (STEP 3) include inorganic base compounds such as sodium hydrogen carbonate, sodium carbonate, potassium carbonate, calcium carbonate, cesium carbonate, sodium hydroxide, potassium hydroxide, sodium hydride, and potassium phosphate; organic amine compounds such as triethyl amine, pyridine, and N-methylmorpholine; and the like. One of these may be used, or two or more thereof may be used in combination.

The solvent used in this event is not particularly limited, as long as the solvent is inert in the reaction. Examples of the solvent include ether-based solvents, such as diethyl ether, tetrahydrofuran, and dioxane; aromatic solvents, such as benzene, toluene, and xylene; acetonitrile, dimethylsulfoxide, N,N-dimethylformamide, N-methylpyrrolidone, water, etc. One of these or a mixture thereof can be used.

The reaction method and the method for collecting the compound or polymer can be performed by the methods described in the methods for manufacturing the compound shown by the general formula (1).

To prepare the compound or polymer used in the composition for forming an organic film obtained by this method, one of various halides, tosylates, and mesylates can be used solely or in combination of two or more thereof according to the required performance. For example, those having a side chain structure that contributes to improvement of planarizing property, a rigid aromatic ring structure that contributes to etching resistance and heat resistance, and so forth can be combined at any proportion. Therefore, a composition for forming an organic film using these compounds and polymers can achieve both higher filling and planarizing properties and higher etching resistance.

As described above, the inventive compound or polymer contained in a composition for forming an organic film gives a composition for forming an organic film that can exhibit high etching resistance and excellent twisting resistance.

[Compound and/or Polymer Contained in Composition for Forming Organic Film]

As a material for forming an organic film, one or a combination of two or more of the compound or polymer contained in a composition for forming an organic film can be used in the inventive composition for forming an organic film containing an organic solvent and the above-described compound and/or polymer contained in a composition for forming an organic film.

Furthermore, one or more compounds selected from the above-described compounds contained in a composition for forming an organic film and one or more polymers selected from the above-described polymers contained in a composition for forming an organic film are preferably contained in the present invention. Specifically, the material for forming an organic film is a mixture that preferably contains one or more compounds selected from the compounds shown by the general formula (1) and one or more polymers selected from polymers having a repeating unit shown by the general formula (3).

In such a mixture, it is possible to adjust, within an appropriate range, various properties, such as filling and planarizing properties and outgas caused by sublimation products, required when using an organic film.

[Organic Solvent]

The organic solvent that can be contained in the inventive composition for forming an organic film is not particularly limited as long as the solvent can dissolve the compound and/or polymer (base polymer), and can dissolve, when contained, the acid generator, crosslinking agent, and other additives described below. Specifically, solvents with a boiling point of lower than 180° C. can be used, such as those disclosed in paragraphs [0091] and [0092] of JP 2007-199653 A. Above all, propylene glycol monomethyl ether acetate (PGMEA), propylene glycol monomethyl ether, 2-heptanone, cyclopentanone, cyclohexanone, and a mixture of two or more thereof are preferably used. The organic solvent is contained in an amount of preferably 200 to 10,000 parts, more preferably 300 to 5,000 parts, based on 100 parts of the compound and/or polymer (A).

Such a composition for forming an organic film can be applied by spin-coating, and has heat resistance and high filling and planarizing properties because the inventive compound and/or polymer contained in a composition for forming an organic film as described above is incorporated.

Further, the inventive composition for forming an organic film may contain the organic solvent in which a high-boiling-point solvent having a boiling point of 180° C. or higher is added to the aforementioned solvent having a boiling point of lower than 180° C., namely a mixture of a solvent having a boiling point of lower than 180° C. and a solvent having a boiling point of 180° C. or higher. The high-boiling point organic solvent is not particularly limited to hydrocarbons, alcohols, ketones, esters, ethers, chlorinated solvents, and so forth as long as the high-boiling point organic solvent is capable of dissolving the compound and/or polymer contained in a composition for forming an organic film. Specific examples of the high-boiling-point organic solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol monohexyl ether, ethylene glycol mono-2-ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butylmethyl ether, triethylene glycol dimethyl ether, triethylene glycol monomethyl ether, triethylene glycol-n-butyl ether, triethylene glycol butylmethyl ether, triethylene glycol diacetate, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol monomethyl ether acetate, dipropylene glycol methyl-n-propyl ether, dipropylene glycol methyl ether acetate, 1,4-butanediol diacetate, 1,3-butylene glycol diacetate, 1,6-hexanediol diacetate, triethylene glycol diacetate, γ-butyrolactone, dihexyl malonate, diethyl succinate, dipropyl succinate, dibutyl succinate, dihexyl succinate, dimethyl adipate, diethyl adipate, dibutyl adipate, and the like. One of these or a mixture thereof may be used.

The boiling point of the high-boiling-point solvent may be appropriately selected according to the temperature at which the composition for forming an organic film is heated. The boiling point of the high-boiling-point solvent to be added is preferably 180° C. to 300° C., more preferably 200° C. to 300° C. Such a boiling point prevents the evaporation rate at baking (heating) from becoming excessive, which would otherwise occur if the boiling point is too low. Thus, sufficient thermal flowability can be achieved. Meanwhile, with such a boiling point, the boiling point is not too high, so that the high-boiling-point solvent evaporates after baking and does not remain in the film; thus, the boiling point in these ranges does not adversely affect the film physical properties, such as etching resistance.

When the high-boiling-point solvent is used, the contained amount of the high-boiling-point solvent is preferably 1 to 30 parts by mass based on 100 parts by mass of the solvent having a boiling point of lower than 180° C. When the contained amount is in this range, sufficient thermal flowability can be provided during baking, and there is no risk of the high-boiling-point solvent remaining in the film and leading to degradation of the film physical properties such as etching resistance.

With such a composition for forming an organic film, the above-described composition for forming an organic film is provided with thermal flowability by the addition of the high-boiling-point solvent, so that the composition for forming an organic film also has high filling and planarizing properties.

[Acid Generator]

In the inventive composition for forming an organic film, an acid generator can be added so as to further promote the curing reaction. The acid generator includes a material that generates an acid by thermal decomposition, and a material that generates an acid by light irradiation. Any acid generator can be added. Specifically, materials disclosed in paragraphs [0061] to [0085] of JP 2007-199653 A can be added, but the present invention is not limited thereto.

One of the acid generators or a combination of two or more thereof can be used. When an acid generator is added, the added amount is preferably 0.05 to 50 parts, more preferably 0.1 to 10 parts, based on 100 parts of the above-described compound and/or polymer.

[Surfactant]

To the inventive composition for forming an organic film, a surfactant can be added so as to enhance the coating property in spin-coating. As the surfactant, for example, those disclosed in [0142] to [0147] of JP 2009-269953 A can be used. When a surfactant is added, the added amount is preferably 0.01 to 10 parts, more preferably 0.05 to 5 parts, based on 100 parts of the above-described compound and/or polymer.

In the present invention, the composition for forming an organic film preferably further contains at least one of a surfactant and a plasticizer.

[Crosslinking Agent]

Moreover, to the inventive composition for forming an organic film, a crosslinking agent can also be added so as to increase the curability and to further suppress intermixing with an upper layer film. The crosslinking agent is not particularly limited, and known various types of crosslinking agents can be widely used. Examples thereof include methylol or alkoxymethyl-type crosslinking agents of polynuclear phenols, melamine-based crosslinking agents, glycoluril-based crosslinking agents, benzoguanamine-based crosslinking agents, urea-based crosslinking agents, β-hydroxyalkylamide-based crosslinking agents, isocyanurate-based crosslinking agents, aziridine-based crosslinking agents, oxazoline-based crosslinking agents, and epoxy-based crosslinking agents. When a crosslinking agent is added, the added amount is preferably 1 to 100 parts, more preferably 5 to 50 parts based on 100 parts of the compound and/or polymer.

Specific examples of the melamine-based crosslinking agents include hexamethoxymethylated melamine, hexabutoxymethylated melamine, alkoxy- and/or hydroxy-substituted derivatives thereof, and partial self-condensates thereof. Specific examples of the glycoluril-based crosslinking agents include tetramethoxymethylated glycoluril, tetrabutoxymethylated glycoluril, alkoxy- and/or hydroxy-substituted derivatives thereof, and partial self-condensates thereof. Specific examples of the benzoguanamine-based crosslinking agents include tetramethoxymethylated benzoguanamine, tetrabutoxymethylated benzoguanamine, alkoxy- and/or hydroxy-substituted derivatives thereof, and partial self-condensates thereof. Specific examples of the urea-based crosslinking agents include dimethoxymethylated dimethoxyethyleneurea, alkoxy- and/or hydroxy-substituted derivatives thereof, and partial self-condensates thereof. A specific example of the βR-hydroxyalkylamide-based crosslinking agents includes N,N,N',N'-tetra(2-hydroxyethyl)adipic acid amide. Specific examples of the isocyanurate-based crosslinking agents include triglycidyl isocyanurate and triallyl isocyanurate. Specific examples of the aziridine-based crosslinking agents include 4,4'-bis(ethyleneiminocarbonylamino)diphenylmethane and 2,2-bishydroxymethylbutanol-tris[3-(1-aziridinyl)propionate]. Specific examples of the oxazoline-based crosslinking agents include 2,2'-isopropylidene bis(4-benzyl-2-oxazoline), 2,2'-isopropylidene bis(4-phenyl-2-oxazoline), 2,2'-methylenebis(4,5-diphenyl-2-oxazoline), 2,2'-methylenebis-4-phenyl-2-oxazoline, 2,2'-methylenebis-4-tert-butyl-2-oxazoline, 2,2'-bis(2-oxazoline), 1,3-phenylenebis(2-oxazoline), 1,4-phenylenebis(2-oxazoline), and a 2-isopropenyloxazoline copolymer. Specific examples of the epoxy-based crosslinking agents include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, and pentaerythritol tetraglycidyl ether.

Specific examples of the polynuclear-phenol-based crosslinking agents include compounds shown by the following general formula (6).

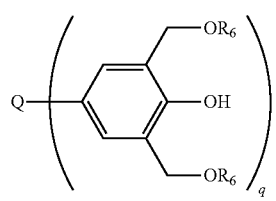

(6)

In the formula, Q represents a single bond or a hydrocarbon group with a valency of "q" having 1 to 20 carbon atoms. $R_6$ represents a hydrogen atom or an alkyl group having 1 to 20 carbon atoms. "q" represents an integer of 1 to 5.

Q represents a single bond or a hydrocarbon group with a valency of "q" having 1 to 20 carbon atoms. "q" represents an integer of 1 to 5, more preferably 2 or 3. Specific examples of Q include groups obtained by removing "q" hydrogen atoms from methane, ethane, propane, butane, isobutane, pentane, cyclopentane, hexane, cyclohexane, methyl pentane, methyl cyclohexane, dimethyl cyclohexane, trimethyl cyclohexane, benzene, toluene, xylene, ethyl benzene, ethyl isopropylbenzene, diisopropylbenzene, methylnaphthalene, ethyl naphthalene, and eicosane. $R_6$ represents a hydrogen atom or an alkyl group having 1 to 20 carbon atoms. Specific examples of the alkyl group having 1 to 20 carbon atoms include a methyl group, an ethyl group, a propyl group, an isopropyl group, a butyl group, an isobutyl group, a pentyl group, an isopentyl group, a hexyl group, an octyl group, an ethylhexyl group, a decyl group, and an eicosanyl group. A hydrogen atom or a methyl group is preferable.

Specific examples of the compound shown by the general formula (6) include the following compounds. In particular, in view of enhancing the curability and film thickness uniformity of the organic film, hexamethoxymethylated compounds of triphenolmethane, triphenolethane, 1,1,1-tris(4-hydroxyphenyl)ethane, and tris(4-hydroxyphenyl)-1-ethyl-4-isopropylbenzene are preferable. $R_6$ is as defined above.

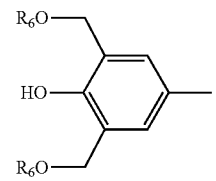

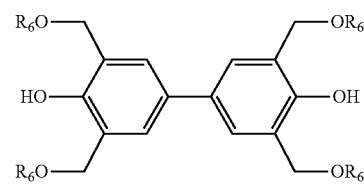

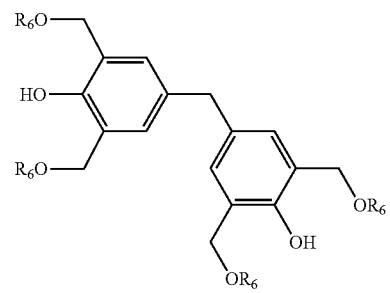

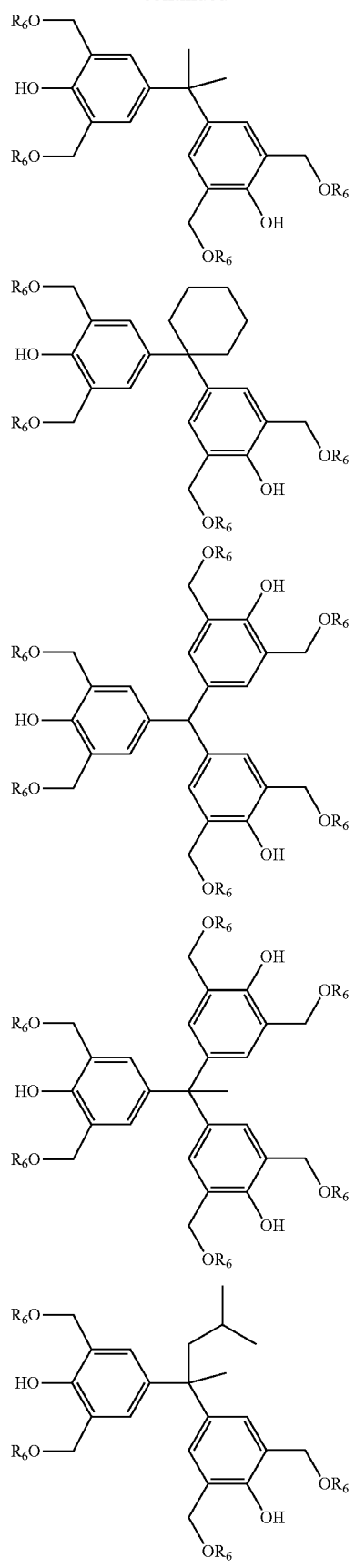
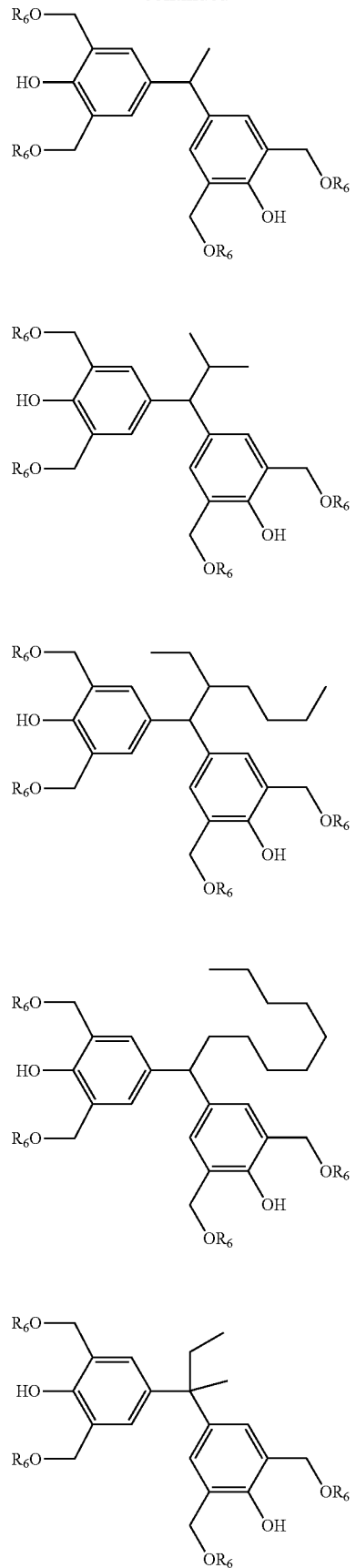

-continued
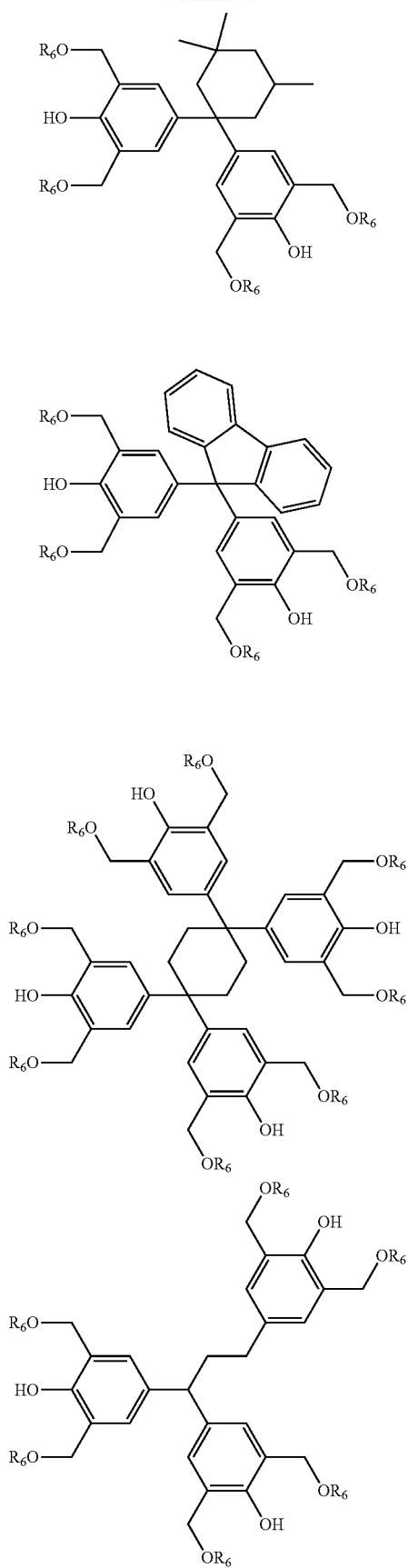
-continued
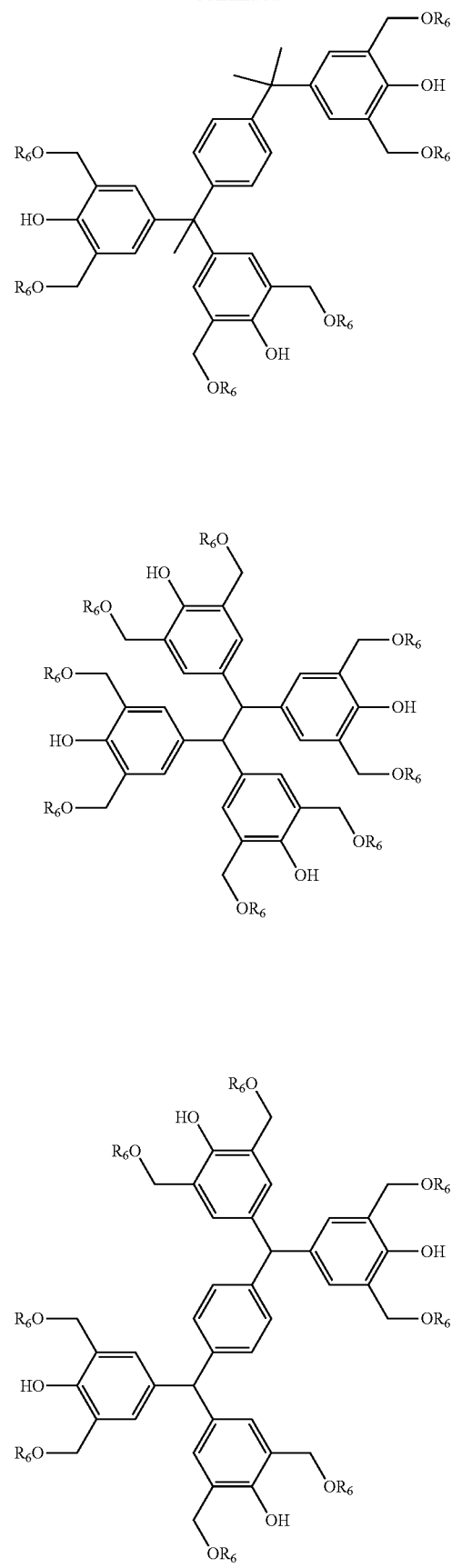

-continued

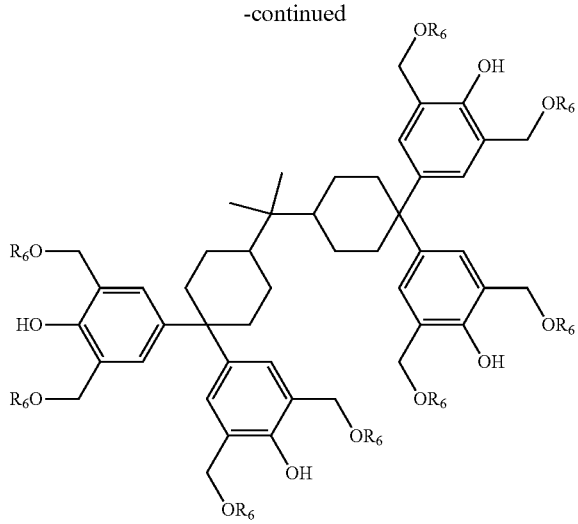

[Plasticizer]

Further, to the inventive composition for forming an organic film, a plasticizer can be added so as to enhance the planarizing and filling properties further. The plasticizer is not particularly limited, and known various types of plasticizers can be widely used. Examples thereof include low-molecular-weight compounds, such as phthalic acid esters, adipic acid esters, phosphoric acid esters, trimellitic acid esters, and citric acid esters; and polymers, such as polyethers, polyesters, and polyacetal-based polymers disclosed in JP 2013-253227 A. When a plasticizer is added, the added amount is preferably 1 to 100 parts, more preferably 5 to 30 parts based on 100 parts of the above-described compound and/or polymer.

Furthermore, like the plasticizer, as an additive for providing the inventive composition for forming an organic film with filling and planarizing properties, it is preferable to use, for example, liquid additives having polyethylene glycol or polypropylene glycol structures, or thermo-decomposable polymers having a weight loss ratio between 30° C. and 250° C. of 40 mass % or more and a weight-average molecular weight of 300 to 200,000. The thermo-decomposable polymers preferably contain a repeating unit having an acetal structure shown by the following general formula (DP1) or (DP1a).

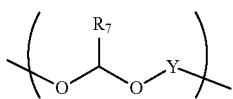
(DP1)

In the formula, $R_7$ represents a hydrogen atom or a saturated or unsaturated monovalent organic group having 1 to 30 carbon atoms which may be substituted. Y represents a saturated or unsaturated divalent organic group having 2 to 30 carbon atoms.

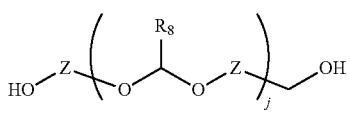
(DP1a)

In the formula, $R_8$ represents an alkyl group having 1 to 4 carbon atoms. Z represents a saturated or unsaturated divalent hydrocarbon group having 4 to 10 carbon atoms which may have an ether bond. "j" represents an average repeating unit number of 3 to 500.

[Other Components]

The inventive composition for forming an organic film may be further blended with a different compound or polymer. The blend compound or blend polymer mixed with the inventive composition for forming an organic film serves to improve the film-formability with spin-coating and the filling property for a stepped substrate.

Examples of such a material include novolak resins of phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-tert-butylphenol, 3-tert-butylphenol, 4-tert-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-tert-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-tert-butyl-5-methylphenol, pyrogallol, thymol, isothymol, 4,4'-(9H-fluorene-9-ylidene)bisphenol, 2,2'dimethyl-4,4'-(9H-fluorene-9-ylidene)bisphenol, 2,2'diallyl-4,4'-(9H-fluorene-9-ylidene)bisphenol, 2,2'difluoro-4,4'-(9H-fluorene-9-ylidene)bisphenol, 2,2'diphenyl-4,4'-(9H-fluorene-9-ylidene)bisphenol, 2,2'dimethoxy-4,4'-(9H-fluorene-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, and 7-methoxy-2-naphthol, dihydroxynaphthalenes such as 1,5-dihydroxynaphthalene, 1,7-dihydroxynaphthalene, and 2,6-dihydroxynaphthalene, methyl 3-hydroxynaphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, limonene, etc.; polyhydroxystyrene, polystyrene, polyvinylnaphthalene, polyvinylanthracene, polyvinylcarbazole, polyindene, polyacenaphthylene, polynorbornene, polycyclodecene, polytetracyclododecene, polynortricyclene, poly(meth)acrylate, and copolymers thereof. It is also possible to blend a naphthol dicyclopentadiene copolymer disclosed in JP 2004-205685 A, a fluorene bisphenol novolak resin disclosed in JP 2005-128509 A, an acenaphthylene copolymer disclosed in JP 2005-250434 A, fullerene having a phenol group disclosed in JP 2006-227391 A, a bisphenol compound and a novolak resin thereof disclosed in JP 2006-293298 A, a novolak resin of an adamantane phenol compound disclosed in JP 2006-285095 A, a bisnaphthol compound and a novolak resin thereof disclosed in JP 2010-122656 A, a fullerene resin compound disclosed in JP 2008-158002 A, or the like.

The blended amount of the blend compound or the blend polymer is preferably 0 to 1,000 parts by mass, more preferably 0 to 500 parts by mass based on 100 parts by mass of the inventive composition for forming an organic film.

Note that one kind of the material for forming an organic film of the present invention can be used, or a combination of two or more thereof can be used. The material for forming an organic film can be used for an organic film material or a planarizing material for manufacturing a semiconductor device.

In addition, the inventive composition for forming an organic film is extremely useful as an organic film material in a multilayer resist process such as a 2-layer resist process, a 3-layer resist process using a silicon-containing middle layer film, or a 4-layer resist process using a silicon-containing inorganic hard mask and an organic antireflective coating.

(Method for Forming Organic Film)

The present invention provides a method for forming an organic film which serves as an organic film in a multilayer resist film used in lithography or a planarizing film for manufacturing a semiconductor by using the above-described composition for forming an organic film.

In the method for forming an organic film by using the inventive composition for forming an organic film, a substrate to be processed may be coated with the composition for forming an organic film by a spin-coating method, etc. By employing a method like spin-coating method, favorable filling property can be obtained. After the spin-coating, baking (heating) is performed to evaporate the solvent, to prevent the mixing with a resist upper layer film or a resist middle layer film, and to promote the crosslinking reaction. The baking is preferably performed at 100° C. or higher to 600° C. or lower for 10 to 600 seconds, more preferably at 200° C. or higher to 500° C. or lower for 10 to 300 seconds. In considering the influences of device damage and wafer deformation, the upper limit of the heating temperature in lithographic wafer process is preferably 600° C. or lower, more preferably 500° C. or lower.

Moreover, in the method for forming an organic film by using the inventive composition for forming an organic film, a substrate to be processed can be coated with the inventive composition for forming an organic film by the spin-coating method or the like as described above, and subsequently an organic film can be formed by curing the composition for forming an organic film by baking in an atmosphere with an oxygen concentration of 0.1 volume % or more to 21 volume % or less.

The inventive composition for forming an organic film is baked in such an oxygen atmosphere, thereby enabling to obtain a fully cured film. The atmosphere during the baking may be in air. Nevertheless, it is preferable to introduce an inert gas such as $N_2$, Ar, or He to reduce oxygen content from the viewpoint of preventing oxidation of the organic film. To prevent the oxidation, the oxygen concentration needs to be controlled, and is preferably 1000 ppm or less, more preferably 100 ppm or less (based on volume). Preventing the oxidation of the organic film during baking is preferable because an increase in absorption and a decrease in etching resistance are prevented.

Because of the excellent filling and planarizing properties, the method for forming an organic film by using the inventive composition for forming an organic film as described above can provide a flat cured film regardless of unevenness of a substrate to be processed. Accordingly, the method is extremely useful in forming a flat cured film on a substrate to be processed having a structure or a step with a height of 30 nm or more.

Note that the thickness of the organic film such as an organic film or a planarizing film for manufacturing a semiconductor device is appropriately determined and is preferably 30 to 20,000 nm, particularly preferably 50 to 15,000 nm.

(Patterning Process)

The present invention provides a patterning process according to a 3-layer resist process using the composition for forming an organic film as described above. The patterning process is a method for forming a pattern in a body to be processed, and includes at least the following steps:

forming an organic film by using the above-described composition for forming an organic film on a body to be processed;

forming a silicon-containing resist middle layer film by using a silicon-containing resist middle layer film material on the organic film;

forming a resist upper layer film by using a photoresist composition on the silicon-containing resist middle layer film;

forming a circuit pattern in the resist upper layer film;

transferring the pattern to the silicon-containing resist middle layer film by etching while using the resist upper layer film having the formed pattern as a mask;

transferring the pattern to the organic film by etching while using the silicon-containing resist middle layer film having the transferred pattern as a mask; and further forming the pattern in the body to be processed by etching while using the organic film having the transferred pattern as a mask.

The silicon-containing resist middle layer film in the 3-layer resist process exhibits resistance to etching by an oxygen gas or a hydrogen gas. Thus, when the organic film is dry-etched while using the silicon-containing resist middle layer film as a mask in the 3-layer resist process, the dry etching is preferably performed using an etching gas mainly containing an oxygen gas or a hydrogen gas.

As the silicon-containing resist middle layer film in the 3-layer resist process, a polysiloxane-based middle layer film is also favorably used. The silicon-containing resist middle layer film having an antireflective effect can suppress the reflection. Particularly, for 193-nm light exposure, a material containing many aromatic groups and having high etching selectivity to a substrate is used as an organic film, so that the k-value and the substrate reflection are increased. However, the reflection can be suppressed by providing the silicon-containing resist middle layer film with absorption to achieve an appropriate k-value. Thus, the substrate reflection can be reduced to 0.5% or less. As the silicon-containing resist middle layer film having the antireflective effect, a polysiloxane is preferably used, the polysiloxane containing anthracene for 248-nm and 157-nm light exposure, or containing a phenyl group or a light-absorbing group having a silicon-silicon bond for 193-nm light exposure in a pendant structure, and being crosslinked by an acid or heat.

In addition, a 4-layer resist process using an organic antireflective coating is also favorable, and in this case, a semiconductor device circuit pattern can be formed on a substrate by performing a patterning process including at least the following steps:

forming an organic film by using the above-described composition for forming an organic film on a body to be processed;

forming a silicon-containing resist middle layer film by using a silicon-containing resist middle layer film material on the organic film;

forming an organic antireflective coating (BARC) on the silicon-containing resist middle layer film;

forming a resist upper layer film by using a photoresist composition on the BARC, so that a 4-layered film structure is constructed;

forming a circuit pattern in the resist upper layer film;

transferring the pattern to the BARC and the silicon-containing resist middle layer film by etching while using the resist upper layer film having the formed pattern as a mask;

transferring the pattern to the organic film by etching while using the silicon-containing resist middle layer film having the transferred pattern as a mask; and further forming the pattern in the body to be processed by etching the body to be processed while using the organic film having the transferred pattern as a mask.

In addition, an inorganic hard mask can be formed instead of the silicon-containing resist middle layer film, and in this case, a semiconductor device circuit pattern can be formed in a substrate by performing a patterning process including at least the following steps:

forming an organic film by using the above-described composition for forming an organic film on a body to be processed;

forming an inorganic hard mask selected from a silicon oxide film, a silicon nitride film, and a silicon oxynitride film on the organic film;

forming a resist upper layer film by using a photoresist composition on the inorganic hard mask;

forming a circuit pattern in the resist upper layer film;

etching the inorganic hard mask while using the resist upper layer film having the formed pattern as a mask;

etching the organic film while using the inorganic hard mask having the formed pattern as a mask; and further forming the pattern in the body to be processed by etching the body to be processed while using the organic film having the formed pattern as a mask.

In the case where an inorganic hard mask is formed on the organic film as described above, a silicon oxide film, a silicon nitride film, and a silicon oxynitride film (SiON film) can be formed by a CVD method, an ALD method, or the like. The method for forming the silicon nitride film is disclosed in, for example, JP 2002-334869 A and WO 2004/066377 A1. The film thickness of the inorganic hard mask is preferably 5 to 200 nm, more preferably 10 to 100 nm. As the inorganic hard mask, a SiON film is most preferably used, being effective as an antireflective coating. When the SiON film is formed, the substrate temperature reaches 300 to 500° C. Hence, the organic film needs to withstand the temperature of 300 to 500° C. Since the compositions for forming an organic film used in the present invention have high heat resistance and can withstand high temperatures of 300° C. to 500° C., the combination of the inorganic hard mask formed by a CVD method or an ALD method and the organic film formed by a spin-coating method is possible.

A 4-layer resist process using an organic antireflective coating is also favorable, and in this case, a semiconductor device circuit pattern can be formed in a substrate by performing a patterning process including at least the following steps:

forming an organic film by using the above-described composition for forming an organic film on a body to be processed;

forming an inorganic hard mask selected from a silicon oxide film, a silicon nitride film, and a silicon oxynitride film on the organic film;

forming a BARC on the inorganic hard mask;

forming a resist upper layer film by using a photoresist composition on the BARC, so that a 4-layered film structure is constructed;

forming a circuit pattern in the resist upper layer film;

etching the BARC and the inorganic hard mask while using the resist upper layer film having the formed pattern as a mask;

etching the organic film while using the inorganic hard mask having the formed pattern as a mask; and further forming the pattern in the body to be processed by etching the body to be processed while using the organic film having the formed pattern as a mask.

The photoresist film may be formed on the inorganic hard mask as a resist upper layer film as described above, or alternatively, it is also possible to form an organic antireflective coating (BARC) on the inorganic hard mask by spin-coating, and then form a photoresist film thereon. In particular, when a SiON film is used as the inorganic hard mask, two antireflective coatings including the SiON film and the BARC make it possible to suppress the reflection even in liquid immersion exposure at a high NA exceeding 1.0. Another advantage of the BARC formation is having an effect of reducing trailing of the photoresist pattern immediately above the SiON film.

The resist upper layer film in the 3-layer resist process may be a positive type or a negative type, and any generally-used photoresist composition can be employed. After spin-coating of the photoresist composition, pre-baking is performed, preferably at 60 to 180° C. for 10 to 300 seconds. Then, light exposure, post-exposure baking (PEB), and development are performed according to conventional methods to obtain the resist pattern. Note that the thickness of the resist upper layer film is not particularly limited, but is preferably 30 to 500 nm, and 50 to 400 nm is particularly preferable.

In addition, examples of exposure light include a high-energy beam with a wavelength of 300 nm or less, specifically, excimer laser of 248 nm, 193 nm, and 157 nm, soft X-ray of 3 to 20 nm, electron beam, X-ray, and the like.

The pattern in the resist upper layer film is preferably formed by a lithography using light with a wavelength of 10 nm or more to 300 nm or less, a direct drawing with electron beam, nanoimprinting, or a combination thereof.

Furthermore, the development method in the patterning processes is preferably alkali development or development with an organic solvent.

Next, etching is performed while using the obtained resist pattern as a mask. In the 3-layer resist process, the silicon-containing resist middle layer film and the inorganic hard mask are etched using a fluorocarbon-based gas and using the upper layer resist pattern as a mask. Thereby, a silicon-containing resist middle layer film pattern and an inorganic hard mask pattern are formed.

The organic film is etched while using the obtained silicon-containing resist middle layer film pattern and inorganic hard mask pattern as masks.

Subsequently, the substrate to be processed can be etched according to a conventional method. For example, the substrate to be processed made of $SiO_2$, SiN, or silica-based low-dielectric insulating film is etched mainly with a fluorocarbon-based gas; and p-Si, Al, or W is etched mainly with a chlorine- or bromine-based gas. When the substrate is processed by etching with a fluorocarbon-based gas, the silicon-containing resist middle layer film pattern in the 3-layer resist process is removed together with the substrate processing. When the substrate is etched with a chlorine- or bromine-based gas, the silicon-containing resist middle layer film pattern needs to be removed by additional dry etching with a fluorocarbon-based gas after the substrate processing.

An organic film obtained from the inventive composition for forming an organic film has a characteristic of being excellent in etching resistance when etching these substrates to be processed.

Note that the body to be processed (substrate to be processed) is not particularly limited, and examples include: substrates made of Si, α-Si, p-Si, $SiO_2$, SiN, SiON, W, TiN, Al, or the like; the substrate coated with a layer to be processed; etc. Examples of the layer to be processed include: various Low-k films made of Si, $SiO_2$, SiON, SiN, p-Si, α-Si, W, W—Si, Al, Cu, Al—Si, or the like; and stopper films thereof. Generally, the layer can be formed to have a thickness of 50 to 10,000 nm, in particular, 100 to 5,000 nm. Note that when the layer to be processed is formed, the substrate and the layer to be processed are formed from different materials.

As the body to be processed, it is preferable to use a semiconductor device substrate or the semiconductor device substrate coated with any of a metal film, a metal carbide film, a metal oxide film, a metal nitride film, a metal oxycarbide film, or a metal oxynitride film. More specifically, examples of the substrate which may be used include, but are not particularly limited to: substrates made of Si, α-Si, p-Si, $SiO_2$, SiN, SiON, W, TiN, Al, or the like; and these substrates coated with the above-described metal film or the like as a layer to be processed.

Examples of the layer to be processed which may be used include various Low-k films made of Si, $SiO_2$, SiON, SiN, p-Si, α-Si, W, W—Si, Al, Cu, Al—Si, or the like, and stopper films thereof. The layer can be formed to have a thickness of generally 50 to 10,000 nm, particularly 100 to 5,000 nm. Note that when the layer to be processed is formed, the substrate and the layer to be processed are formed from different materials.

Note that the metal constituting the body to be processed is preferably silicon, titanium, tungsten, hafnium, zirconium, chromium, germanium, copper, silver, gold, aluminum, indium, gallium, arsenic, palladium, iron, tantalum, iridium, cobalt, manganese, molybdenum, ruthenium, or an alloy thereof.

Furthermore, as the body to be processed, a body to be processed having a structure or a step with a height of 30 nm or more is preferably used.

Hereinbelow, an example of the 3-layer resist process will be specifically described with reference to FIG. 1. As shown in FIG. 1 (A), in the 3-layer resist process, an organic film 3 is formed by using the inventive composition for forming an organic film on a layer 2 to be processed that has been stacked on a substrate 1. Then, a silicon-containing resist middle layer film 4 is formed, and a resist upper layer film 5 is formed thereon.

Next, as shown in FIG. 1 (B), a predetermined portion 6 of the resist upper layer film 5 is exposed to light, followed by PEB and development to form a resist pattern 5a (FIG. 1 (C)). While using the obtained resist pattern 5a as a mask, the silicon-containing resist middle layer film 4 is etched with a CF-based gas. Thereby, a silicon-containing resist middle layer film pattern 4a is formed (FIG. 1 (D)). After the resist pattern 5a is removed, the organic film 3 is etched with oxygen plasma while using the obtained silicon-containing resist middle layer film pattern 4a as a mask. Thereby, an organic film pattern 3a is formed (FIG. 1 (E)). Further, after the silicon-containing resist middle layer film pattern 4a is removed, the layer 2 to be processed is etched while using the organic film pattern 3a as a mask. Thus, a pattern 2a is formed (FIG. 1 (F)).

When an inorganic hard mask is used, the silicon-containing resist middle layer film 4 is the inorganic hard mask, and when a BARC is formed, the BARC layer is disposed between the silicon-containing resist middle layer film 4 and the resist upper layer film 5. The etching of the BARC may be performed continuously before the etching of the silicon-containing resist middle layer film 4. Alternatively, after the BARC is etched alone, the etching apparatus is changed, for example, and then the etching of the silicon-containing resist middle layer film 4 may be performed.

As described above, the inventive patterning processes make it possible to precisely form a fine pattern in a substrate to be processed in the multilayer resist processes.

Particularly, in the present invention, an organic solvent and, as a material for forming an organic film, a composition for forming an organic film containing a compound shown by the general formula (1) and/or a polymer having a repeating unit shown by the general formula (3) are used. Therefore, a fine pattern can be formed in a body to be processed with even higher precision in a multilayer resist process.

EXAMPLE

Hereinafter, the present invention will be more specifically described with reference to Synthesis Examples, Examples, and Comparative Examples. However, the present invention is not limited thereto. Note that, with respect to molecular weight and dispersity, weight-average molecular weight (Mw) and number-average molecular weight (Mn) were measured by gel permeation chromatography (GPC) using tetrahydrofuran as an eluent in terms of polystyrene, and dispersity (Mw/Mn) was calculated therefrom.

[Synthesis Example] Synthesis of Compounds and Polymers contained in Materials for Forming Organic Film Compounds (A1) to (A16) and polymers (A17) to (A19) contained in materials for forming an organic film and polymers (R1) to (R3) used in the Comparative Examples were synthesized using compounds (B1) to (B7) as phenols or naphthols shown below, compounds (C1) to (C3) as a bis(indole-2,3-dione), and compounds (D1) and (D2) as an aldehyde. Note that as (D1), a 37% aqueous solution was used.

Phenols or Naphthols:

(B1)

(B2)

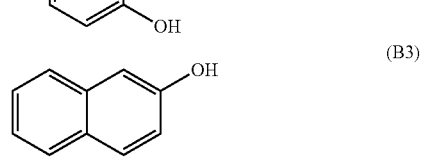

(B3)

-continued

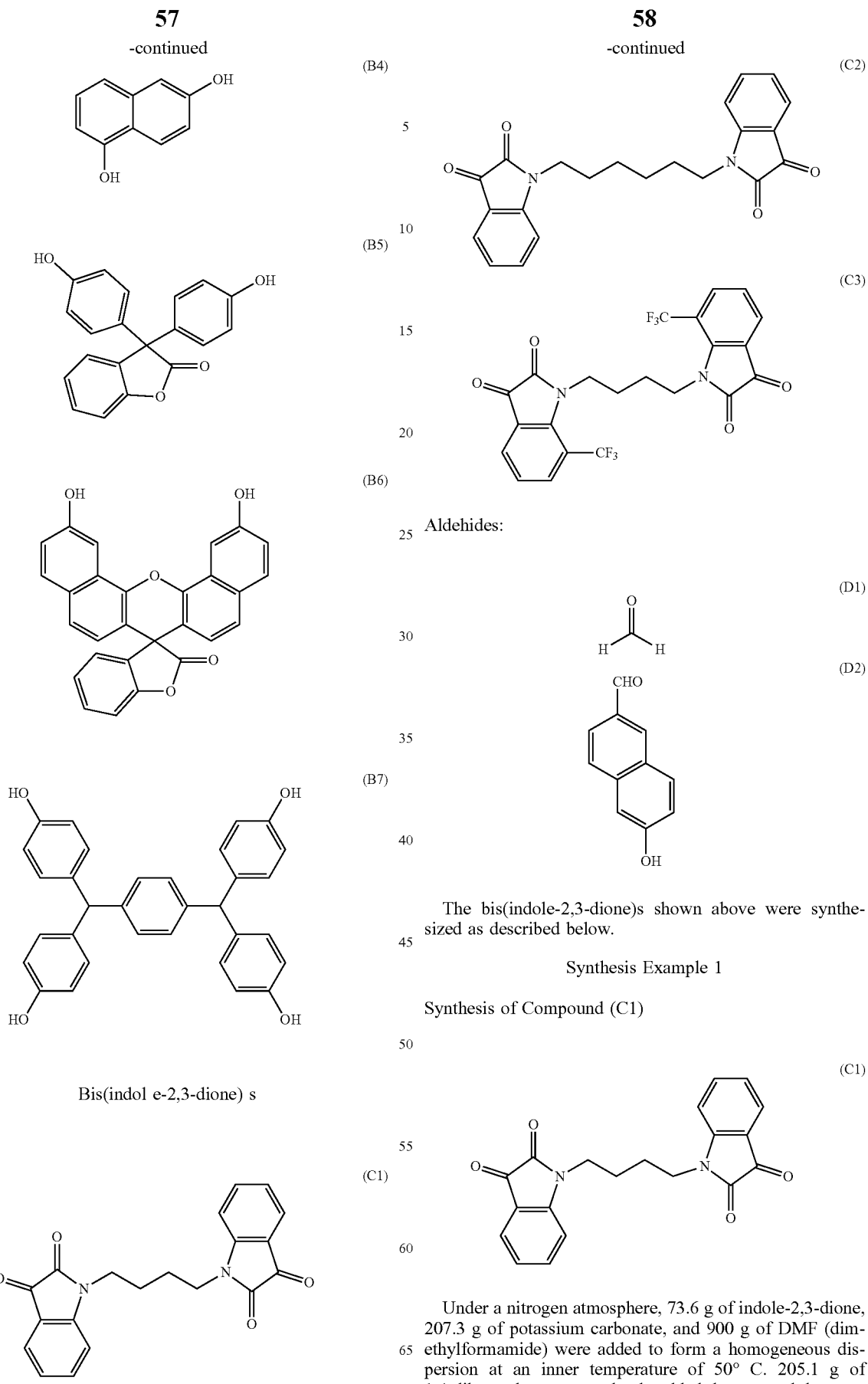

Bis(indol e-2,3-dione) s

Aldehides:

The bis(indole-2,3-dione)s shown above were synthesized as described below.

Synthesis Example 1

Synthesis of Compound (C1)

Under a nitrogen atmosphere, 73.6 g of indole-2,3-dione, 207.3 g of potassium carbonate, and 900 g of DMF (dimethylformamide) were added to form a homogeneous dispersion at an inner temperature of 50° C. 205.1 g of 1,4-dibromobutane was slowly added thereto, and the reaction was allowed to proceed at an inner temperature of 50° C. for 24 hours. After completion of the reaction, the reaction solution was poured into 5000 ml of pure water to precipitate a crystal. The precipitated crystal was separated by filtration, washed three times with 1000 ml of pure water, then washed twice with 1000 ml of methanol, and collected. The collected crystal was vacuum dried at 70° C. to obtain compound (C1).

Synthesis Example 2

Synthesis of Compound (C2)

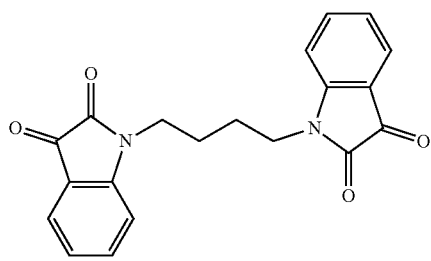

(C2)

Under a nitrogen atmosphere, 73.6 g of indole-2,3-dione, 207.3 g of potassium carbonate, and 900 g of DMF were added to form a homogeneous dispersion at an inner temperature of 50° C. 231.8 g of 1,6-dibromohexane was slowly added thereto, and the reaction was allowed to proceed at an inner temperature of 50° C. for 24 hours. After completion of the reaction, the reaction solution was poured into 5000 ml of pure water to precipitate a crystal. The precipitated crystal was separated by filtration, washed three times with 1000 ml of pure water, then washed twice with 1000 ml of methanol, and collected. The collected crystal was vacuum dried at 70° C. to obtain compound (C2).

Synthesis Example 3

Synthesis of Compound (C3)

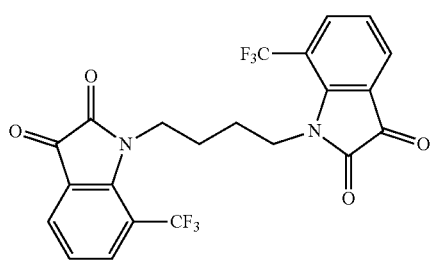

(C3)

Under a nitrogen atmosphere, 107.6 g of 7-(trifluoromethyl)indole-2,3-dione, 207.3 g of potassium carbonate, and 900 g of DMF were added to form a homogeneous dispersion at an inner temperature of 50° C. 205.1 g of 1,4-dibromobutane was slowly added thereto, and the reaction was allowed to proceed at an inner temperature of 50° C. for 24 hours. After completion of the reaction, the reaction solution was poured into 6000 ml of pure water to precipitate a crystal. The precipitated crystal was separated by filtration, washed three times with 1000 ml of pure water, then washed twice with 1000 ml of methanol, and collected. The collected crystal was vacuum dried at 70° C. to obtain compound (C3).

The compounds (A1) to (A16), polymers (A17) to (A19), and polymers (R1) to (R3) used in the Comparative Examples were synthesized in the following manner.

Synthesis Example 4

Synthesis of Compound (A1)

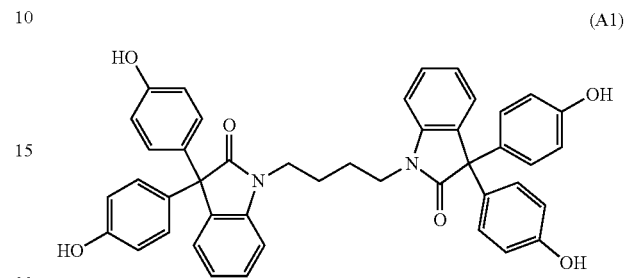

(A1)

Under a nitrogen atmosphere, 11.9 g of the compound (B1), 10.0 g of the compound (C1), 8.3 g of methanesulfonic acid, and 100 g of methylene chloride were added to form a homogeneous dispersion at room temperature. Subsequently, 0.3 g of 3-mercaptopropionic acid was added thereto, and the reaction was allowed to proceed at room temperature for 8 hours. After completion of the reaction, 200 ml of MIBK (methyl isobutyl ketone) was added at room temperature, the resultant was washed six times with 100 ml of pure water, and the organic layer was evaporated under reduced pressure to dry up. To the residue, 60 g of MIBK was added to form a homogeneous solution. Thereafter, a crystal was precipitated in 300 g of IPE (diisopropyl ether). The precipitated crystal was separated by filtration, washed twice with 100 g of IPE, and collected. The collected crystal was vacuum dried at 70° C. to obtain compound (A1).

When the weight-average molecular weight (Mw) and dispersity (Mw/Mn) were measured by GPC, the following results were obtained.

(A1): Mw=740, Mw/Mn=1.02

Synthesis Example 5

Synthesis of Compound (A2)

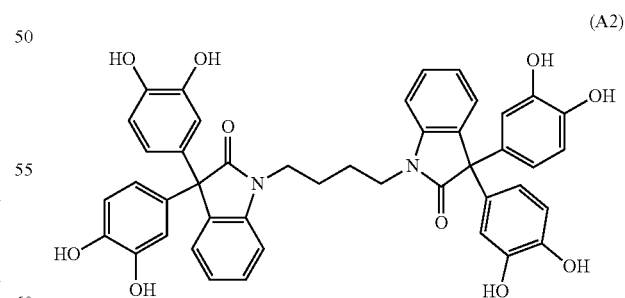

(A2)

Under a nitrogen atmosphere, 13.9 g of the compound (B2), 10.0 g of the compound (C1), 8.3 g of methanesulfonic acid, and 100 g of methylene chloride were added to form a homogeneous dispersion at room temperature. Subsequently, 0.3 g of 3-mercaptopropionic acid was added thereto, and the reaction was allowed to proceed at room temperature for 8 hours. After completion of the reaction, the resultant was cooled in an ice bath to precipitate a crystal. After adding 300 g of IPE and dispersing the crystal in the IPE by stirring, the precipitated crystal was separated by filtration, washed five times with 100 g of IPE, and collected. The collected crystal was vacuum dried at 70° C. to obtain compound (A2).

When the weight-average molecular weight (Mw) and dispersity (Mw/Mn) were measured by GPC, the following results were obtained.

(A2): Mw=820, Mw/Mn=1.01

Synthesis Example 6

Synthesis of Compound (A3)

tion was allowed to proceed at room temperature for 8 hours. After completion of the reaction, 200 ml of MIBK was added, the resultant was washed six times with 100 ml of pure water, and the organic layer was evaporated under reduced pressure to dry up. To the residue, 60 g of MIBK was added to form a homogeneous solution. Thereafter, a crystal was precipitated in 300 g of IPE. The precipitated crystal was separated by filtration, washed twice with 100 g of IPE, and collected. The collected crystal was vacuum dried at 70° C. to obtain compound (A3).

When the weight-average molecular weight (Mw) and dispersity (Mw/Mn) were measured by GPC, the following results were obtained.

(A3): Mw=910, Mw/Mn=1.03

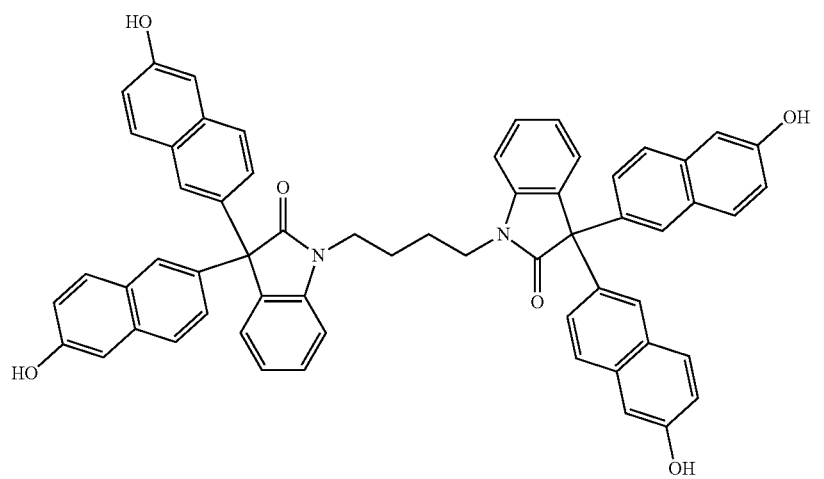

(A3)

Under a nitrogen atmosphere, 18.2 g of the compound (B3), 10.0 g of the compound (C1), and 120 g of methylene chloride were added to form a homogeneous dispersion at room temperature. Subsequently, 12.9 g of trifluoromethanesulfonic acid was slowly added dropwise, and the reac- Synthesis Example 7

Synthesis of Compound (A4)

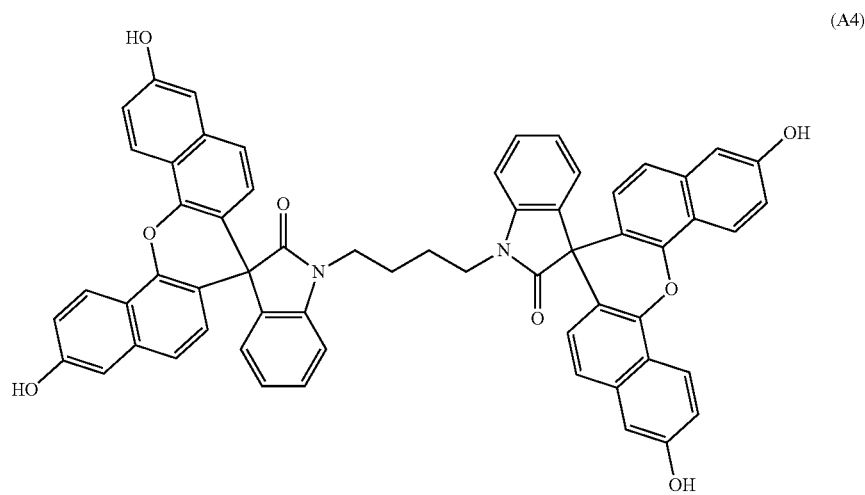 [SMILES: O=C1N(CCCCN2C(=O)C3(c4ccccc42)c2ccc4cc(O)ccc4c2Oc2c3ccc3cc(O)ccc23)c2ccccc2C12c1ccc3cc(O)ccc3c1Oc1c2ccc2cc(O)ccc12]

(A4)

Under a nitrogen atmosphere, 20.2 g of the compound (B4), 10.0 g of the compound (C1), and 120 g of methylene chloride was added to form a homogeneous dispersion at room temperature. Subsequently, 12.9 g of trifluoromethanesulfonic acid was slowly added dropwise, and the reaction was allowed to proceed at room temperature for 8 hours. After completion of the reaction, 200 ml of MIBK was added, the resultant was washed six times with 100 ml of pure water, and the organic layer was evaporated under reduced pressure to dry up. To the residue, 80 g of MIBK was added to form a homogeneous solution. Thereafter, a crystal was precipitated in 300 g of IPE. The precipitated crystal was separated by filtration, washed twice with 100 g of IPE, and collected. The collected crystal was vacuum dried at 70° C. to obtain compound (A4).

When the weight-average molecular weight (MW) and dispersity (Mw/Mn) were measured by GPC, the following results were obtained.

(A4): Mw=960, Mw/Mn=1.05

Synthesis Example 8

Synthesis of Compound (A5)

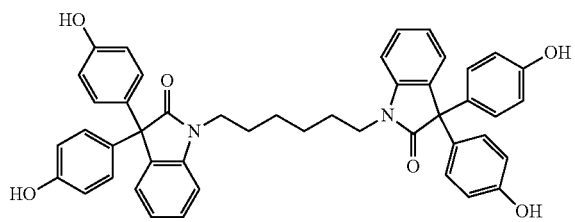

(A5)

Under a nitrogen atmosphere, 11.0 g of the compound (B1), 10.0 g of the compound (C2), 7.7 g of methanesulfonic acid, and 100 g of methylene chloride were added to form a homogeneous dispersion at room temperature. Subsequently, 0.3 g of 3-mercaptopropionic acid was added thereto, and the reaction was allowed to proceed at room temperature for 8 hours. After completion of the reaction, 200 ml of MIBK was added, the resultant was washed six times with 100 ml of pure water, and the organic layer was evaporated under reduced pressure to dry up. To the residue, 60 g of MIBK was added to form a homogeneous solution. Thereafter, a crystal was precipitated in 300 g of IPE. The precipitated crystal was separated by filtration, washed twice with 100 g of IPE, and collected. The collected crystal was vacuum dried at 70° C. to obtain compound (A5).

When the weight-average molecular weight (Mw) and dispersity (Mw/Mn) were measured by GPC, the following results were obtained.

(A5): Mw=760, Mw/Mn=1.02

Synthesis Example 9

Synthesis of Compound (A6)

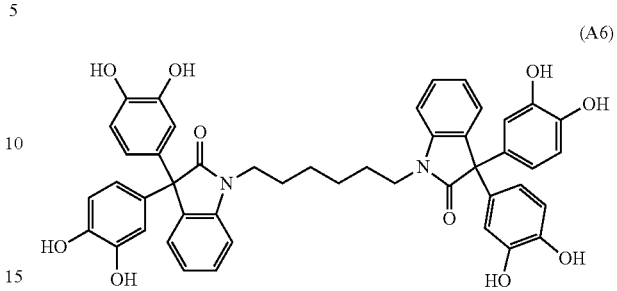

(A6)

Under a nitrogen atmosphere, 12.9 g of the compound (B2), 10.0 g of the compound (C2), 7.7 g of methanesulfonic acid, and 100 g of methylene chloride was added to form a homogeneous dispersion at room temperature. Subsequently, 0.3 g of 3-mercaptopropionic acid was added thereto, and the reaction was allowed to proceed at room temperature for 8 hours. After completion of the reaction, the resultant was cooled in an ice bath to precipitate a crystal. After adding 300 g of IPE and dispersing the crystal in the IPE by stirring, the precipitated crystal was separated by filtration, washed five times with 100 g of IPE, and collected. The collected crystal was vacuum dried at 70° C. to obtain compound (A6).

When the weight-average molecular weight (Mw) and dispersity (Mw/Mn) were measured by GPC, the following results were obtained.

(A6): Mw=820, Mw/Mn=1.01

Synthesis Example 10

Synthesis of Compound (A7)

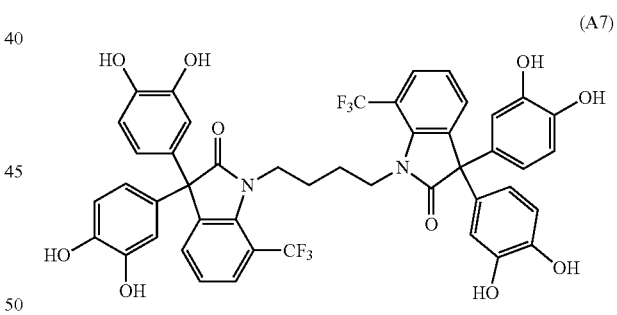

(A7)

Under a nitrogen atmosphere, 10.0 g of the compound (B2), 10.0 g of the compound (C3), 6.0 g of methanesulfonic acid, and 100 g of methylene chloride were added to form a homogeneous dispersion at room temperature. Subsequently, 0.2 g of 3-mercaptopropionic acid was added, and the reaction was allowed to proceed at room temperature for 8 hours. After completion of the reaction, 100 ml of MIBK and 100 ml of THF were added thereto, the resultant was washed six times with 100 ml of pure water, and the organic layer was evaporated under reduced pressure to dry up. To the residue, 60 g of THF was added to form a homogeneous solution. Thereafter, a crystal was precipitated in 300 g of hexane. The precipitated crystal was separated by filtration, washed twice with 100 g of hexane, and collected. The collected crystal was vacuum dried at 70° C. to obtain compound (A7).

When the weight-average molecular weight (Mw) and dispersity (Mw/Mn) were measured by GPC, the following results were obtained.

(A7): Mw=890, Mw/Mn=1.01

Synthesis Example 11

Synthesis of Compound (A8)

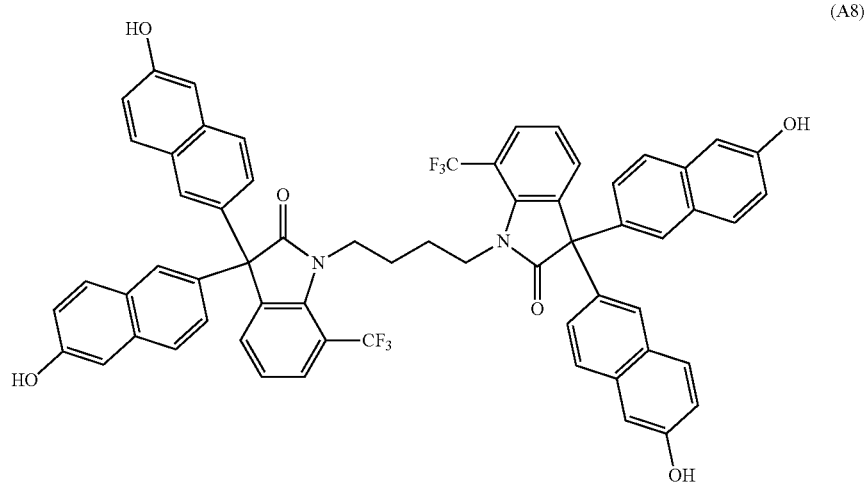 [SMILES: O=C1N(CCCCN2C(=O)C(c3ccc4cc(O)ccc4c3)(c3ccc4cc(O)ccc4c3)c3cccc(C(F)(F)F)c32)c2c(C(F)(F)F)cccc2C1(c1ccc2cc(O)ccc2c1)c1ccc2cc(O)ccc2c1]

(A8)

Under a nitrogen atmosphere, 13.1 g of the compound (B3), 10.0 g of the compound (C3), and 100 g of methylene chloride were added to form a homogeneous dispersion at room temperature. Subsequently, 9.3 g of trifluoromethanesulfonic acid was slowly added dropwise, and the reaction was allowed to proceed at room temperature for 8 hours. After completion of the reaction, 200 ml of MIBK was added, the resultant was washed six times with 100 ml of pure water, and the organic layer was evaporated under reduced pressure to dry up. To the residue, 60 g of THF was added to form a homogeneous solution. Thereafter, a crystal was precipitated in 300 g of IPE. The precipitated crystal was separated by filtration, washed twice with 100 g of IPE, and collected. The collected crystal was vacuum dried at 70° C. to obtain compound (A8).

When the weight-average molecular weight (Mw) and dispersity (Mw/Mn) were measured by GPC, the following results were obtained.

(A8): Mw=1030, Mw/Mn=1.04

Synthesis Example 12

Synthesis of Compound (A9)

Under a nitrogen atmosphere, 10.0 g of the compound (A1), 12.0 g of potassium carbonate, and 60 g of DMF were added to form a homogeneous dispersion at an inner temperature of 50° C. 8.6 g of propargyl bromide was slowly added thereto, and the reaction was allowed to proceed at an inner temperature of 50° C. for 16 hours. After completion of the reaction, 100 ml of MIBK was added, the resultant was washed six times with 50 ml of pure water, and the organic layer was evaporated under reduced pressure to dry up. To the residue, 40 g of MIBK was added to form a homogeneous solution. Thereafter, a crystal was precipitated in 200 g of MeOH (methanol). The precipitated crystal was separated by filtration, washed twice with 100 g of MeOH, and collected. The collected crystal was vacuum dried at 70° C. to obtain compound (A9).

When the weight-average molecular weight (Mw) and dispersity (Mw/Mn) were measured by GPC, the following results were obtained.

(A9): Mw=880, Mw/Mn=1.02

Synthesis Example 13

Synthesis of Compound (A10)

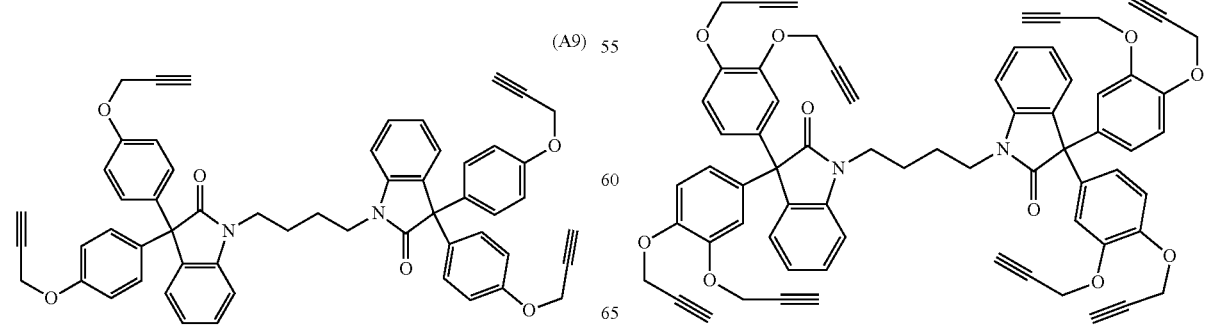

(A9)

(A10)

Under a nitrogen atmosphere, 10.0 g of the compound (A2), 22.0 g of potassium carbonate, and 80 g of DMF were added to form a homogeneous dispersion at an inner temperature of 50° C. 15.8 g of propargyl bromide was slowly added thereto, and the reaction was allowed to proceed at an inner temperature of 50° C. for 24 hours. After completion of the reaction, 100 ml of MIBK was added, the resultant was washed six times with 50 ml of pure water, and the organic layer was evaporated under reduced pressure to dry up. To the residue, 40 g of MIBK was added to form a homogeneous solution. Thereafter, a crystal was precipitated in 200 g of MeOH (methanol). The precipitated crystal was separated by filtration, washed twice with 100 g of MeOH, and collected. The collected crystal was vacuum dried at 70° C. to obtain compound (A10).

When the weight-average molecular weight (Mw) and dispersity (Mw/Mn) were measured by GPC, the following results were obtained.

(A10): Mw=1060, Mw/Mn=1.03

Synthesis Example 14

Synthesis of Compound (A11)

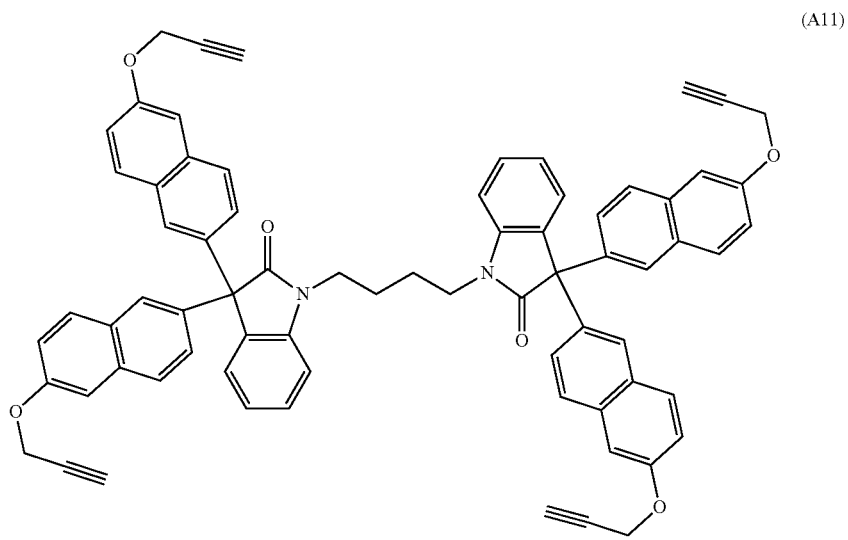 [SMILES: C#CCOc1ccc2cc(C3(c4ccc5cc(OCC#C)ccc5c4)C(=O)N(CCCCN4C(=O)C(c5ccc6cc(OCC#C)ccc6c5)(c5ccc6cc(OCC#C)ccc6c5)c5ccccc54)c4ccccc43)ccc2c1]

(A11)

Under a nitrogen atmosphere, 10.0 g of the compound (A3), 9.3 g of potassium carbonate, and 40 g of DMF were added to form a homogeneous dispersion at an inner temperature of 50° C. 6.7 g of propargyl bromide was slowly added thereto, and the reaction was allowed to proceed at an inner temperature of 50° C. for 16 hours. After completion of the reaction, 100 ml of MIBK was added, the resultant was washed six times with 50 ml of pure water, and the organic layer was evaporated under reduced pressure to dry up. To the residue, 40 g of MIBK was added to form a homogeneous solution. Thereafter, a crystal was precipitated in 200 g of MeOH (methanol). The precipitated crystal was separated by filtration, washed twice with 100 g of MeOH, and collected. The collected crystal was vacuum dried at 70° C. to obtain compound (A11).

When the weight-average molecular weight (Mw) and dispersity (Mw/Mn) were measured by GPC, the following results were obtained.

(A11): Mw=1080, Mw/Mn=1.05

Synthesis Example 15

Synthesis of Compound (A12)

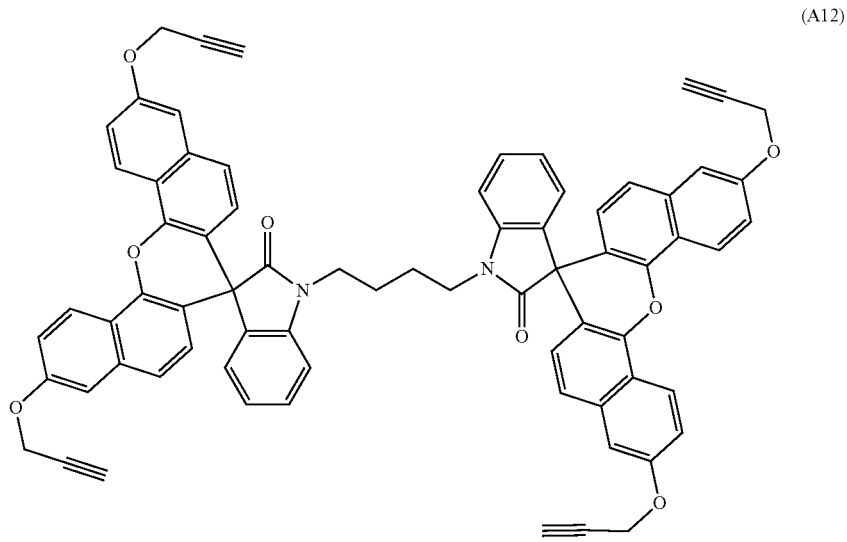 [SMILES: C#CCOc1ccc2c3c(ccc2c1)C1(C(=O)N(CCCCN2C(=O)C4(c5ccccc52)c2ccc5cc(OCC#C)ccc5c2Oc2c4ccc4cc(OCC#C)ccc24)c2ccccc21)c1ccc2cc(OCC#C)ccc2c1O3]

Under a nitrogen atmosphere, 10.0 g of the compound (A4), 9.0 g of potassium carbonate, and 40 g of DMF were added to form a homogeneous dispersion at an inner temperature of 50° C. 6.5 g of propargyl bromide was slowly added thereto, and the reaction was allowed to proceed at an inner temperature of 50° C. for 16 hours. After completion of the reaction, 100 ml of MIBK was added, the resultant was washed six times with 50 ml of pure water, and the organic layer was evaporated under reduced pressure to dry up. To the residue, 40 g of MIBK was added to form a homogeneous solution. Thereafter, a crystal was precipitated in 200 g of MeOH (methanol). The precipitated crystal was separated by filtration, washed twice with 100 g of MeOH, and collected. The collected crystal was vacuum dried at 70° C. to obtain compound (A12).

When the weight-average molecular weight (Mw) and dispersity (Mw/Mn) were measured by GPC, the following results were obtained.

(A12): Mw=1110, Mw/Mn=1.05

Synthesis Example 16

Synthesis of Compound (A13)

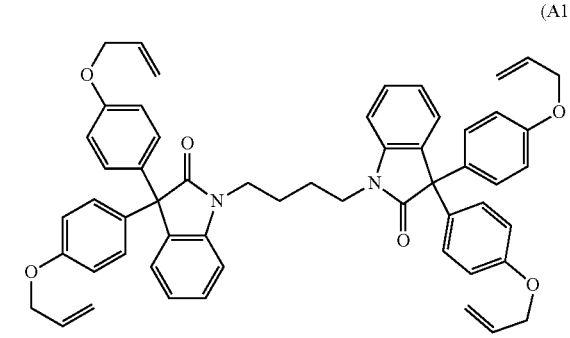

Under a nitrogen atmosphere, 10.0 g of the compound (A5), 11.6 g of potassium carbonate, and 60 g of DMF were added to form a homogeneous dispersion at an inner temperature of 50° C. 8.6 g of allyl bromide was slowly added thereto, and the reaction was allowed to proceed at an inner temperature of 50° C. for 16 hours. After completion of the reaction, 100 ml of MIBK was added, the resultant was washed six times with 50 ml of pure water, and the organic layer was evaporated under reduced pressure to dry up. To the residue, 40 g of MIBK was added to form a homogeneous solution. Thereafter, a crystal was precipitated in 200 g of MeOH (methanol). The precipitated crystal was separated by filtration, washed twice with 100 g of MeOH, and collected. The collected crystal was vacuum dried at 70° C. to obtain compound (A13).

When the weight-average molecular weight (Mw) and dispersity (Mw/Mn) were measured by GPC, the following results were obtained.

(A13): Mw=900, Mw/Mn=1.02

Synthesis Example 17

Synthesis of Compound (A14)

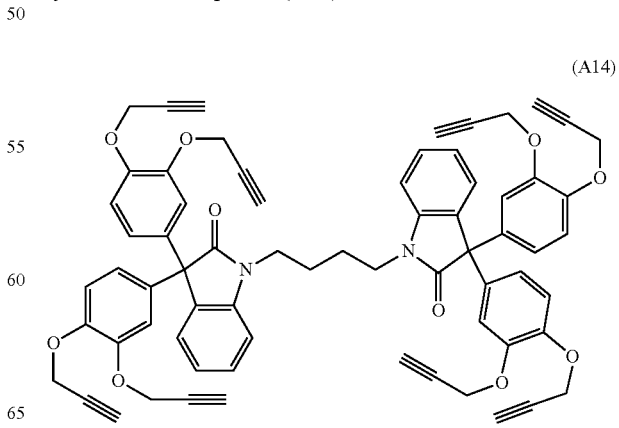

Under a nitrogen atmosphere, 10.0 g of the compound (A6), 21.4 g of potassium carbonate, and 80 g of DMF were added to form a homogeneous dispersion at an inner temperature of 50° C. 15.2 g of propargyl bromide was slowly added thereto, and the reaction was allowed to proceed at an inner temperature of 50° C. for 24 hours. After completion of the reaction, 100 ml of MIBK was added, the resultant was washed six times with 50 ml of pure water, and the organic layer was evaporated under reduced pressure to dry up. To the residue, 40 g of MIBK was added to form a homogeneous solution. Thereafter, a crystal was precipitated in 200 g of MeOH (methanol). The precipitated crystal was separated by filtration, washed twice with 100 g of MeOH, and collected. The collected crystal was vacuum dried at 70° C. to obtain compound (A14).

When the weight-average molecular weight (Mw) and dispersity (Mw/Mn) were measured by GPC, the following results were obtained.

(A14): Mw=1130, Mw/Mn=1.03

Synthesis Example 18

Synthesis of Compound (A15)

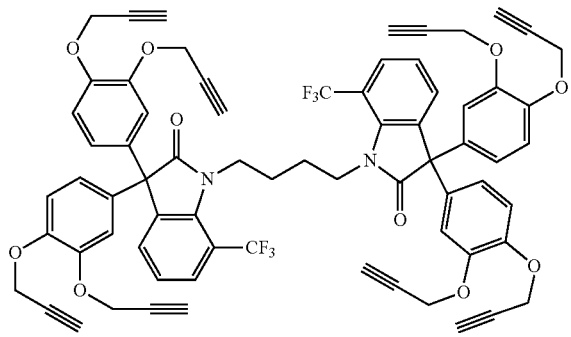

(A15)

Under a nitrogen atmosphere, 10.0 g of the compound (A7), 18.7 g of potassium carbonate, and 80 g of DMF were added to form a homogeneous dispersion at an inner temperature of 50° C. 13.3 g of propargyl bromide was slowly added thereto, and the reaction was allowed to proceed at an inner temperature of 50° C. for 24 hours. After completion of the reaction, 100 ml of MIBK was added, the resultant was washed six times with 50 ml of pure water, and the organic layer was evaporated under reduced pressure to dry up. To the residue, 40 g of MIBK was added to form a homogeneous solution. Thereafter, a crystal was precipitated in 200 g of MeOH (methanol). The precipitated crystal was separated by filtration, washed twice with 100 g of MeOH, and collected. The collected crystal was vacuum dried at 70° C. to obtain compound (A15).

When the weight-average molecular weight (Mw) and dispersity (Mw/Mn) were measured by GPC, the following results were obtained.

(A15): Mw=1130, Mw/Mn=1.03

Synthesis Example 19

Synthesis of Compound (A16)

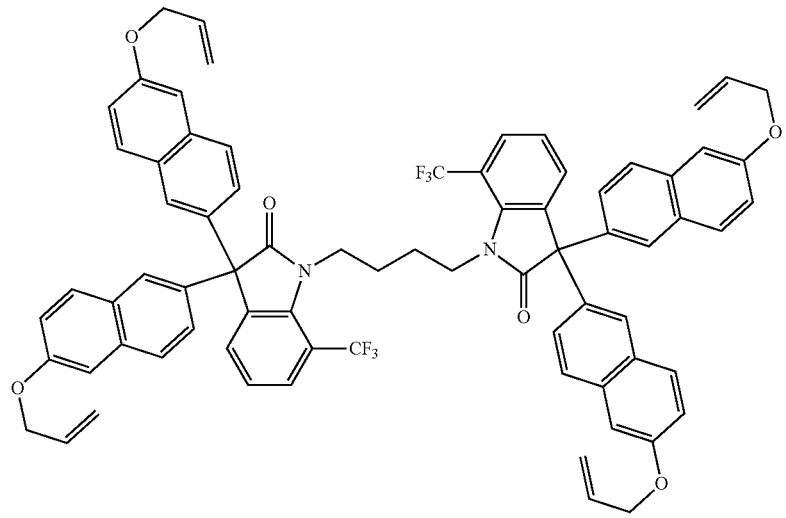

(A16)

Under a nitrogen atmosphere, 10.0 g of the compound (A8), 8.1 g of potassium carbonate, and 60 g of DMF were added to form a homogeneous dispersion at an inner temperature of 50° C. 5.9 g of allyl bromide was slowly added thereto, and the reaction was allowed to proceed at an inner temperature of 50° C. for 16 hours. After completion of the reaction, 100 ml of MIBK was added, the resultant was washed six times with 50 ml of pure water, and the organic layer was evaporated under reduced pressure to dry up. To the residue, 40 g of MIBK was added to form a homogeneous solution. Thereafter, a crystal was precipitated in 200 g of MeOH (methanol). The precipitated crystal was separated by filtration, washed twice with 100 g of MeOH, and collected. The collected crystal was vacuum dried at 70° C. to obtain compound (A16).

When the weight-average molecular weight (Mw) and dispersity (Mw/Mn) were measured by GPC, the following results were obtained.

(A16): Mw=1220, Mw/Mn=1.05

Synthesis Example 20

Synthesis of Polymer (A17)

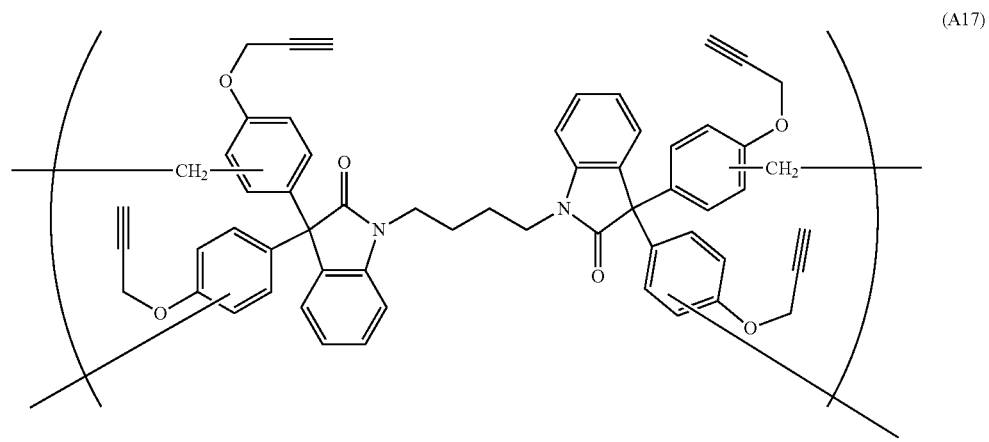

(A17)

Under a nitrogen atmosphere, 5.0 g of the compound (A9), 0.19 g of the compound (D1), and 50 g of 1,2-dichloroethane were added to form a homogeneous solution at an inner temperature of 50° C. 0.5 g of methanesulfonic acid was slowly added thereto, and the reaction was allowed to proceed at an inner temperature of 50° C. for 8 hours. After completion of the reaction, the resulting product was cooled to room temperature, 100 ml of MIBK was added thereto, the resultant was washed six times with 50 ml of pure water, and the organic layer was evaporated under reduced pressure to dry up. To the residue, 20 g of THF was added to form a homogeneous solution. Thereafter, a crystal was precipitated in 100 g of hexane. The precipitated crystal was separated by filtration, washed twice with 50 g of hexane, and collected. The collected crystal was vacuum dried at 70° C. to obtain polymer (A17). When the weight-average molecular weight (Mw) and dispersity (Mw/Mn) were measured by GPC, the following results were obtained.

(A17): Mw=2700, Mw/Mn=1.58

Synthesis Example 21

Synthesis of Polymer (A18)

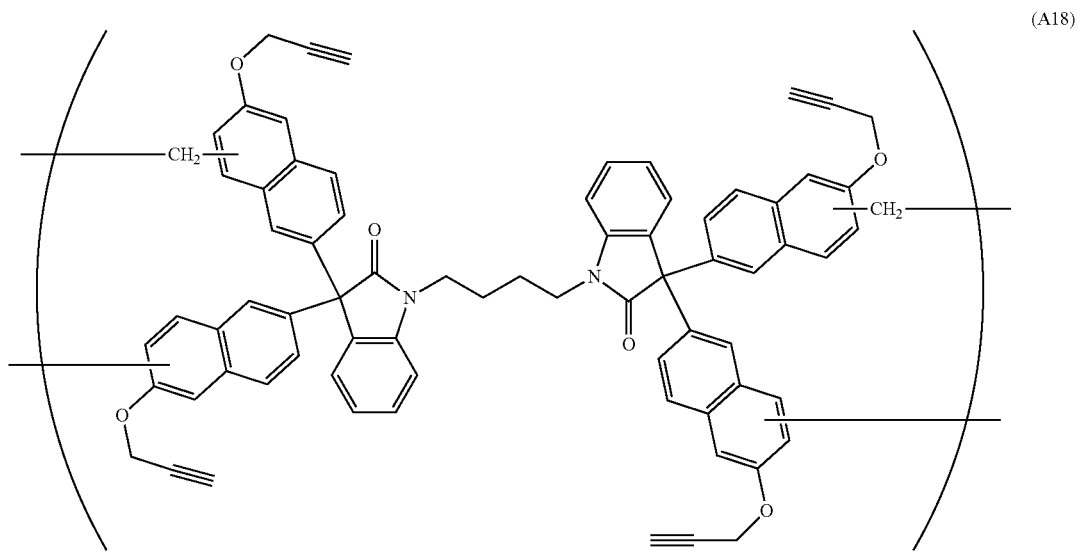

Under a nitrogen atmosphere, 5.0 g of the compound (A11), 0.12 g of the compound (D1), and 50 g of 1,2-dichloroethane were added to form a homogeneous solution at an inner temperature of 50° C. 0.5 g of methanesulfonic acid was slowly added thereto, and the reaction was allowed to proceed at an inner temperature of 50° C. for 8 hours. After completion of the reaction, the resulting product was cooled to room temperature, 100 ml of MIBK was added thereto, the resultant was washed six times with 50 ml of pure water, and the organic layer was evaporated under reduced pressure to dry up. To the residue, 20 g of THF was added to form a homogeneous solution. Thereafter, a crystal was precipitated in 100 g of hexane. The precipitated crystal was separated by filtration, washed twice with 50 g of hexane, and collected. The collected crystal was vacuum dried at 70° C. to obtain polymer (A18). When the weight-average molecular weight (Mw) and dispersity (Mw/Mn) were measured by GPC, the following results were obtained.

(A18): Mw=3300, Mw/Mn=1.45

Synthesis Example 22

Synthesis of Polymer (A19)

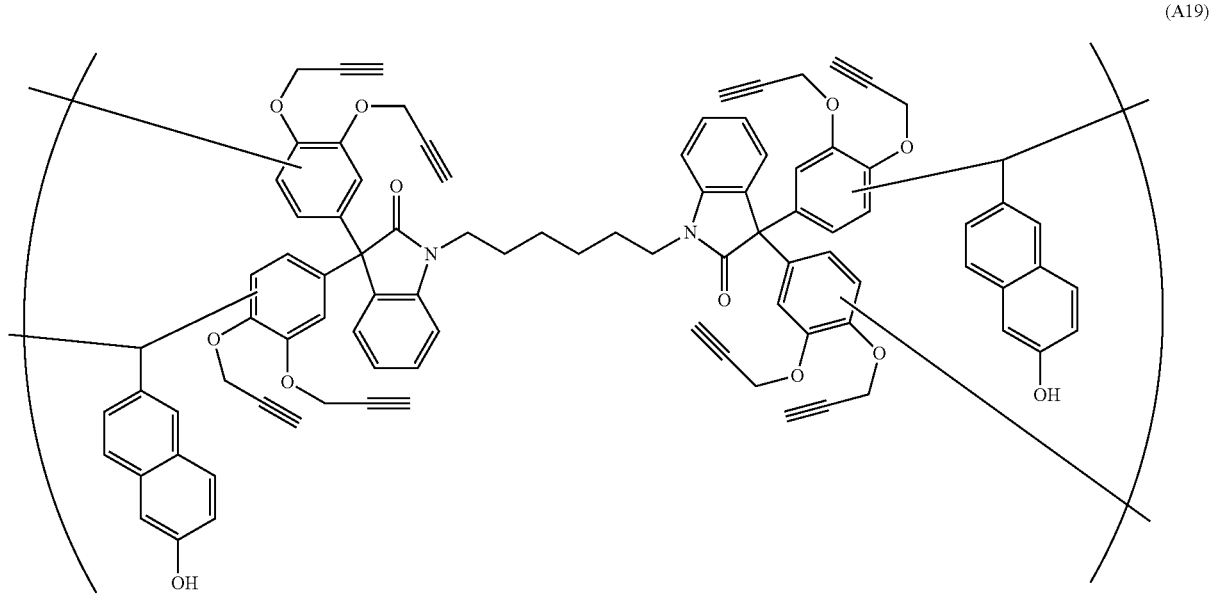

Under a nitrogen atmosphere, 5.0 g of the compound (A14), 0.29 g of the compound (D2), and 50 g of 1,2-dichloroethane were added to form a homogeneous solution at an inner temperature of 50° C. 0.5 g of methanesulfonic acid was slowly added thereto, and the reaction was allowed to proceed at an inner temperature of 50° C. for 8 hours. After completion of the reaction, the resulting product was cooled to room temperature, 100 ml of MIBK was added thereto, the resultant was washed six times with 50 ml of pure water, and the organic layer was evaporated under reduced pressure to dry up. To the residue, 20 q of THF was added to form a homogeneous solution. Thereafter, a crystal was precipitated in 100 g of hexane. The precipitated crystal was separated by filtration, washed twice with 50 g of hexane, and collected. The collected crystal was vacuum dried at 70° C. to obtain polymer (A19). When the weight-average molecular weight (Mw) and dispersity (Mw/Mn) were measured by GPC, the following results were obtained.

(A19): Mw=3600, Mw/Mn=1.59

Synthesis Example 23

Synthesis of polymer (R1) for Comparative Example

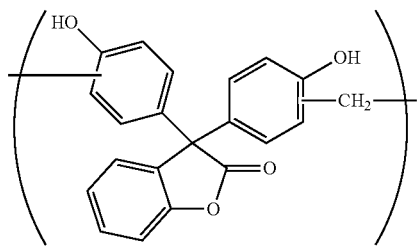
(R1)

Under a nitrogen atmosphere, 31.8 g of the compound (B5), 4.9 g of the compound (D1), 5.0 g of oxalic acid, and 50 g of dioxane were added, and the reaction was allowed to proceed at an inner temperature of 100° C. for 24 hours. After completion of the reaction, the resulting product was cooled to room temperature, 500 ml of MIBK was added, and the resultant was washed six times with 100 ml of pure water. The organic layer was collected, and at an inner temperature of 150° C., the pressure was reduced to 2 mmHg to remove the water and solvent under the reduced pressure. Thus, polymer (R1) used in the Comparative Examples was obtained.

When the weight-average molecular weight (Mw) and dispersity (Mw/Mn) were measured by GPC, the following results were obtained.

(R1): Mw=3200, Mw/Mn=4.88

Synthesis Example 24

Synthesis of polymer (R2) for Comparative Example

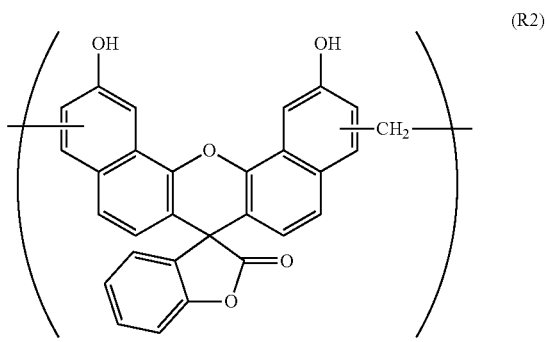
(R2)

Under a nitrogen atmosphere, 42.3 g of the compound (B6), 5.7 g of the compound (D1), 5.0 g of oxalic acid, and 60 g of dioxane were added, and the reaction was allowed to proceed at an inner temperature of 100° C. for 24 hours. After completion of the reaction, the resulting product was cooled to room temperature, 500 ml of MIBK was added, and the resultant was washed six times with 100 ml of pure water. The organic layer was collected, and at an inner temperature of 150° C., the pressure was reduced to 2 mmHg to remove the water and solvent under the reduced pressure. Thus, polymer (R2) used in the Comparative Examples was obtained.

When the weight-average molecular weight (Mw) and dispersity (Mw/Mn) were measured by GPC, the following results were obtained.

(R2): Mw=2600, Mw/Mn=3.55

Synthesis Example 25

Synthesis of polymer (R3) for Comparative Example

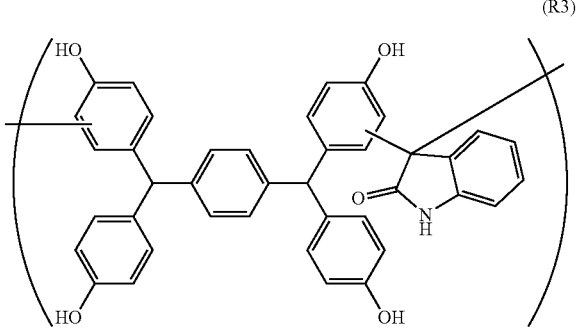
(R3)

Under a nitrogen atmosphere, 3.1 g of indole-2,3-dione, 10.0 g of the compound (B7), 3.0 g of methanesulfonic acid, 16.1 g of propylene glycol monomethyl ether, and 3.4 g of 3-mercaptopropionic acid were added, heated to 140° C., and the reaction was allowed to proceed under reflux for 4 hours. After completion of the reaction, the reaction solution was added dropwise to 200 g of methanol/pure water=1/1 (weight ratio), and a crystal was precipitated. The precipitated crystal was separated by filtration, washed twice with 100 g of pure water, and collected. The collected crystal was vacuum dried at 60° C. to obtain polymer (R3) used in Comparative Examples.

When the weight-average molecular weight (Mw) and dispersity (Mw/Mn) were measured by GPC, the following results were obtained.

(R3): Mw=8500, Mw/Mn=2.30

A list of the results for the Mw and Mw/Mn of the compounds (A1) to (A16) and polymers (A17) to (A19) used in the Examples and the polymers (R1) to (R3) used in the Comparative Examples are shown in Tables 1 to 4.

TABLE 1

| Synthesis Example | Compound or polymer | Mw | Mw/Mn |
|---|---|---|---|
| 4 | 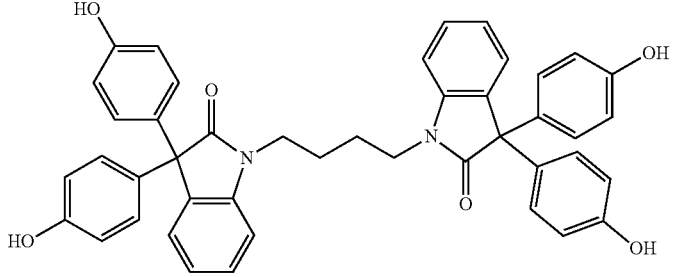 (A1) | 740 | 1.02 |
| 5 | 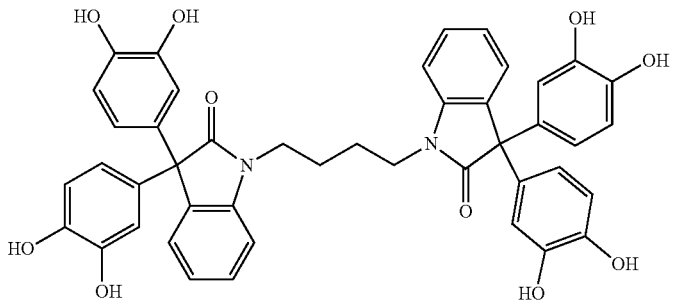 (A2) | 820 | 1.01 |
| 6 | 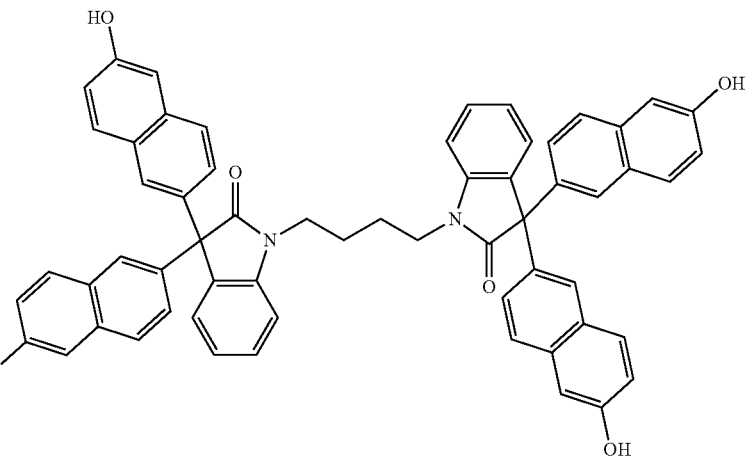 (A3) | 910 | 1.03 |

TABLE 1-continued

| Synthesis Example | Compound or polymer | Mw | Mw/Mn |
|---|---|---|---|
| 7 | (A4) | 960 | 1.05 |
| 8 | (A5) | 760 | 1.02 |
| 9 | (A6) | 820 | 1.01 |
| 10 | (A7) | 890 | 1.01 |

TABLE 2
| Synthesis Example | Compound or polymer | Mw | Mw/Mn |
|---|---|---|---|
| 11 | 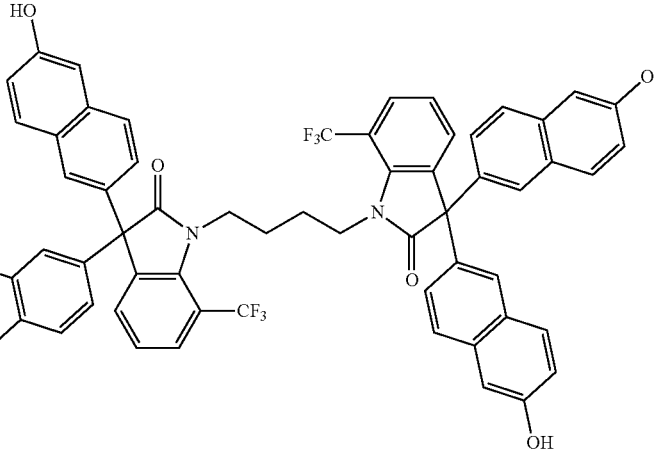<br>(A8) | 1030 | 1.04 |
| 12 | 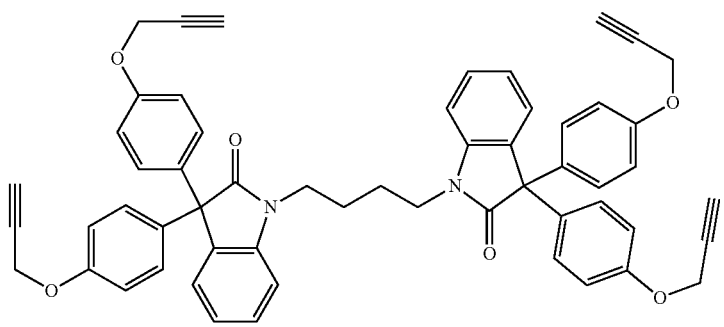 [SMILES: C#CCOc1ccc(C2(c3ccc(OCC#C)cc3)C(=O)N(CCCCN3C(=O)C(c4ccc(OCC#C)cc4)(c4ccc(OCC#C)cc4)c4ccccc43)c3ccccc32)cc1]<br>(A9) | 880 | 1.02 |
| 13 | 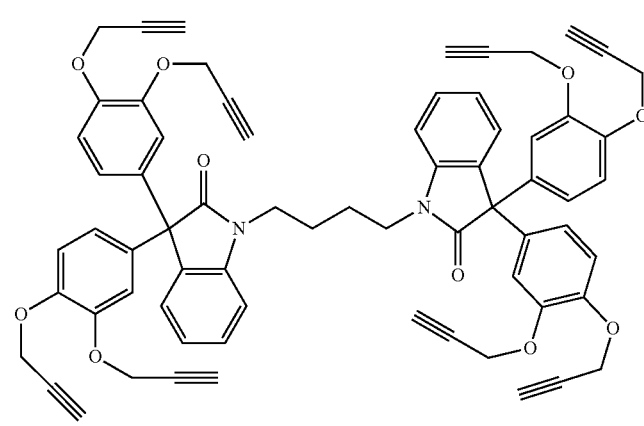 [SMILES: C#CCOc1ccc(C2(c3ccc(OCC#C)c(OCC#C)c3)C(=O)N(CCCCN3C(=O)C(c4ccc(OCC#C)c(OCC#C)c4)(c4ccc(OCC#C)c(OCC#C)c4)c4ccccc43)c3ccccc32)cc1OCC#C]<br>(A10) | 1060 | 1.03 |

TABLE 2-continued
| Synthesis Example | Compound or polymer | Mw | Mw/Mn |
|---|---|---|---|
| 14 | 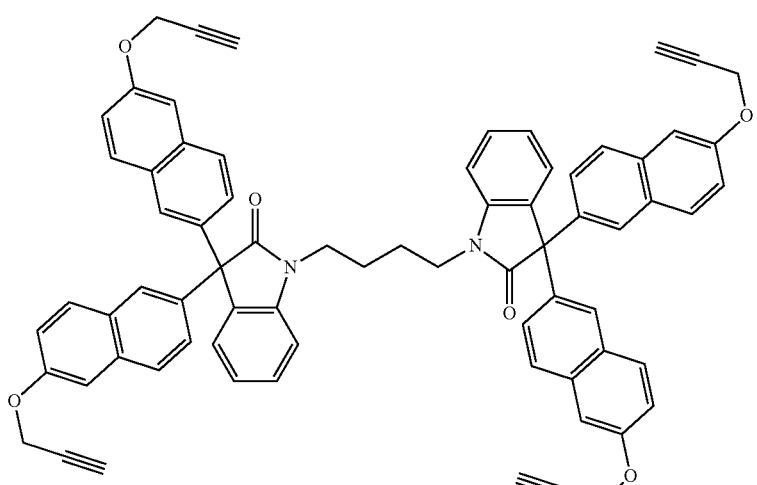 (A11) | 1080 | 1.05 |
| 15 | 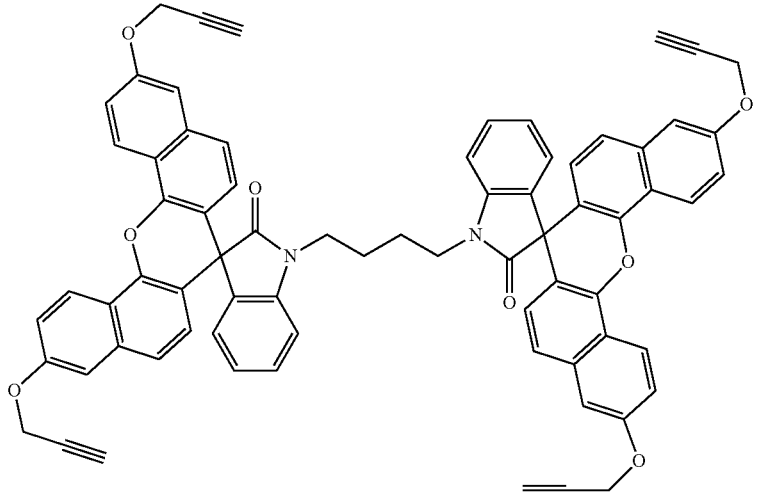 (A12) | 1110 | 1.05 |
| 16 | 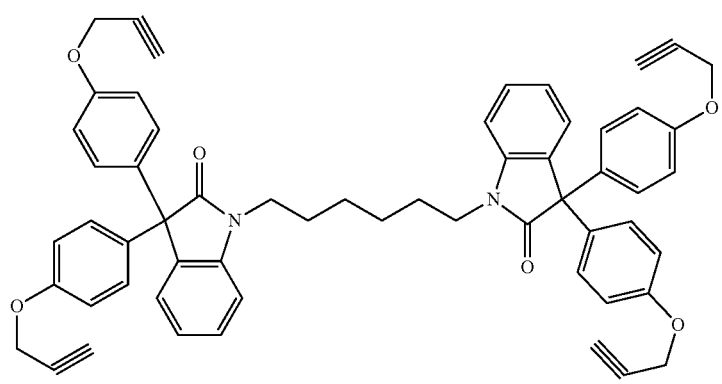 (A13) | 900 | 1.02 |

TABLE 2-continued
| Synthesis Example | Compound or polymer | Mw | Mw/Mn |
|---|---|---|---|
| 17 | 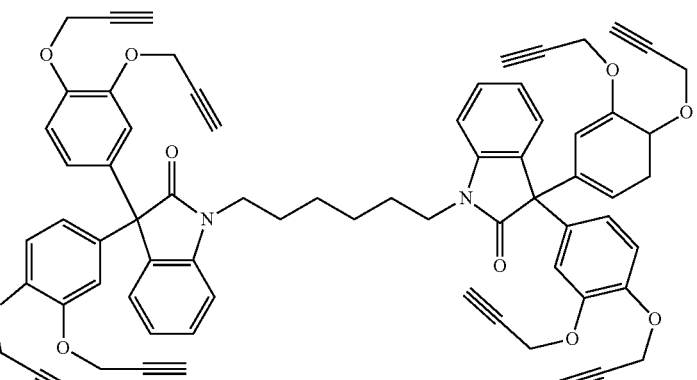 (A14) | 1130 | 1.03 |
TABLE 3
| Synthesis Example | Compound or polymer | Mw | Mw/Mn |
|---|---|---|---|
| 18 | (A15) | 1130 | 1.03 |
| 19 | (A16) | 1220 | 1.05 |

TABLE 3-continued

| Synthesis Example | Compound or polymer | Mw | Mw/Mn |
|---|---|---|---|
| 20 | (A17) | 2700 | 1.58 |
| 21 | (A18) | 3300 | 1.45 |
| 22 | (A19) | 3600 | 1.59 |

TABLE 4

| Synthesis Example | Compound or polymer | Mw | Mw/Mn |
|---|---|---|---|
| 23 | 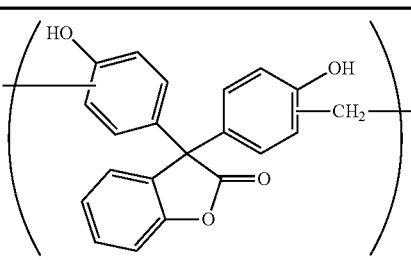 (R1) | 3200 | 4.88 |
| 24 | 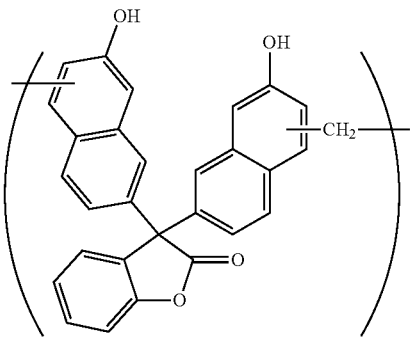 (R2) | 2600 | 3.55 |
| 25 | 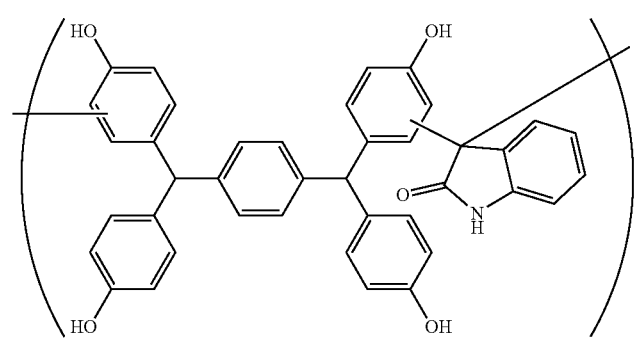 (R3) | 8500 | 2.30 |

Preparation of Compositions (UDL-1 to -26, Comparative UDL-1 to -9) for Forming Organic Film According to proportions shown in Table 5, the following were dissolved using propylene glycol monomethyl ether acetate (PGMEA) containing 0.1 mass % of PF-6320 (manufactured by Omnova Solutions, Inc.): the compounds and polymers (A1) to (A19), polymers (R1) to (R3) used in the Comparative Examples, and the compounds (B5) and (B6) described in the Synthesis Examples; a crosslinking agent (XL); a thermal acid generator (TAG); and (S1) 1,6-diacetoxyhexane, having a boiling point of 260° C. and (S2) tripropylene glycol monomethyl ether, having a boiling point of 242° C. as high-boiling-point solvents. The resulting solutions were filtered through a 0.1-μm filter made of a fluorinated resin. Thus, compositions (UDL-1 to -26, comparative UDL-1 to -9) for forming an organic film were prepared.

Below, the structural formulae of the compounds, crosslinking agent, and thermal acid generator used in the compositions for forming an organic film are shown.

(Compounds)

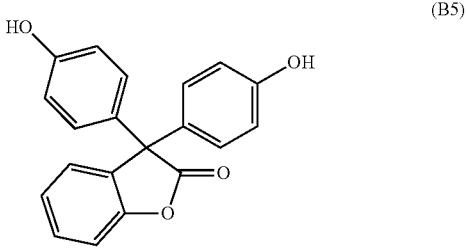

(B5)

-continued
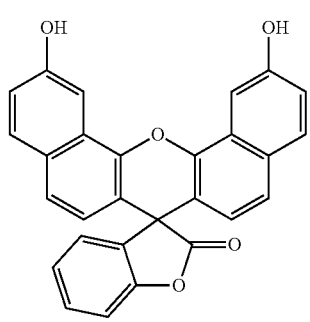
(B6)
(Crosslinking Agent)
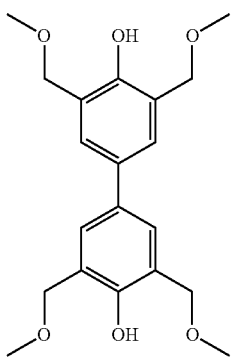
XL
(Thermal Acid Generator)
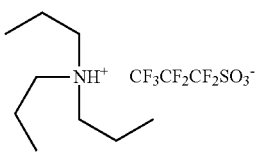
TABLE 5
| Composition for forming organic film | Compound/ polymer (parts by mass) | Crosslinking agent (parts by mass) | Thermal acid generation (parts by mass) | High- boiling- point solvent (parts by mass) | PGMEA (parts by mass) |
|---|---|---|---|---|---|
| UDL-1 | A1 (10) | — | — | — | 90 |
| UDL-2 | A2 (10) | — | — | — | 90 |
| UDL-3 | A3 (10) | — | — | — | 90 |
| UDL-4 | A4 (10) | — | — | — | 90 |
| UDL-5 | A5 (10) | — | — | — | 90 |
| UDL-6 | A6 (10) | — | — | — | 90 |
| UDL-7 | A7 (10) | — | — | — | 90 |
| UDL-8 | A8 (10) | — | — | — | 90 |
| UDL-9 | A9 (10) | — | — | — | 90 |
| UDL-10 | A10 (10) | — | — | — | 90 |
| UDL-11 | A11 (10) | — | — | — | 90 |
| UDL-12 | A12 (10) | — | — | — | 90 |
| UDL-13 | A13 (10) | — | — | — | 90 |
| UDL-14 | A14 (10) | — | — | — | 90 |
| UDL-15 | A15 (10) | — | — | — | 90 |
| UDL-16 | A16 (10) | — | — | — | 90 |
| UDL-17 | A17 (10) | — | — | — | 90 |
| UDL-18 | A18 (10) | — | — | — | 90 |

TABLE 5-continued

| Composition for forming organic film | Compound/ polymer (parts by mass) | Crosslinking agent (parts by mass) | Thermal acid generator (parts by mass) | High-boiling-point solvent (parts by mass) | PGMEA (parts by mass) |
|---|---|---|---|---|---|
| UDL-19 | A19 (10) | — | — | — | 90 |
| UDL-20 | A9 (5) A17 (5) | — | — | — | 90 |
| UDL-21 | A11 (5) A18 (5) | — | — | — | 90 |
| UDL-22 | A14 (5) A19 (5) | — | — | — | 90 |
| UDL-23 | A1 (10) | — | — | S1 (10) | 80 |
| UDL-24 | A10 (10) | — | — | S2 (10) | 80 |
| UDL-25 | A11 (10) | — | — | S1 (10) | 80 |
| UDL-26 | A18 (10) | — | — | S2 (10) | 80 |
| Comparative UDL-1 | R1 (10) | — | — | — | 90 |
| Comparative UDL-2 | R1 (5) B5 (5) | — | — | — | 90 |
| Comparative UDL-3 | R2 (10) | — | — | — | 90 |
| Comparative UDL-4 | R2 (5) B6 (5) | — | — | — | 90 |
| Comparative UDL-5 | R3 (10) | — | — | — | 90 |
| Comparative UDL-6 | R3 (10) | XL (2.6) | TAG (0.25) | — | 90 |
| Comparative UDL-7 | B5 (10) | — | — | — | 90 |
| Comparative UDL-8 | B6 (10) | — | — | — | 90 |
| Comparative UDL-9 | B6 (10) | XL (2.6) | TAG (0.25) | — | 90 |

<Evaluation>

Solvent Resistance Measurement (Examples 1-1 to 1-26, Comparative Examples 1-1 to 1-9)

A silicon substrate was coated with one of the UDL-1 to -26 and comparative UDL-1 to -9 prepared above and baked in the atmosphere at the temperature shown in Table 6 for 60 seconds. Then, the film thickness was measured. A PGMEA solvent was dispensed on each film and allowed to stand for 30 seconds. The resultant was spin-dried and baked at 100° C. for 60 seconds to evaporate the PGMEA, and the film thicknesses before and after the PGMEA treatment were measured. Using the film thickness after the film formation and the film thickness after the PGMEA treatment, the film remaining percentage was determined. Table 6 shows the results.

TABLE 6

| | Composition for forming organic film | Film thickness after film formation: a (Å) | Film thickness after PGMEA treatment: b (Å) | b/a × 100 (%) | Baking temperature |
|---|---|---|---|---|---|
| Example 1-1 | UDL-1 | 2010 | 2004 | 99.7 | 400° C. × 60 seconds |
| Example 1-2 | UDL-2 | 1990 | 1982 | 99.6 | 400° C. × 60 seconds |
| Example 1-3 | UDL-3 | 2004 | 1999 | 99.8 | 400° C. × 60 seconds |
| Example 1-4 | UDL-4 | 1991 | 1983 | 99.6 | 400° C. × 60 seconds |
| Example 1-5 | UDL-5 | 2001 | 1997 | 99.8 | 400° C. × 60 seconds |
| Example 1-6 | UDL-6 | 2008 | 2002 | 99.7 | 400° C. × 60 seconds |
| Example 1-7 | UDL-7 | 2011 | 2004 | 99.7 | 400° C. × 60 seconds |
| Example 1-8 | UDL-8 | 1993 | 1988 | 99.7 | 400° C. × 60 seconds |
| Example 1-9 | UDL-9 | 2007 | 2005 | 99.9 | 350° C. × 60 seconds |
| Example 1-10 | UDL-10 | 1994 | 1992 | 99.9 | 350° C. × 60 seconds |
| Example 1-11 | UDL-11 | 2012 | 2012 | 100.0 | 350° C. × 60 seconds |
| Example 1-12 | UDL-12 | 1996 | 1993 | 99.8 | 350° C. × 60 seconds |
| Example 1-13 | UDL-13 | 1994 | 1990 | 99.8 | 350° C. × 60 seconds |
| Example 1-14 | UDL-14 | 2000 | 1997 | 99.9 | 350° C. × 60 seconds |
| Example 1-15 | UDL-15 | 2005 | 2000 | 99.8 | 350° C. × 60 seconds |
| Example 1-16 | UDL-16 | 2013 | 2010 | 99.9 | 350° C. × 60 seconds |
| Example 1-17 | UDL-17 | 1997 | 1995 | 99.9 | 350° C. × 60 seconds |
| Example 1-18 | UDL-18 | 1990 | 1987 | 99.8 | 350° C. × 60 seconds |
| Example 1-19 | UDL-19 | 2002 | 1998 | 99.8 | 350° C. × 60 seconds |
| Example 1-20 | UDL-20 | 1999 | 1996 | 99.8 | 350° C. × 60 seconds |
| Example 1-21 | UDL-21 | 2009 | 2004 | 99.8 | 350° C. × 60 seconds |
| Example 1-22 | UDL-22 | 2003 | 1999 | 99.8 | 350° C. × 60 seconds |
| Example 1-23 | UDL-23 | 1994 | 1987 | 99.6 | 350° C. × 60 seconds |
| Example 1-24 | UDL-24 | 1993 | 1992 | 99.9 | 350° C. × 60 seconds |
| Example 1-25 | UDL-25 | 1990 | 1988 | 99.9 | 350° C. × 60 seconds |
| Example 1-26 | UDL-26 | 1997 | 1994 | 99.8 | 350° C. × 60 seconds |

TABLE 6-continued

|  | Composition for forming organic film | Film thickness after film formation: a (Å) | Film thickness after PGMEA treatment: b (Å) | b/a × 100 (%) | Baking temperature |
|---|---|---|---|---|---|
| Comparative Example 1-1 | Comparative UDL-1 | 1995 | 1989 | 99.7 | 400° C. × 60 seconds |
| Comparative Example 1-2 | Comparative UDL-2 | 2012 | 987 | 49.1 | 400° C. × 60 seconds |
| Comparative Example 1-3 | Comparative UDL-3 | 1998 | 1990 | 99.6 | 400° C. × 60 seconds |
| Comparative Example 1-4 | Comparative UDL-4 | 2003 | 1376 | 68.7 | 400° C. × 60 seconds |
| Comparative Example 1-5 | Comparative UDL-5 | 2011 | 1267 | 63.0 | 400° C. × 60 seconds |
| Comparative Example 1-6 | Comparative UDL-6 | 2015 | 2009 | 99.7 | 350° C. × 60 seconds |
| Comparative Example 1-7 | Comparative UDL-7 | 2005 | 224 | 11.2 | 400° C. × 60 seconds |
| Comparative Example 1-8 | Comparative UDL-8 | 2002 | 320 | 16.0 | 400° C. × 60 seconds |
| Comparative Example 1-9 | Comparative UDL-9 | 2007 | 2004 | 99.9 | 350° C. × 60 seconds |

As shown in Table 6, the organic films (Examples 1-1 to 1-26) using the inventive compounds and/or polymers had a film remaining percentage after the PGMEA treatment of 99.5% or more. This indicates that the crosslinking reaction was caused by the heat treatment, and sufficient solvent resistance was exhibited. Comparing the Examples 1-1 to 1-16 with Comparative Examples 1-1 to 1-4 and 1-7 to 1-9, the inventive compounds are monomolecular, but exhibit sufficient curability nevertheless. However, in Comparative Examples 1-7 and 1-8, where only the monomolecular compounds were used, solvent resistance was not achieved due to insufficient curability, insufficient heat resistance, or sublimation caused by a small molecular weight, and so forth. Therefore, in order to ensure solvent resistance as in Comparative Example 1-9, it was necessary to add a crosslinking agent. Meanwhile, curability was ensured when the polymer alone was contained, as shown by the results of Comparative Examples 1-1 and 1-3. However, it was considered that Comparative Examples 1-2 and 1-4, where a polymer was also mixed, failed to ensure solvent resistance by factors such as insufficient curability, heat resistance, and sublimation, as stated above. In Comparative Examples 1-5 and 1-6, even though a polymer was used, curability was not exhibited when only the polymer was used, and in order to achieve solvent resistance, it was necessary to add a crosslinking agent and a thermal acid generator.

Heat Resistance Evaluation (Examples 2-1 to 2-26, Comparative Examples 2-1 to 2-9)

A silicon substrate was coated with one of the compositions (UDL-1 to -26, comparative UDL-1 to -9) for forming an organic film and baked in the atmosphere at the temperature shown in Table 7 for 60 seconds to form a coating film of about 200 nm. The film thickness A was measured. This substrate was further baked at 400° C. for 20 minutes under such a nitrogen stream that the oxygen concentration was controlled to 0.2 volume % or less. Then, the film thickness B was measured. Table 7 shows the results.

TABLE 7

|  | Composition for forming organic film | Baking temperature | Film thickness after baking: A (Å) | Film thickness after treatment at 400° C.: B (Å) | Film remaining percentage % (B/A) |
|---|---|---|---|---|---|
| Example 2-1 | UDL-1 | 400° C. × 60 seconds | 2010 | 1978 | 98.4 |
| Example 2-2 | UDL-2 | 400° C. × 60 seconds | 1990 | 1962 | 98.6 |
| Example 2-3 | UDL-3 | 400° C. × 60 seconds | 2004 | 1981 | 98.9 |
| Example 2-4 | UDL-4 | 400° C. × 60 seconds | 1991 | 1966 | 98.7 |
| Example 2-5 | UDL-5 | 400° C. × 60 seconds | 2001 | 1968 | 98.4 |
| Example 2-6 | UDL-6 | 400° C. × 60 seconds | 2008 | 1971 | 98.2 |
| Example 2-7 | UDL-7 | 400° C. × 60 seconds | 2011 | 1975 | 98.2 |
| Example 2-8 | UDL-8 | 400° C. × 60 seconds | 1993 | 1967 | 98.7 |
| Example 2-9 | UDL-9 | 350° C. × 60 seconds | 2007 | 1999 | 99.6 |
| Example 2-10 | UDL-10 | 350° C. × 60 seconds | 1994 | 1987 | 99.6 |
| Example 2-11 | UDL-11 | 350° C. × 60 seconds | 2012 | 2003 | 99.6 |
| Example 2-12 | UDL-12 | 350° C. × 60 seconds | 1996 | 1989 | 99.6 |
| Example 2-13 | UDL-13 | 350° C. × 60 seconds | 1994 | 1981 | 99.3 |
| Example 2-14 | UDL-14 | 350° C. × 60 seconds | 2000 | 1993 | 99.7 |
| Example 2-15 | UDL-15 | 350° C. × 60 seconds | 2005 | 1994 | 99.5 |
| Example 2-16 | UDL-16 | 350° C. × 60 seconds | 2013 | 1996 | 99.2 |
| Example 2-17 | UDL-17 | 350° C. × 60 seconds | 1997 | 1994 | 99.8 |
| Example 2-18 | UDL-18 | 350° C. × 60 seconds | 1990 | 1987 | 99.8 |
| Example 2-19 | UDL-19 | 350° C. × 60 seconds | 2002 | 1998 | 99.8 |
| Example 2-20 | UDL-20 | 350° C. × 60 seconds | 1999 | 1993 | 99.7 |

TABLE 7-continued

| | Composition for forming organic film | Baking temperature | Film thickness after baking: A (Å) | Film thickness after treatment at 400° C.: B (Å) | Film remaining percentage % (B/A) |
|---|---|---|---|---|---|
| Example 2-21 | UDL-21 | 350° C. × 60 seconds | 2009 | 2003 | 99.7 |
| Example 2-22 | UDL-22 | 350° C. × 60 seconds | 2003 | 1997 | 99.7 |
| Example 2-23 | UDL-23 | 350° C. × 60 seconds | 1994 | 1959 | 98.2 |
| Example 2-24 | UDL-24 | 350° C. × 60 seconds | 1993 | 1986 | 99.6 |
| Example 2-25 | UDL-25 | 350° C. × 60 seconds | 1990 | 1980 | 99.5 |
| Example 2-26 | UDL-26 | 350° C. × 60 seconds | 1999 | 1993 | 99.7 |
| Comparative Example 2-1 | Comparative UDL-1 | 400° C. × 60 seconds | 1995 | 1764 | 88.4 |
| Comparative Example 2-2 | Comparative UDL-2 | 400° C. × 60 seconds | 2012 | 1420 | 70.6 |
| Comparative Example 2-3 | Comparative UDL-3 | 400° C. × 60 seconds | 1998 | 1841 | 92.1 |
| Comparative Example 2-4 | Comparative UDL-4 | 400° C. × 60 seconds | 2003 | 1536 | 76.7 |
| Comparative Example 2-5 | Comparative UDL-5 | 400° C. × 60 seconds | 2011 | 1830 | 91.0 |
| Comparative Example 2-6 | Comparative UDL-6 | 350° C. × 60 seconds | 2015 | 1921 | 95.3 |
| Comparative Example 2-7 | Comparative UDL-7 | 400° C. × 60 seconds | 2005 | 123 | 6.1 |
| Comparative Example 2-8 | Comparative UDL-8 | 400° C. × 60 seconds | 2002 | 356 | 17.8 |
| Comparative Example 2-9 | Comparative UDL-9 | 350° C. × 60 seconds | 2007 | 1811 | 90.2 |

As shown in Table 7, in the inventive compositions for forming an organic film (Examples 2-1 to 2-26), the film thicknesses were decreased by less than 2% even after baking at 400° C. over a long time. This indicates that the inventive compositions for forming an organic film were excellent in heat resistance. In particular, in the compounds and polymers having a propargyloxy ill group introduced as a substituent maintained a film remaining percentage of 99% or more, and this indicates particularly excellent heat resistance.

On the other hand, in Comparative Examples 2-1 to 2-9, the film remaining percentage had a low value when solvent resistance was not achieved in the results of the solvent resistance measurement. In Comparative Examples 2-7 and 2-8, where a monomolecular compound was used, almost no organic film remained, and in Comparative Examples 2-1, 2-3, and 2-6, too, where solvent resistance was achieved by adding a crosslinking agent or using a polymer, the film remaining percentage had a low value compared with the Examples of the present invention. Thus, it can be observed that the organic films using the inventive compounds and polymers were excellent in heat resistance.

Film-Formability Evaluation (Examples 3-1 to 3-26, Comparative Examples 3-1 to 3-9)

Each of the compositions (UDL-1 to -26, Comparative Examples UDL-1 to -9) for forming an organic film prepared above were respectively applied onto each of a Bare-Si substrate, a substrate treated with hexamethyldisilazane (HMDS), and a substrate treated with SiON, shown in Table 8, and baked in the atmosphere at the temperature shown in Table 8 for 60 seconds to form an organic film having a film thickness of 100 nm. The organic films thus formed were observed with an optical microscope (ECLIPSE L200 manufactured by Nikon INSTECH CO., LTD.) to check for coating abnormality. Note that in the present evaluation, the film thickness is made thin in order to evaluate the coatability. This is a severe evaluation condition where film formation abnormality is liable to occur.

TABLE 8

| | Composition for forming organic film | Baking temperature | Bare-Si substrate | HMDS-treated substrate | SiON-treated substrate |
|---|---|---|---|---|---|
| Example 3-1 | UDL-1 | 400° C. × 60 seconds | No abnormality | No abnormality | No abnormality |
| Example 3-2 | UDL-2 | 400° C. × 60 seconds | No abnormality | No abnormality | No abnormality |
| Example 3-3 | UDL-3 | 400° C. × 60 seconds | No abnormality | No abnormality | No abnormality |
| Example 3-4 | UDL-4 | 400° C. × 60 seconds | No abnormality | No abnormality | No abnormality |
| Example 3-5 | UDL-5 | 400° C. × 60 seconds | No abnormality | No abnormality | No abnormality |
| Example 3-6 | UDL-6 | 400° C. × 60 seconds | No abnormality | No abnormality | No abnormality |
| Example 3-7 | UDL-7 | 400° C. × 60 seconds | No abnormality | No abnormality | No abnormality |
| Example 3-8 | UDL-8 | 400° C. × 60 seconds | No abnormality | No abnormality | No abnormality |
| Example 3-9 | UDL-9 | 350° C. × 60 seconds | No abnormality | No abnormality | No abnormality |
| Example 3-10 | UDL-10 | 350° C. × 60 seconds | No abnormality | No abnormality | No abnormality |
| Example 3-11 | UDL-11 | 350° C. × 60 seconds | No abnormality | No abnormality | No abnormality |
| Example 3-12 | UDL-12 | 350° C. × 60 seconds | No abnormality | No abnormality | No abnormality |
| Example 3-13 | UDL-13 | 350° C. × 60 seconds | No abnormality | No abnormality | No abnormality |
| Example 3-14 | UDL-14 | 350° C. × 60 seconds | No abnormality | No abnormality | No abnormality |
| Example 3-15 | UDL-15 | 350° C. × 60 seconds | No abnormality | No abnormality | No abnormality |

TABLE 8-continued

| | Composition for forming organic film | Baking temperature | Bare-Si substrate | HMDS-treated substrate | SiON-treated substrate |
|---|---|---|---|---|---|
| Example 3-16 | UDL-16 | 350° C. × 60 seconds | No abnormality | No abnormality | No abnormality |
| Example 3-17 | UDL-17 | 350° C. × 60 seconds | No abnormality | No abnormality | No abnormality |
| Example 3-18 | UDL-18 | 350° C. × 60 seconds | No abnormality | No abnormality | No abnormality |
| Example 3-19 | UDL-19 | 350° C. × 60 seconds | No abnormality | No abnormality | No abnormality |
| Example 3-20 | UDL-20 | 350° C. × 60 seconds | No abnormality | No abnormality | No abnormality |
| Example 3-21 | UDL-21 | 350° C. × 60 seconds | No abnormality | No abnormality | No abnormality |
| Example 3-22 | UDL-22 | 350° C. × 60 seconds | No abnormality | No abnormality | No abnormality |
| Example 3-23 | UDL-23 | 350° C. × 60 seconds | No abnormality | No abnormality | No abnormality |
| Example 3-24 | UDL-24 | 350° C. × 60 seconds | No abnormality | No abnormality | No abnormality |
| Example 3-25 | UDL-25 | 350° C. × 60 seconds | No abnormality | No abnormality | No abnormality |
| Example 3-26 | UDL-26 | 350° C. × 60 seconds | No abnormality | No abnormality | No abnormality |
| Comparative Example 3-1 | Comparative UDL-1 | 400° C. × 60 seconds | No abnormality | No abnormality | Several pinhole defects |
| Comparative Example 3-2 | Comparative UDL-2 | 400° C. × 60 seconds | Countless pinhole defects | Countless pinhole defects | Countless pinhole defects |
| Comparative Example 3-3 | Comparative UDL-3 | 400° C. × 60 seconds | No abnormality | No abnormality | Several pinhole defects |
| Comparative Example 3-4 | Comparative UDL-4 | 400° C. × 60 seconds | Countless pinhole defects | Countless pinhole defects | Countless pinhole defects |
| Comparative Example 3-5 | Comparative UDL-5 | 400° C. × 60 seconds | Countless pinhole defects | Countless pinhole defects | Countless pinhole defects |
| Comparative Example 3-6 | Comparative UDL-6 | 350° C. × 60 seconds | No abnormality | No abnormality | No abnormality |
| Comparative Example 3-7 | Comparative UDL-7 | 400° C. × 60 seconds | Countless pinhole defects | Countless pinhole defects | Countless pinhole defects |
| Comparative Example 3-8 | Comparative UDL-8 | 400° C. × 60 seconds | Countless pinhole defects | Countless pinhole defects | Countless pinhole defects |
| Comparative Example 3-9 | Comparative UDL-9 | 350° C. × 60 seconds | No abnormality | Several pinhole defects | No abnormality |

As shown in Table 8, it can be observed that the inventive compositions for forming an organic film (Examples 3-1 to 3-26) had no substrate dependency, and that film-formability was achieved. On the contrary, in Comparative Examples 3-7 and 3-8, it was not possible to achieve film-formability due to the monomolecular compound having insufficient curability and insufficient heat resistance and due to generation of sublimation products, as indicated by the solvent resistance measurement and heat resistance evaluation. Meanwhile, as indicated by Comparative Examples 3-1 to 3-4 and 3-9, it was not possible to achieve film-formability depending on the substrate even when a crosslinking agent and polymer were added, or when the polymer was used alone. From the comparison of these results, it can be conjectured that in the inventive compounds and polymers, the cyclic amide structure functions as an adhesive group, and contributes to the improvement of film-formability. As a similar tendency, this can also be conjectured from the fact that in Comparative Examples 3-5 and 3-6, where a polymer having a cyclic amide structure was used, it was not possible to achieve film-formability when the polymer having no curability and poor heat resistance was used alone, but in Comparative Example 3-6, where a crosslinking agent was added to form a cured film, film-formability was improved.

Filling Property Evaluation (Examples 4-1 to 4-26, Comparative Examples 4-1 to 4-9)

The compositions (UDL-1 to -26, comparative UDL-1 to -9) for forming an organic film prepared above were each applied onto an SiO$_2$ wafer substrate having a dense hole pattern (hole diameter: 0.16 μm, hole depth: 0.50 μm, distance between the centers of two adjacent holes: 0.32 μm) and baked in the atmosphere at the temperature shown in Table 9 for 60 seconds to form an organic film. The substrate used was a base substrate 7 (SiO$_2$ wafer substrate) having a dense hole pattern as shown in FIG. 2 (G) (top view) and (H) (sectional view). The sectional shapes of the resulting wafer substrates were observed with a scanning electron microscope (SEM) to check whether or not the holes were filled with the organic film 8 without voids (space). Table 9 shows the results. If a composition for forming an organic film having poor filling property is used, voids occur inside the holes in this evaluation. When a composition for forming an organic film having good filling property is used, the holes are filled with the organic film without voids in this evaluation as shown in FIG. 2 (I).

TABLE 9

| | Composition for forming organic film | Baking temperature | Presence/absence of voids |
|---|---|---|---|
| Example 4-1 | UDL-1 | 400° C. × 60 seconds | Absent |
| Example 4-2 | UDL-2 | 400° C. × 60 seconds | Absent |
| Example 4-3 | UDL-3 | 400° C. × 60 seconds | Absent |
| Example 4-4 | UDL-4 | 400° C. × 60 seconds | Absent |
| Example 4-5 | UDL-5 | 400° C. × 60 seconds | Absent |
| Example 4-6 | UDL-6 | 400° C. × 60 seconds | Absent |
| Example 4-7 | UDL-7 | 400° C. × 60 seconds | Absent |
| Example 4-8 | UDL-8 | 400° C. × 60 seconds | Absent |
| Example 4-9 | UDL-9 | 350° C. × 60 seconds | Absent |
| Example 4-10 | UDL-10 | 350° C. × 60 seconds | Absent |
| Example 4-11 | UDL-11 | 350° C. × 60 seconds | Absent |
| Example 4-12 | UDL-12 | 350° C. × 60 seconds | Absent |
| Example 4-13 | UDL-13 | 350° C. × 60 seconds | Absent |
| Example 4-14 | UDL-14 | 350° C. × 60 seconds | Absent |
| Example 4-15 | UDL-15 | 350° C. × 60 seconds | Absent |
| Example 4-16 | UDL-16 | 350° C. × 60 seconds | Absent |
| Example 4-17 | UDL-17 | 350° C. × 60 seconds | Absent |
| Example 4-18 | UDL-18 | 350° C. × 60 seconds | Absent |
| Example 4-19 | UDL-19 | 350° C. × 60 seconds | Absent |
| Example 4-20 | UDL-20 | 350° C. × 60 seconds | Absent |
| Example 4-21 | UDL-21 | 350° C. × 60 seconds | Absent |
| Example 4-22 | UDL-22 | 350° C. × 60 seconds | Absent |
| Example 4-23 | UDL-23 | 350° C. × 60 seconds | Absent |

TABLE 9-continued

| | Composition for forming organic film | Baking temperature | Presence/absence of voids |
|---|---|---|---|
| Example 4-24 | UDL-24 | 350° C. × 60 seconds | Absent |
| Example 4-25 | UDL-25 | 350° C. × 60 seconds | Absent |
| Example 4-26 | UDL-26 | 350° C. × 60 seconds | Absent |
| Comparative Example 4-1 | Comparative UDL-1 | 400° C. × 60 seconds | Present |
| Comparative Example 4-2 | Comparative UDL-2 | 400° C. × 60 seconds | Present |
| Comparative Example 4-3 | Comparative UDL-3 | 400° C. × 60 seconds | Present |
| Comparative Example 4-4 | Comparative UDL-4 | 400° C. × 60 seconds | Present |
| Comparative Example 4-5 | Comparative UDL-5 | 400° C. × 60 seconds | Present |
| Comparative Example 4-6 | Comparative UDL-6 | 350° C. × 60 seconds | Present |
| Comparative Example 4-7 | Comparative UDL-7 | 400° C. × 60 seconds | Present |
| Comparative Example 4-8 | Comparative UDL-8 | 400° C. × 60 seconds | Present |
| Comparative Example 4-9 | Comparative UDL-9 | 350° C. × 60 seconds | Absent |

As shown by Examples 4-1 to 4-26 in Table 9, it has been revealed that every composition for forming an organic film using the inventive compound and polymer was able to fill the hole patterns without voids, and was excellent in filling property. On the other hand, in Comparative Examples 4-1 to 4-5, 4-7, and 4-8, it could be considered that, as indicated by the results of the solvent resistance measurement and the heat resistance evaluation, filling failure occurred since solvent resistance was not achieved and heat resistance was insufficient. In Comparative Example 4-6, solvent resistance was achieved. However, thermal flowability was poor compared with monomolecular compounds since a polymer was used. Moreover, a sudden curing reaction due to the action of the thermal acid generator caused insufficient thermal flowability. Therefore, it could be considered that the insufficient thermal flowability brought about voids due to poor filling. Meanwhile, in Comparative Example 4-9, it could be observed that since a monomolecular compound was used, filling property was achieved owing to the contribution of the thermal flowability.

Planarizing Property Evaluation (Examples 5-1 to 5-26, Comparative Examples 5-1 to 5-9)

The compositions (UDL-1 to -26, comparative UDL-1 to -9) for forming an organic film prepared above were each applied onto a base substrate 9 (SiO₂ wafer substrate) having a giant isolated trench pattern (FIG. 3 (J), trench width: 10 μm, trench depth: 0.1 μm) and baked in the atmosphere at the temperature shown in Table 10 for 60 seconds. Then, a step (delta 10 in FIG. 3 (K)) between the trench portion and the non-trench portion of an organic film 10 was observed with an atomic force microscope (AFM) NX10 manufactured by Park systems Corp. Table 10 shows the results. In this evaluation, the smaller the step, the better the planarizing property. Note that, in this evaluation, a trench pattern having a depth of 0.10 μm was planarized using a composition for forming an organic film generally giving a film thickness of approximately 0.2 μm. This is a severe evaluation condition to evaluate the planarizing property.

TABLE 10

| | Composition for forming organic film | Baking temperature | Step (nm) |
|---|---|---|---|
| Example 5-1 | UDL-1 | 400° C. × 60 seconds | 40 |
| Example 5-2 | UDL-2 | 400° C. × 60 seconds | 45 |
| Example 5-3 | UDL-3 | 400° C. × 60 seconds | 50 |
| Example 5-4 | UDL-4 | 400° C. × 60 seconds | 55 |
| Example 5-5 | UDL-5 | 400° C. × 60 seconds | 35 |
| Example 5-6 | UDL-6 | 400° C. × 60 seconds | 45 |
| Example 5-7 | UDL-7 | 400° C. × 60 seconds | 45 |
| Example 5-8 | UDL-8 | 400° C. × 60 seconds | 55 |
| Example 5-9 | UDL-9 | 350° C. × 60 seconds | 30 |
| Example 5-10 | UDL-10 | 350° C. × 60 seconds | 25 |
| Example 5-11 | UDL-11 | 350° C. × 60 seconds | 35 |
| Example 5-12 | UDL-12 | 350° C. × 60 seconds | 40 |
| Example 5-13 | UDL-13 | 350° C. × 60 seconds | 40 |
| Example 5-14 | UDL-14 | 350° C. × 60 seconds | 20 |
| Example 5-15 | UDL-15 | 350° C. × 60 seconds | 25 |
| Example 5-16 | UDL-16 | 350° C. × 60 seconds | 45 |
| Example 5-17 | UDL-17 | 350° C. × 60 seconds | 60 |
| Example 5-18 | UDL-18 | 350° C. × 60 seconds | 65 |
| Example 5-19 | UDL-19 | 350° C. × 60 seconds | 60 |
| Example 5-20 | UDL-20 | 350° C. × 60 seconds | 40 |
| Example 5-21 | UDL-21 | 350° C. × 60 seconds | 45 |
| Example 5-22 | UDL-22 | 350° C. × 60 seconds | 35 |
| Example 5-23 | UDL-23 | 350° C. × 60 seconds | 35 |
| Example 5-24 | UDL-24 | 350° C. × 60 seconds | 15 |
| Example 5-25 | UDL-25 | 350° C. × 60 seconds | 30 |
| Example 5-26 | UDL-26 | 350° C. × 60 seconds | 50 |
| Comparative Example 5-1 | Comparative UDL-1 | 400° C. × 60 seconds | 90 |
| Comparative Example 5-2 | Comparative UDL-2 | 400° C. × 60 seconds | 90 |
| Comparative Example 5-3 | Comparative UDL-3 | 400° C. × 60 seconds | 95 |
| Comparative Example 5-4 | Comparative UDL-4 | 400° C. × 60 seconds | 90 |
| Comparative Example 5-5 | Comparative UDL-5 | 400° C. × 60 seconds | 90 |
| Comparative Example 5-6 | Comparative UDL-6 | 350° C. × 60 seconds | 95 |
| Comparative Example 5-7 | Comparative UDL-7 | 400° C. × 60 seconds | 100 |
| Comparative Example 5-8 | Comparative UDL-8 | 400° C. × 60 seconds | 100 |
| Comparative Example 5-9 | Comparative UDL-9 | 350° C. × 60 seconds | 85 |

As shown by Examples 5-1 to 5-26 in Table 10, every organic film material had smaller steps in the organic film between the trench portion and the non-trench portion when the inventive compounds and polymers were used compared with Comparative Example 5-1 to 5-9, showing that planarizing property was excellent. In particular, the compositions containing a condensation-dehydration products of phenol or catechol and bis(indole-2,3-dione) with a propargyl group as substituents show excellent results, as in Examples 5-9, 5-10, 5-14, and 5-15. This could be considered to be because of excellent results of heat resistance achieved in the heat resistance test of the heat resistance evaluation, and because of reduced viscosity of the compound caused by a hydroxy group being capped by etherification. In Comparative Examples 5-1 to 5-5, 5-7, and 5-8, as indicated by the results of the heat resistance test in the heat resistance evaluation, heat resistance was insufficient, so that film shrinking during baking was large. It could be considered that a difference between film thickness and the step size thus occurred, and planarizing property was degraded. Meanwhile, in Comparative Examples 5-6 and 5-9, it could be considered that since a crosslinking agent was used in order to ensure solvent resistance, a sudden curing reaction occurred, so that it was not possible to receive the benefits of the thermal flowability, and planarizing property was degraded. In Comparative Example 5-6, thermal flowability was originally poor since a polymer was used, but this could be conjectured from the result of Comparative Example 5-9, where a monomolecular compound was used and a remarkable result was obtained. From a comparison of Examples 5-23 to 5-26 and Examples 5-1, 5-10, 5-11, and 5-18, containing no high-boiling-point solvent, it could also be observed that flatness was further improved by the addition of the high-boiling-point solvent. In addition, comparing Examples 5-20 to 5-22, where an inventive compound and polymer were mixed, with Examples 5-17 to 5-19, where only a polymer was used, planarizing property was improved. By adjusting the amount to be contained, it is also possible to improve flatness without losing various physical properties such as heat resistance, twisting resistance, and etching resistance, required in an organic film.

Adhesiveness Test (Examples 6-1 to 6-26, Comparative Examples 6-1 to 6-4)

The compositions (UDL-1 to -26, comparative UDL-1, -3, -6, -9) for forming an organic film were respectively applied onto $SiO_2$ wafer substrates and baked using a hot plate in the atmosphere at the temperature shown in Table 11 for 60 seconds. Thus, organic films each with a film thickness of 200 nm were formed. This wafer with an organic film was cut into a 1×1 cm square, and an aluminum pin with epoxy adhesive was fastened to the cut wafer with a dedicated jig. Thereafter, the assembly was heated with an oven at 150° C. for 1 hour to bond the aluminum pin to the substrate. After cooling to room temperature, initial adhesiveness was evaluated based on the resistance force by a thin-film adhesion strength measurement apparatus (Sebastian Five-A). Note that, regarding Comparative UDL-2, -4, -5, -7, and -8, where it was not possible to achieve solvent resistance in the solvent resistance measurement, it was not possible to perform the adhesiveness test.

FIG. 4 shows an explanatory diagram showing the adhesiveness measurement method. In FIG. 4, reference number 11 denotes a silicon wafer (substrate), 12 denotes a cured film, 13 denotes a support, 14 denotes an aluminum pin with adhesive, 15 denotes a grip, and 16 denotes a tensile direction. Each adhesive force is an average of 12 measurement points, and a larger value indicates that the adhesive film has higher adhesiveness with respect to the substrate. The adhesiveness was evaluated by comparing the obtained values. Table 11 shows the results.

TABLE 11

| Composition for forming organic film | Baking temperature | Adhesion (mN) |
|---|---|---|
| Example 6-1 UDL-1 | 400° C. × 60 seconds | 530 |
| Example 6-2 UDL-2 | 400° C. × 60 seconds | 750 |
| Example 6-3 UDL-3 | 400° C. × 60 seconds | 560 |
| Example 6-4 UDL-4 | 400° C. × 60 seconds | 610 |
| Example 6-5 UDL-5 | 400° C. × 60 seconds | 540 |
| Example 6-6 UDL-6 | 400° C. × 60 seconds | 720 |
| Example 6-7 UDL-7 | 400° C. × 60 seconds | 730 |
| Example 6-8 UDL-8 | 400° C. × 60 seconds | 530 |
| Example 6-9 UDL-9 | 350° C. × 60 seconds | 450 |
| Example 6-10 UDL-10 | 350° C. × 60 seconds | 610 |
| Example 6-11 UDL-11 | 350° C. × 60 seconds | 470 |
| Example 6-12 UDL-12 | 350° C. × 60 seconds | 430 |
| Example 6-13 UDL-13 | 350° C. × 60 seconds | 470 |
| Example 6-14 UDL-14 | 350° C. × 60 seconds | 580 |
| Example 6-15 UDL-15 | 350° C. × 60 seconds | 560 |
| Example 6-16 UDL-16 | 350° C. × 60 seconds | 460 |
| Example 6-17 UDL-17 | 350° C. × 60 seconds | 520 |
| Example 6-18 UDL-18 | 350° C. × 60 seconds | 490 |
| Example 6-19 UDL-19 | 350° C. × 60 seconds | 640 |
| Example 6-20 UDL-20 | 350° C. × 60 seconds | 520 |
| Example 6-21 UDL-21 | 350° C. × 60 seconds | 470 |
| Example 6-22 UDL-22 | 350° C. × 60 seconds | 610 |
| Example 6-23 UDL-23 | 350° C. × 60 seconds | 520 |
| Example 6-24 UDL-24 | 350° C. × 60 seconds | 620 |
| Example 6-25 UDL-25 | 350° C. × 60 seconds | 470 |
| Example 6-26 UDL-26 | 350° C. × 60 seconds | 500 |
| Comparative Example 6-1 Comparative UDL-1 | 400° C. × 60 seconds | 370 |
| Comparative Example 6-2 Comparative UDL-3 | 400° C. × 60 seconds | 390 |
| Comparative Example 6-3 Comparative UDL-6 | 350° C. × 60 seconds | 620 |
| Comparative Example 6-4 Comparative UDL-9 | 350° C. × 60 seconds | 310 |

As shown in Examples 6-1 to 6-26 in Table 11, it can be observed that when the inventive compounds and polymers were used, the organic film materials exhibited higher adhesion than in Comparative Examples 6-1, 6-2, and 6-4. Meanwhile, in Comparative Example 6-3, high adhesion was exhibited because a similar cyclic amide structure was contained. It can also be considered from these results that adhesion was enhanced by the function of the hetero ring structure introduced to the inventive compounds and polymers, and excellent film-formability was exhibited as seen in the results of the film-formability evaluation.

Patterning Test (Examples 7-1 to 7-26, Comparative Examples 7-1 to 7-4)

The compositions (UDL-1 to -26, comparative UDL-1, -3, -6, -9) for forming an organic film were respectively applied onto a Bare-Si substrate having a trench pattern (trench width: 10 μm, trench depth: 0.10 μm) with an $SiO_2$ film formed, the $SiO_2$ film having a film thickness of 200 nm treated with HMDS. Then, an organic film was formed by baking under the conditions shown in Table 15 in the atmosphere so that the film thickness on the Bare-Si substrate was 200 nm. A silicon-containing resist middle layer film material (SOG-1) was applied onto the organic film and baked at 220° C. for 60 seconds to form a resist middle layer film having a film thickness of 35 nm. A photoresist composition (SL resist for ArF) was applied thereon and baked at 105° C. for 60 seconds to form a resist upper layer film having a film thickness of 100 nm. A liquid immersion top coat (TC-1) was applied onto the resist upper layer film and baked at 90° C. for 60 seconds to form a top coat having a film thickness of 50 nm. Note that regarding comparative UDL-2, -4, -5, -7, and -8, where it was not possible to achieve solvent resistance in the solvent resistance measurement, it was not possible to perform the patterning test since a silicon-containing resist middle layer film was not formed.

The photoresist composition (SL resist for ArF) was prepared by: dissolving a polymer (RP1), an acid generator (PAG1), and a basic compound (Amine1) into a solvent containing 0.1 mass % FC-430 (manufactured by Sumitomo 3M Ltd.) in proportions shown in Table 12; and filtering the solution through a 0.1-μm filter made of a fluorinated resin.

TABLE 12

| | Polymer (parts by mass) | Acid generator parts by mass) | Basic compound (parts by mass) | Solvent (parts by mass) |
|---|---|---|---|---|
| Monolayer resist for ArF | RP1 (100) | PAG1 (6.6) | Amine1 (0.8) | PGMEA (2500) |

The structural formulae of the polymer (RP1), acid generator (PAG1), and basic compound (Amine1) used are shown below.

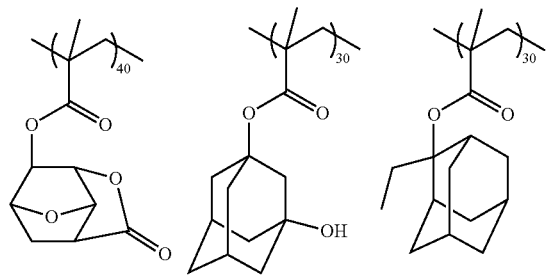

RP1
Mw 7,800

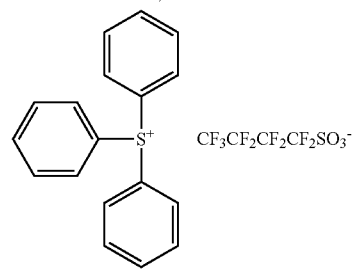

PAG1

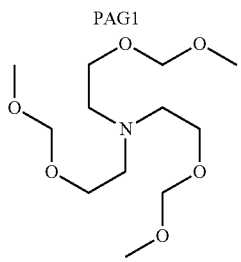

Amine 1

The liquid immersion top coat material (TC-1) was prepared by: dissolving a top coat polymer (PP1) into organic solvents in proportions shown in Table 13; and filtering the solution through a 0.1-μm filter made of a fluorinated resin.

TABLE 13

| | Polymer (parts by mass) | Organic solvent (parts by mass) |
|---|---|---|
| TC-1 | PP1 (100) | Diisoamyl ether (2700) 2-methyl-1-butanol (270) |

The structural formula of the used polymer (PP1) is shown below.

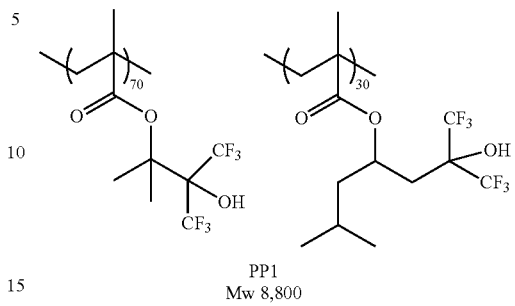

PP1
Mw 8,800

The silicon-containing resist middle layer film material (SOG-1) was prepared by: dissolving a polymer shown below as an ArF silicon-containing middle layer film polymer (SiP1) and a crosslinking catalyst (CAT1) into an organic solvent containing 0.1 mass % FC-4430 (manufactured by Sumitomo 3M Ltd.) in proportions shown in Table 14; and filtering the solution through a filter made of a fluorinated resin with a pore size of 0.1 μm.

TABLE 14

| | Polymer (parts by mass) | Thermally crosslinking catalyst (parts by mass) | Organic solvent (parts by mass) |
|---|---|---|---|
| SOG1 | SiP1 (100) | CAT1 (1) | Propylene glycol monoethyl ether (4000) |

The structural formulae of the used ArF silicon-containing middle layer film polymer (SiP1) and crosslinking catalyst (CAT1) are shown below.

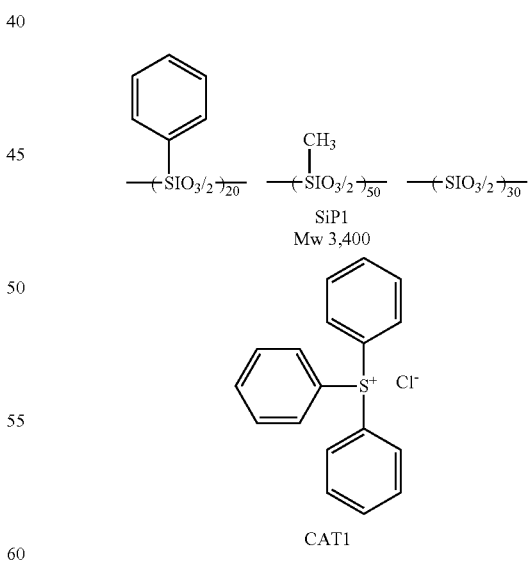

Next, the resulting substrate was exposed to light with an ArF liquid immersion exposure apparatus (NSR-S610C manufactured by Nikon Corporation, NA: 1.30, c: 0.98/0.65, 35° s-polarized dipole illumination, 6% halftone phase shift mask) while changing the exposure, baked (PEB) at 100° C. for 60 seconds, and developed with a 2.38 mass % tetramethylammonium hydroxide (TMAH) aqueous solution for 30 seconds. Thus, a positive line and space pattern was obtained with a pitch of 100 nm and a resist line width of 50 nm to 30 nm.

Next, using an etching apparatus Telius manufactured by Tokyo Electron Limited, the silicon-containing middle layer film was processed by dry etching while using the resist pattern as a mask; the organic film was processed while using the silicon-containing middle layer film as a mask; and the $SiO_2$ film was processed while using the organic film as a mask.

The etching conditions were as follows.
Conditions for transferring the resist pattern to the SOG film.
Chamber pressure: 10.0 Pa
RF power: 1,500 W
$CF_4$ gas flow rate: 15 sccm
$O_2$ gas flow rate: 75 sccm
Time: 15 sec
Conditions for transferring the pattern from the SOG film to the organic film.
Chamber pressure: 2.0 Pa
RF power: 500 W
Ar gas flow rate: 75 sccm
$O_2$ gas flow rate: 45 sccm
Time: 120 sec
Conditions for transferring to the $SiO_2$ film.
Chamber pressure: 2.0 Pa
RF power: 2,200 W
$C_5F_{12}$ gas flow rate: 20 sccm
$C_2F_6$ gas flow rate: 10 sccm
Ar gas flow rate: 300 sccm
$O_2$ gas flow rate: 60 sccm
Time: 90 sec The pattern cross sections were observed with an electron microscope (S-4700) manufactured by Hitachi, Ltd., the profiles were compared, and summarized in Table 15.

TABLE 15

| | Composition for forming organic film | Baking temperature | Pattern profile after etching for transferring to substrate |
| --- | --- | --- | --- |
| Example 7-1 | UDL-1 | 400° C. × 60 seconds | Vertical profile |
| Example 7-2 | UDL-2 | 400° C. × 60 seconds | Vertical profile |
| Example 7-3 | UDL-3 | 400° C. × 60 seconds | Vertical profile |
| Example 7-4 | UDL-4 | 400° C. × 60 seconds | Vertical profile |
| Example 7-5 | UDL-5 | 400° C. × 60 seconds | Vertical profile |
| Example 7-6 | UDL-6 | 400° C. × 60 seconds | Vertical profile |
| Example 7-7 | UDL-7 | 400° C. × 60 seconds | Vertical profile |
| Example 7-8 | UDL-8 | 400° C. × 60 seconds | Vertical profile |
| Example 7-9 | UDL-9 | 350° C. × 60 seconds | Vertical profile |
| Example 7-10 | UDL-10 | 350° C. × 60 seconds | Vertical profile |
| Example 7-11 | UDL-11 | 350° C. × 60 seconds | Vertical profile |
| Example 7-12 | UDL-12 | 350° C. × 60 seconds | Vertical profile |
| Example 7-13 | UDL-13 | 350° C. × 60 seconds | Vertical profile |
| Example 7-14 | UDL-14 | 350° C. × 60 seconds | Vertical profile |
| Example 7-15 | UDL-15 | 350° C. × 60 seconds | Vertical profile |
| Example 7-16 | UDL-16 | 350° C. × 60 seconds | Vertical profile |
| Example 7-17 | UDL-17 | 350° C. × 60 seconds | Vertical profile |
| Example 7-18 | UDL-18 | 350° C. × 60 seconds | Vertical profile |
| Example 7-19 | UDL-19 | 350° C. × 60 seconds | Vertical profile |
| Example 7-20 | UDL-20 | 350° C. × 60 seconds | Vertical profile |
| Example 7-21 | UDL-21 | 350° C. × 60 seconds | Vertical profile |
| Example 7-22 | UDL-22 | 350° C. × 60 seconds | Vertical profile |
| Example 7-23 | UDL-23 | 350° C. × 60 seconds | Vertical profile |
| Example 7-24 | UDL-24 | 350° C. × 60 seconds | Vertical profile |
| Example 7-25 | UDL-25 | 350° C. × 60 seconds | Vertical profile |
| Example 7-26 | UDL-26 | 350° C. × 60 seconds | Vertical profile |

TABLE 15-continued

| | Composition for forming organic film | Baking temperature | Pattern profile after etching for transferring to substrate |
| --- | --- | --- | --- |
| Comparative Example 7-1 | Comparative UDL-1 | 400° C. × 60 seconds | Pattern profile collapse |
| Comparative Example 7-2 | Comparative UDL-3 | 400° C. × 60 seconds | Pattern profile collapse |
| Comparative Example 7-3 | Comparative UDL-6 | 400° C. × 60 seconds | Pattern profile collapse |
| Comparative Example 7-4 | Comparative UDL-9 | 400° C. × 60 seconds | Pattern profile collapse |

As shown in Table 15, it was confirmed from the results of the inventive compositions for forming an organic film (Examples 7-1 to 7-26) that the resist upper layer film pattern was favorably transferred to the final substrate in each case, and that the inventive compositions for forming an organic film are suitably used in fine processing according to the multilayer resist method. On the other hand, in Comparative Examples 7-1, 7-2, and 7-3, pattern collapse occurred during patterning due to pinholes generated during film formation as demonstrated in the results of the film-formability evaluation, and it was not possible to form a pattern. In Comparative Example 7-4, pattern collapse occurred during patterning due to pinholes generated during film formation as demonstrated in the results of the film-formability test of the film-formability evaluation, and it was not possible to form a pattern.

From the above, it was revealed that the inventive compositions for forming an organic film have good film-formability and excellent filling and planarizing properties. Thus, the inventive compositions are extremely useful as organic film materials used in multilayer resist methods. Moreover, the inventive patterning process using these compositions can form a fine pattern with high precision even when the body to be processed is a stepped substrate.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:
1. A composition for forming an organic film, comprising: a material for forming an organic film shown by the following general formula; and an organic solvent,

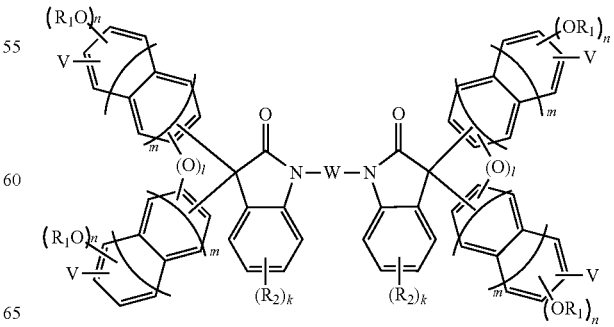

wherein $R_1$ represents a hydrogen atom, an allyl group, or a propargyl group, $R_2$ represents a nitro group, a halogen atom, a hydroxy group, an alkyloxy group having 1 to 4 carbon atoms, an alkynyloxy group having 2 to 4 carbon atoms, an alkenyloxy group having 2 to 4 carbon atoms, a linear, branched, or cyclic alkyl group having 1 to 6 carbon atoms, a trifluoromethyl group, or a trifluoromethyloxy group, "m" represents 0 or 1, "n" represents an integer of 1 or 2, "l" represents 0 or 1, aromatic rings forming a cyclic ether structure with one another when l=1, "k" represents an integer of 0 to 2, W represents a divalent organic group having 1 to 40 carbon atoms, and each V independently represents a hydrogen atom or a linking moiety.

2. The composition for forming an organic film according to claim 1, wherein the material for forming an organic film is a compound shown by the following general formula (1),

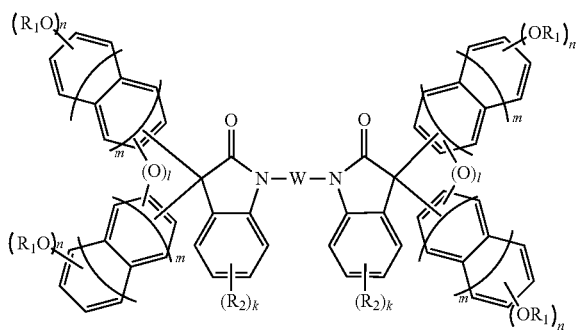

(1)

wherein $R_1$, $R_2$, "m", "n", "l", "k", and W are as defined above.

3. The composition for forming an organic film according to claim 2, wherein the compound shown by the general formula (1) is a compound shown by the following general formula (2),

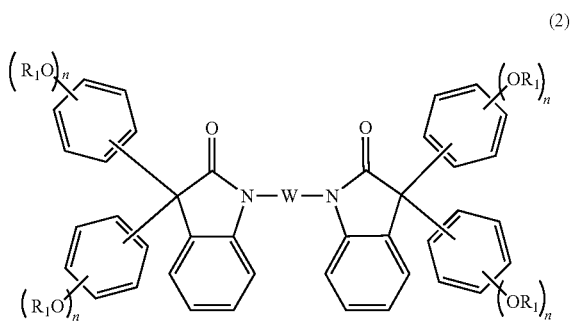

(2)

wherein $R_1$, W, and "n" are as defined above.

4. The composition for forming an organic film according to claim 2, wherein the compound satisfies $1.00 \leq Mw/Mn \leq 1.10$, where Mw is a weight-average molecular weight and Mn is a number-average molecular weight measured by gel permeation chromatography in terms of polystyrene.

5. The composition for forming an organic film according to claim 1, wherein the material for forming an organic film is a polymer having a repeating unit shown by the following general formula (3),

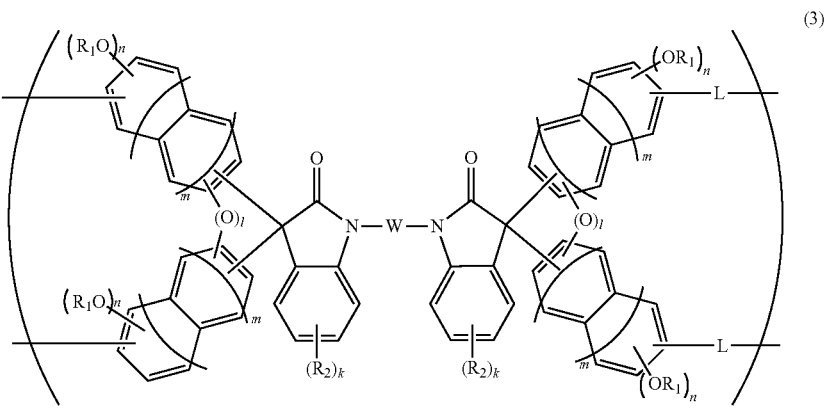

(3)

wherein $R_1$, $R_2$, W, "n", "m", "l", and "k" are as defined above, and L represents a divalent organic group having 1 to 40 carbon atoms.

6. The composition for forming an organic film according to claim 5, wherein the polymer has a repeating unit shown by the following general formula (4),

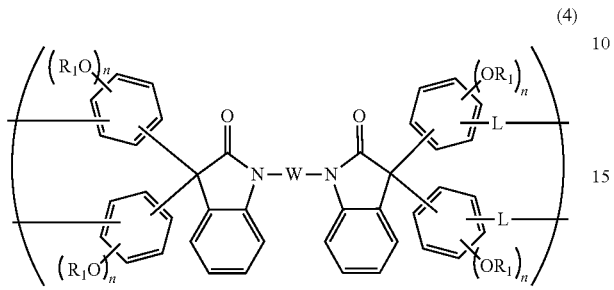

(4)

wherein $R_1$, W, L, and "n" are as defined above.

7. The composition for forming an organic film according to claim 5, wherein the L is a divalent organic group shown by the following general formula (5),

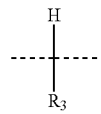

(5)

wherein $R_3$ represents a hydrogen atom or an organic group containing an aromatic ring having 1 to 20 carbon atoms, and a broken line represents an attachment point.

8. The composition for forming an organic film according to claim 5, wherein the polymer has a weight-average molecular weight of 1000 to 5000.

9. The composition for forming an organic film according to claim 1, wherein the material for forming an organic film contains one or more compounds selected from a compound shown by the following general formula (1) and one or more polymers selected from a polymer having a repeating unit shown by the following general formula (3),

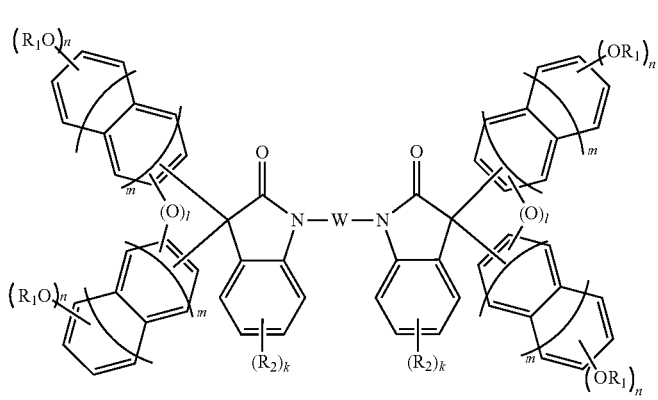

(1)

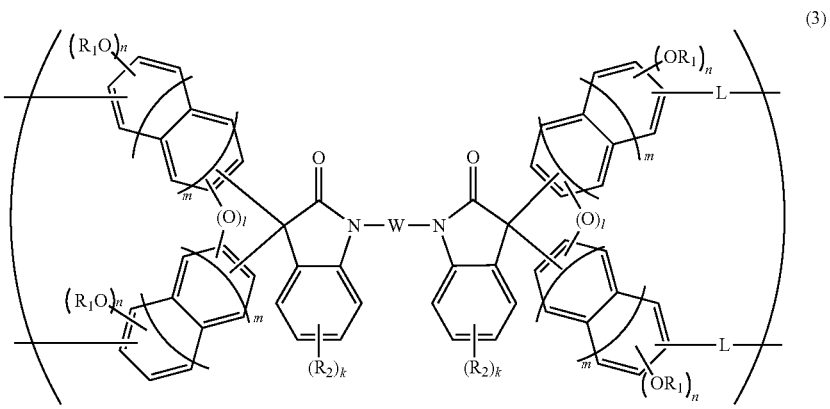

(3)

wherein $R_1$, $R_2$, W, "n", "m", "l", and "k" are as defined above, and L represents a divalent organic group having 1 to 40 carbon atoms.

10. The composition for forming an organic film according to claim 1, wherein the organic solvent is a mixture of one or more kinds of organic solvent having a boiling point of lower than 180° C. and one or more kinds of organic solvent having a boiling point of 180° C. or higher.

11. The composition for forming an organic film according to claim 1, further comprising at least one of a surfactant and a plasticizer.

12. A patterning process comprising:
forming an organic film by using the composition for forming an organic film according to claim 1 on a body to be processed;
forming a silicon-containing resist middle layer film by using a silicon-containing resist middle layer film material on the organic film;
forming a resist upper layer film by using a photoresist composition on the silicon-containing resist middle layer film;
forming a circuit pattern in the resist upper layer film;
transferring the pattern to the silicon-containing resist middle layer film by etching while using the resist upper layer film having the formed pattern as a mask;
transferring the pattern to the organic film by etching while using the silicon-containing resist middle layer film having the transferred pattern as a mask; and
further forming the pattern in the body to be processed by etching while using the organic film having the transferred pattern as a mask.

13. A patterning process comprising:
forming an organic film by using the composition for forming an organic film according to claim 1 on a body to be processed;
forming a silicon-containing resist middle layer film by using a silicon-containing resist middle layer film material on the organic film;
forming an organic antireflective coating on the silicon-containing resist middle layer film;
forming a resist upper layer film by using a photoresist composition on the organic antireflective coating, so that a 4-layered film structure is constructed;
forming a circuit pattern in the resist upper layer film;
transferring the pattern to the organic antireflective coating and the silicon-containing resist middle layer film by etching while using the resist upper layer film having the formed pattern as a mask;
transferring the pattern to the organic film by etching while using the silicon-containing resist middle layer film having the transferred pattern as a mask; and
further forming the pattern in the body to be processed by etching the body to be processed while using the organic film having the transferred pattern as a mask.

14. A patterning process comprising:
forming an organic film by using the composition for forming an organic film according to claim 1 on a body to be processed;
forming an inorganic hard mask selected from a silicon oxide film, a silicon nitride film, and a silicon oxynitride film on the organic film;
forming a resist upper layer film by using a photoresist composition on the inorganic hard mask;
forming a circuit pattern in the resist upper layer film;
etching the inorganic hard mask while using the resist upper layer film having the formed pattern as a mask;
etching the organic film while using the inorganic hard mask having the formed pattern as a mask; and
further forming the pattern in the body to be processed by etching the body to be processed while using the organic film having the formed pattern as a mask.

15. A patterning process comprising:
forming an organic film by using the composition for forming an organic film according to claim 1 on a body to be processed;
forming an inorganic hard mask selected from a silicon oxide film, a silicon nitride film, and a silicon oxynitride film on the organic film;
forming an organic antireflective coating on the inorganic hard mask;
forming a resist upper layer film by using a photoresist composition on the organic antireflective coating, so that a 4-layered film structure is constructed;
forming a circuit pattern in the resist upper layer film;
etching the organic antireflective coating and the inorganic hard mask while using the resist upper layer film having the formed pattern as a mask;
etching the organic film while using the inorganic hard mask having the formed pattern as a mask; and
further forming the pattern in the body to be processed by etching the body to be processed while using the organic film having the formed pattern as a mask.

16. The patterning process according to claim 14, wherein the inorganic hard mask is formed by a CVD method or an ALD method.

17. The patterning process according to claim 12, wherein the pattern in the resist upper layer film is formed by a lithography using light with a wavelength of 10 nm or more to 300 nm or less, a direct drawing with electron beam, nanoimprinting, or a combination thereof.

18. The patterning process according to claim 12, wherein exposure and development are performed to form the circuit pattern in the resist upper layer film in the patterning process, and the development is alkali development or development with an organic solvent.

19. The patterning process according to claim 12, wherein as the body to be processed, a semiconductor device substrate, a metal film, a metal carbide film, a metal oxide film, a metal nitride film, a metal oxycarbide film, or a metal oxynitride film is used.

20. The patterning process according to claim 19, wherein the metal is silicon, titanium, tungsten, hafnium, zirconium, chromium, germanium, cobalt, copper, silver, gold, aluminum, indium, gallium, arsenic, palladium, iron, tantalum, iridium, manganese, molybdenum, ruthenium, or an alloy thereof.

21. A compound shown by the following general formula (1), (1)

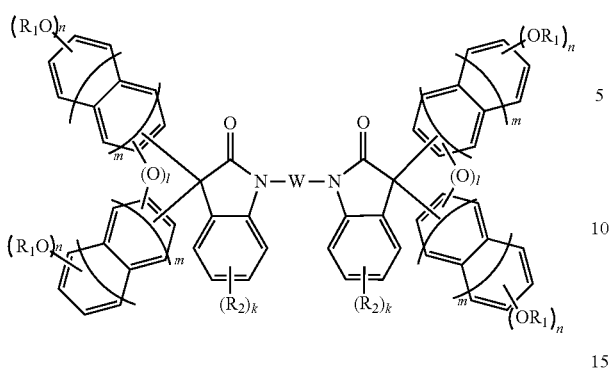

wherein $R_1$ represents a hydrogen atom, an allyl group, or a propargyl group, $R_2$ represents a nitro group, a halogen atom, a hydroxy group, an alkyloxy group having 1 to 4 carbon atoms, an alkynyloxy group having 2 to 4 carbon atoms, an alkenyloxy group having 2 to 4 carbon atoms, a linear, branched, or cyclic alkyl group having 1 to 6 carbon atoms, a trifluoromethyl group, or a trifluoromethyloxy group, "m" represents 0 or 1, "n" represents an integer of 1 or 2, "l" represents 0 or 1, aromatic rings forming a cyclic ether structure with one another when l=1, "k" represents an integer of 0 to 2, and W represents a divalent organic group having 1 to 40 carbon atoms.

22. The compound according to claim 21, shown by the following general formula (2),

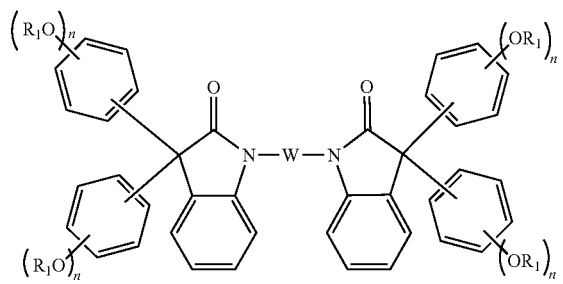

(2)

wherein $R_1$, W, and "n" are as defined above.

23. A polymer having a repeating unit shown by the following general formula (3),

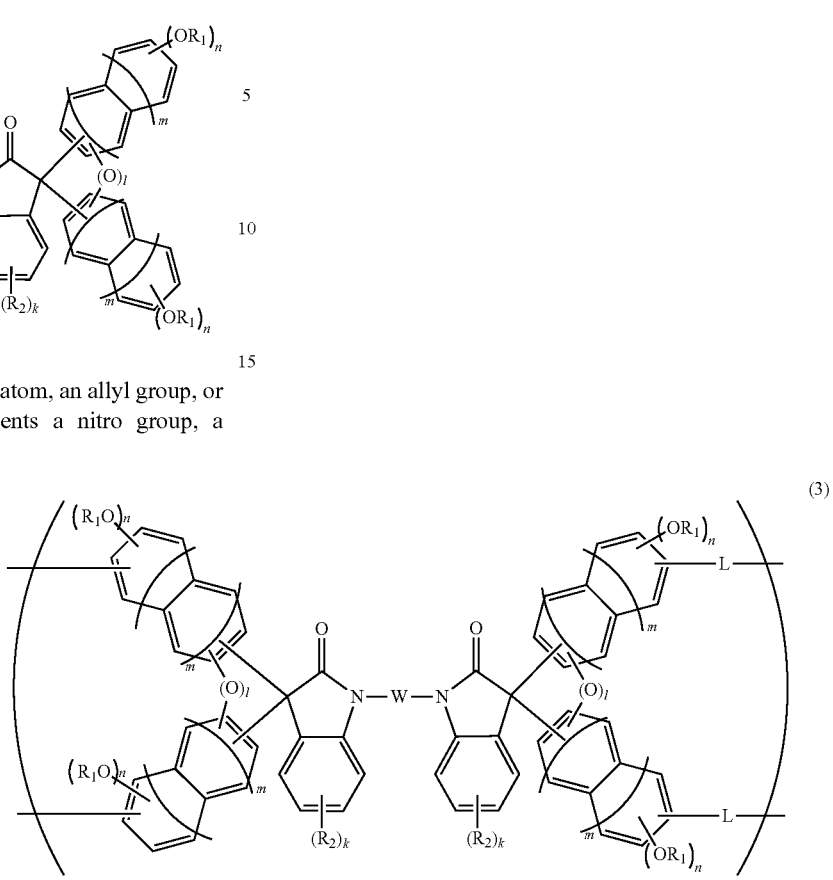

(3)

wherein $R_1$ represents a hydrogen atom, an allyl group, or a propargyl group, $R_2$ represents a nitro group, a halogen atom, a hydroxy group, an alkyloxy group having 1 to 4 carbon atoms, an alkynyloxy group having 2 to 4 carbon atoms, an alkenyloxy group having 2 to 4 carbon atoms, a linear, branched, or cyclic alkyl group having 1 to 6 carbon atoms, a trifluoromethyl group, or a trifluoromethyloxy group, "m" represents 0 or 1, "n" represents an integer of 1 or 2, "l" represents 0 or 1, aromatic rings forming a cyclic ether structure with one another when l=1, "k" represents an integer of 0 to 2, W represents a divalent organic group having 1 to 40 carbon atoms, and L represents a divalent organic group having 1 to 40 carbon atoms.

24. The polymer according to claim 23, having a repeating unit shown by the following general formula (4),

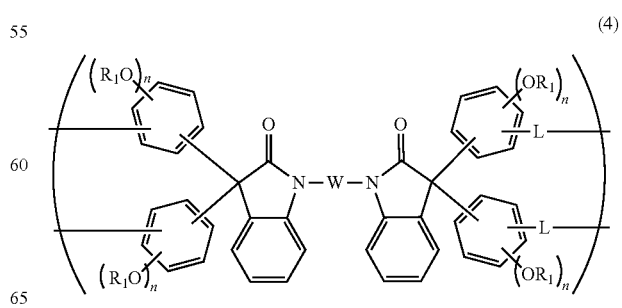

(4)

wherein $R_1$, W, L, and "n" are as defined above.

25. The polymer according to claim 23, wherein the L is a divalent organic group shown by the following general formula (5),
(5)
wherein $R_3$ represents a hydrogen atom or an organic group containing an aromatic ring having 1 to 20 carbon atoms, and a broken line represents an attachment point.
* * * * *